United States Patent
Parker et al.

(10) Patent No.: US 7,941,237 B2
(45) Date of Patent: May 10, 2011

(54) FLAT PANEL DISPLAY SUBSTRATE TESTING SYSTEM

(75) Inventors: N. William Parker, Pleasanton, CA (US); S. Daniel Miller, Gilroy, CA (US); Tirunelveli S. Ravi, San Jose, CA (US)

(73) Assignee: Multibeam Corporation, Santa Clara, CA (US)

(*) Notice: Subject to any disclaimer, the term of this patent is extended or adjusted under 35 U.S.C. 154(b) by 577 days.

(21) Appl. No.: 10/589,097

(22) PCT Filed: Apr. 19, 2006

(86) PCT No.: PCT/US2006/014794
§ 371 (c)(1),
(2), (4) Date: Nov. 9, 2007

(87) PCT Pub. No.: WO2007/133176
PCT Pub. Date: Nov. 22, 2007

(65) Prior Publication Data
US 2008/0232939 A1   Sep. 25, 2008

Related U.S. Application Data

(63) Continuation-in-part of application No. 11/379,207, filed on Apr. 18, 2006, now abandoned.

(51) Int. Cl.
*G06F 19/00* (2006.01)

(52) U.S. Cl. .......................................... 700/98; 324/375

(58) Field of Classification Search .................. 700/98, 700/121; 324/750, 375
See application file for complete search history.

(56) References Cited

U.S. PATENT DOCUMENTS

| | | | |
|---|---|---|---|
| 5,170,127 A | 12/1992 | Henley | |
| 5,371,459 A * | 12/1994 | Brunner et al. | 324/770 |
| 5,414,374 A * | 5/1995 | Brunner et al. | 324/770 |
| 5,432,461 A * | 7/1995 | Henley | 324/770 |
| 5,504,438 A * | 4/1996 | Henley | 324/770 |
| 5,719,466 A | 2/1998 | Tsai | |
| 5,982,190 A * | 11/1999 | Toro-Lira | 324/770 |
| 6,028,442 A | 2/2000 | Lee | |
| RE37,847 E | 9/2002 | Henley | |
| 6,486,927 B1 | 11/2002 | Kim et al. | |
| 6,736,588 B1 | 5/2004 | Baldwin | |
| 6,777,675 B2 | 8/2004 | Parker | |
| 6,833,717 B1 | 12/2004 | Kurita | |
| 6,987,400 B2 * | 1/2006 | Toro-Lira | 324/770 |
| 7,122,795 B2 | 10/2006 | Parker | |
| 7,129,694 B2 * | 10/2006 | Brunner et al. | 324/158.1 |
| 2003/0218456 A1 | 11/2003 | Brunner et al. | |
| 2005/0170569 A1 * | 8/2005 | Yazaki et al. | 438/155 |
| 2005/0209808 A1 | 9/2005 | Kelbon et al. | |
| 2006/0028230 A1 * | 2/2006 | Wenzel et al. | 324/770 |
| 2006/0038554 A1 | 2/2006 | Kurita et al. | |
| 2006/0054817 A1 | 3/2006 | Parker | |
| 2006/0145087 A1 | 7/2006 | Parker | |
| 2006/0169899 A1 | 8/2006 | Parker | |
| 2006/0177288 A1 | 8/2006 | Parker et al. | |

* cited by examiner

*Primary Examiner* — Kidest Bahta

(57) ABSTRACT

A flat panel display substrate (FPDS) testing system configured such that prior to testing, the FPDS is loaded into a pallet to prevent breakage, and to provide electrical connections to test pads on the FPDS. The system achieves high throughput by testing FPDSs using one or more charged particle beams simultaneously with the following operations: unloading of already-tested substrates, loading of substrates ready for testing, assembly of pallets, and alignment of electrical contactors to a large number of FPDS test pads. The system design eliminates a prior art X-Y stage, and all moving electrical connections to the FPDS during testing, reducing costs and improving reliability. In one embodiment, the FPDS testing system has three subsystems: a process chamber, loadlock assembly, and pallet elevator; in another embodiment, the functions of loadlock and pallet elevator are combined to reduce system footprint.

27 Claims, 49 Drawing Sheets

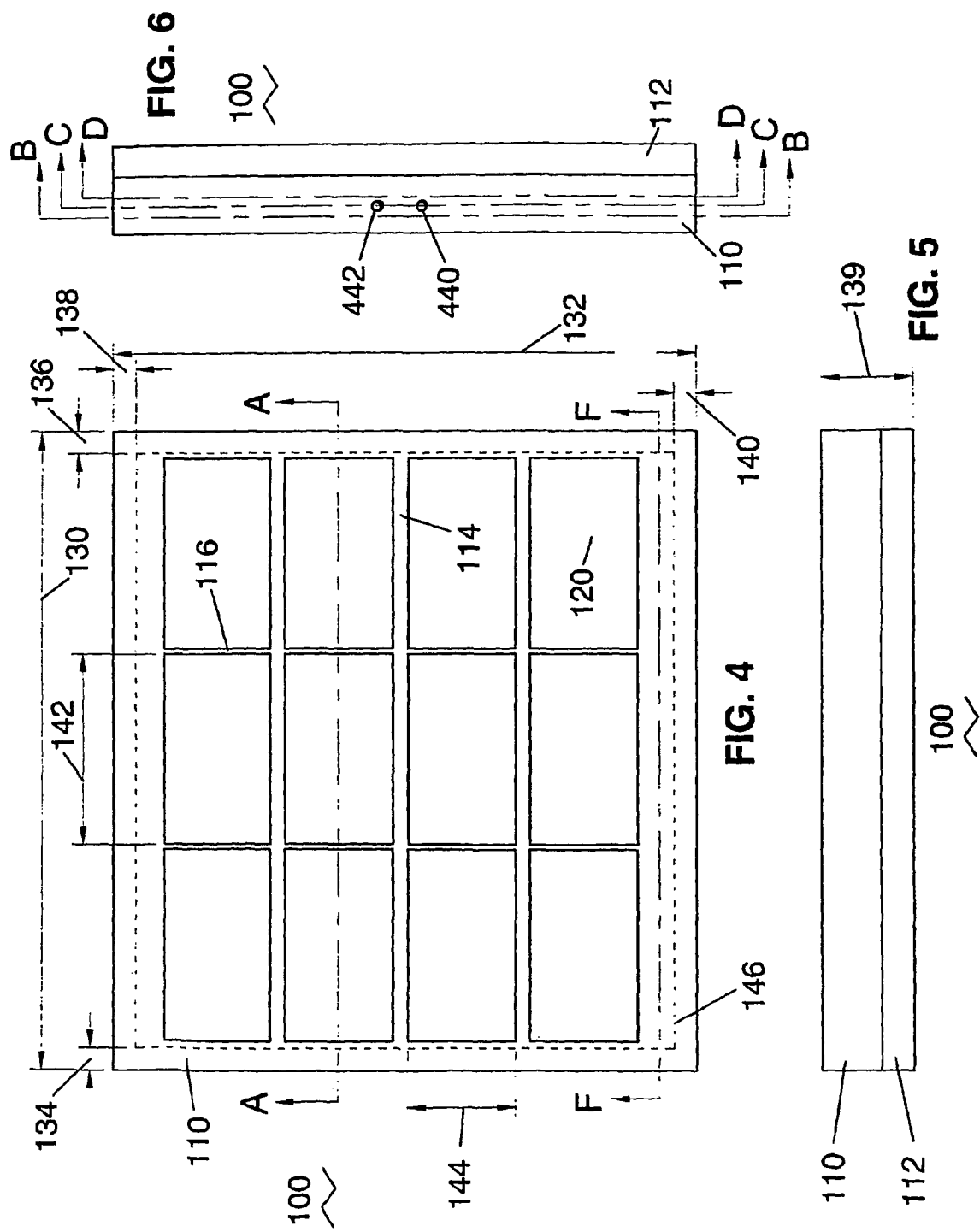

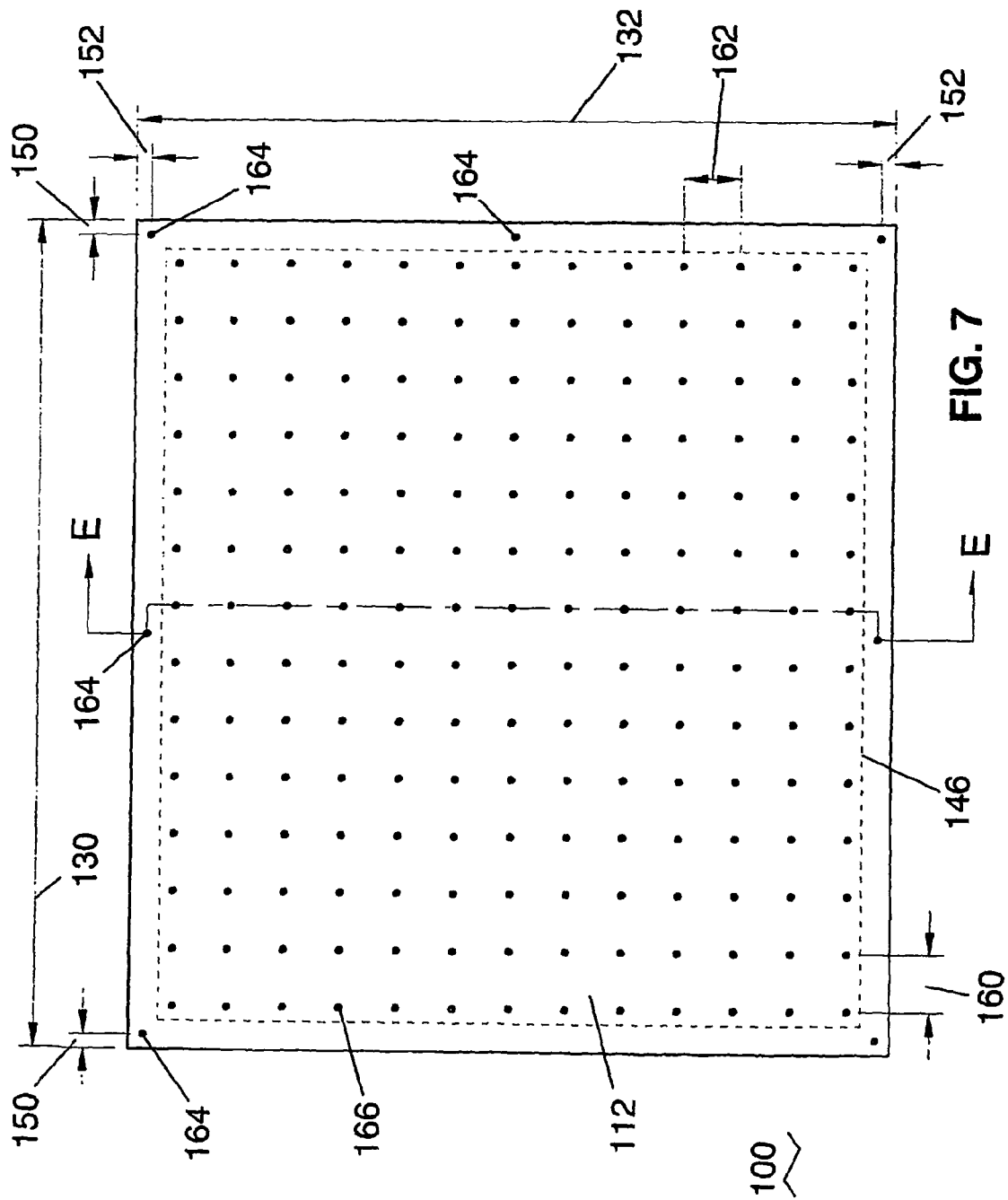

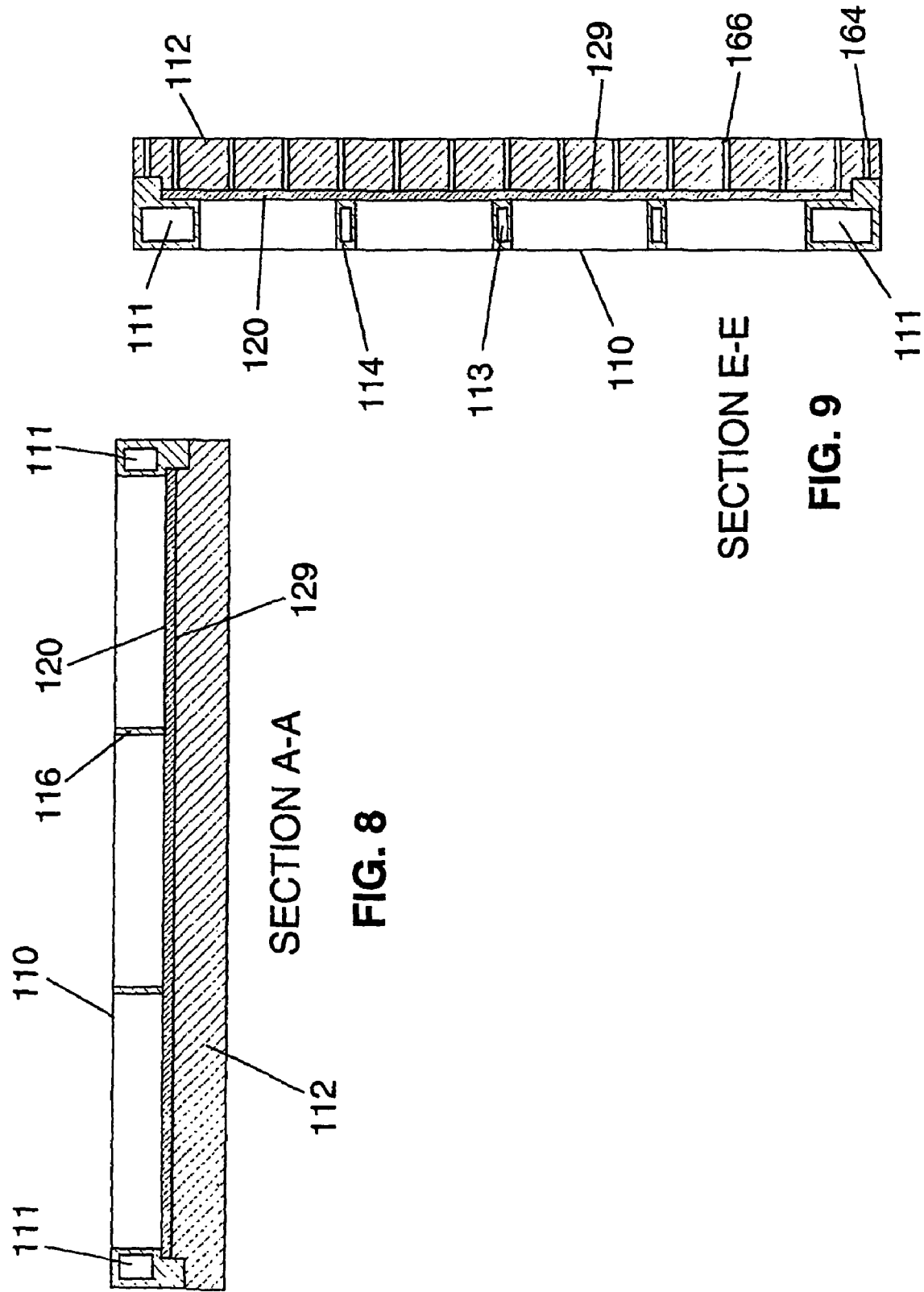

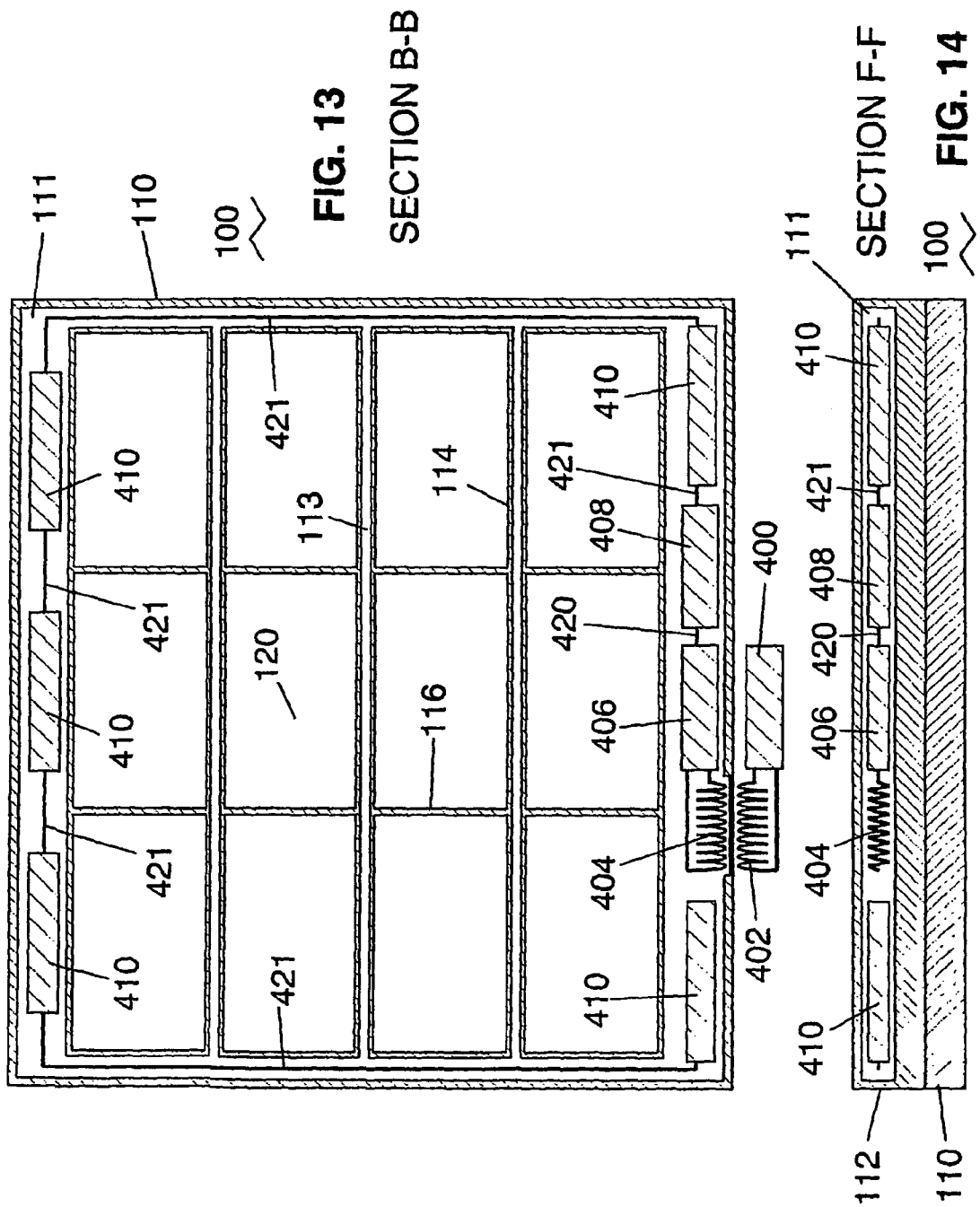

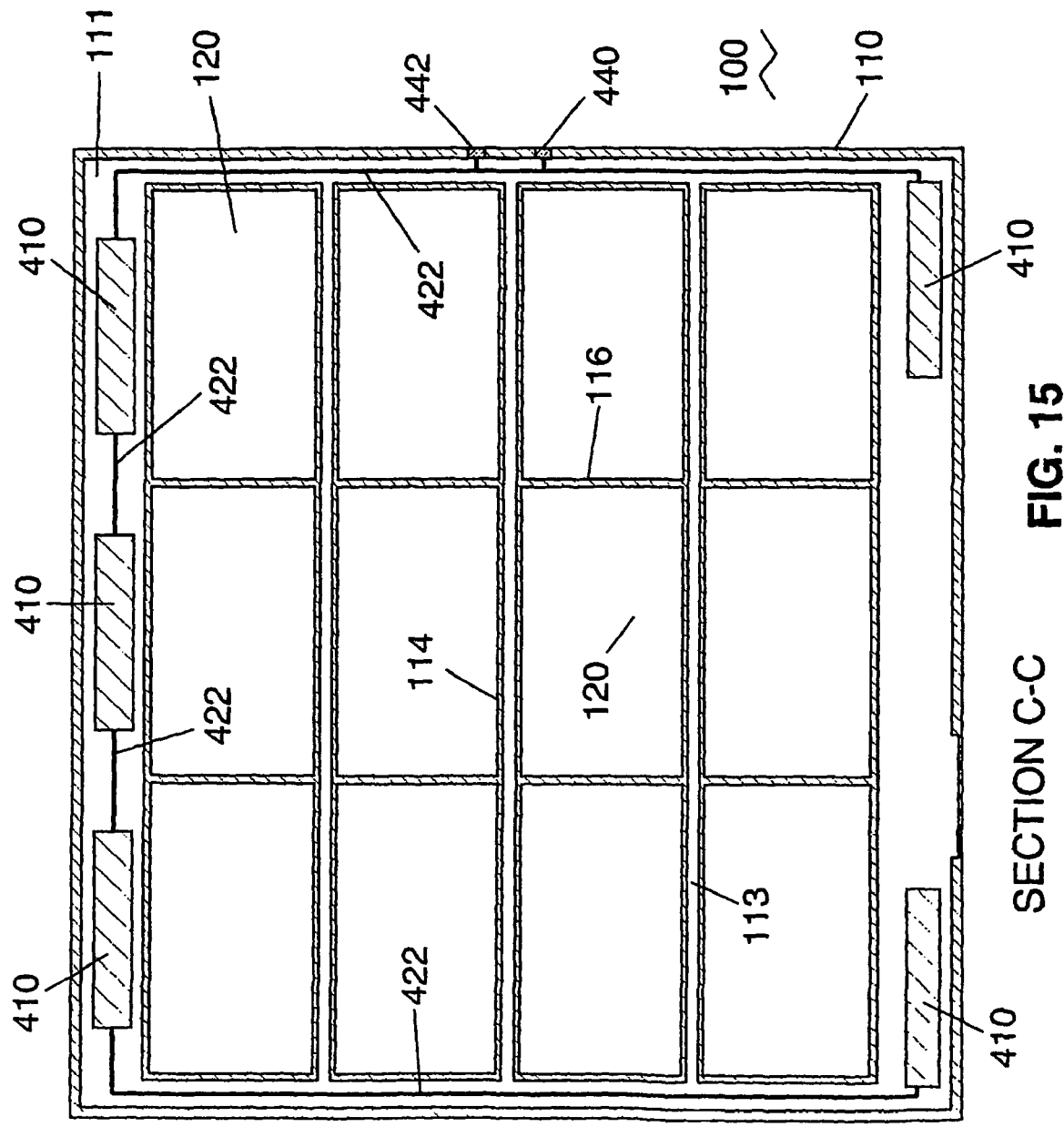
FIG. 15 SECTION C-C

SECTION D-D

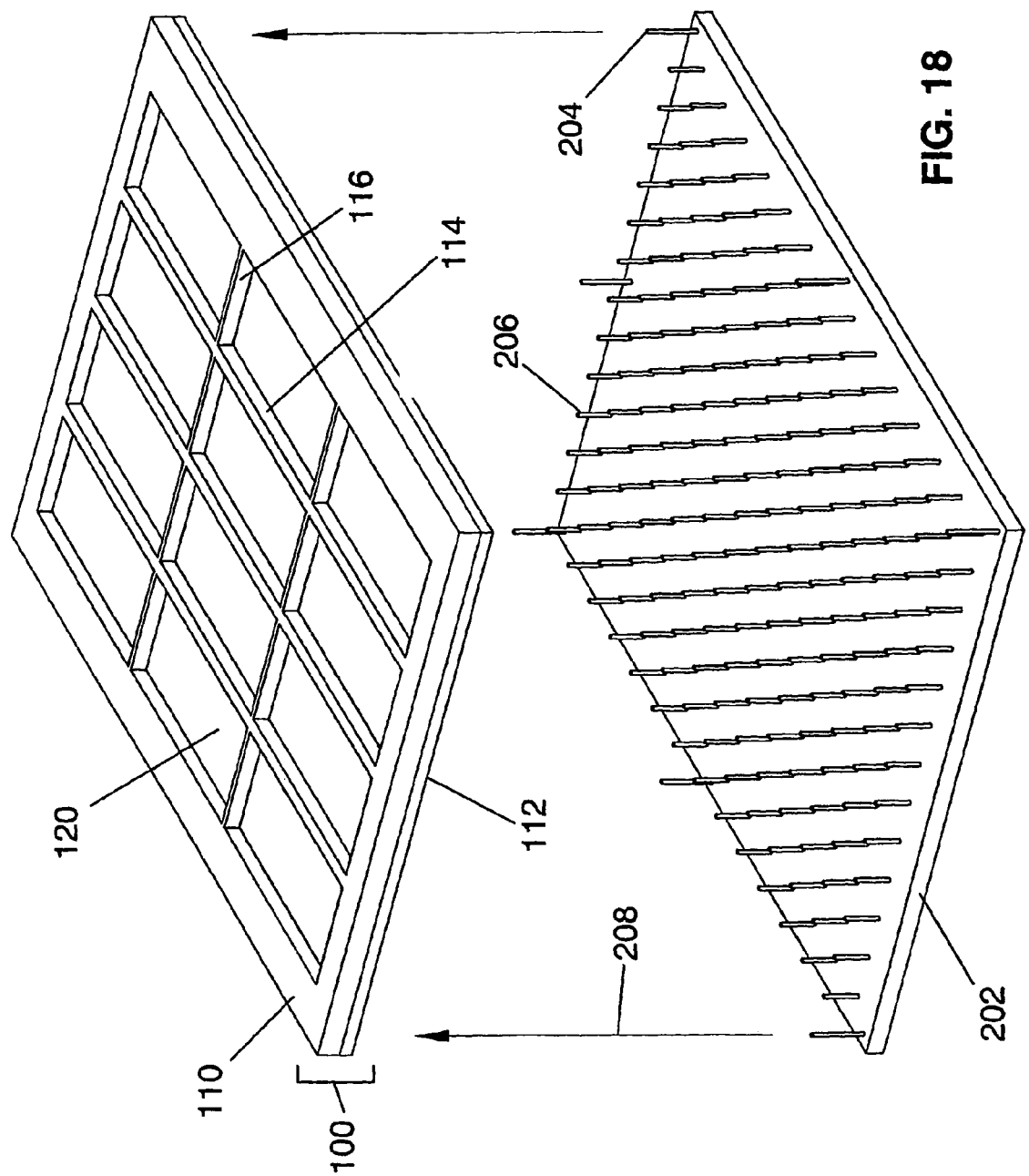

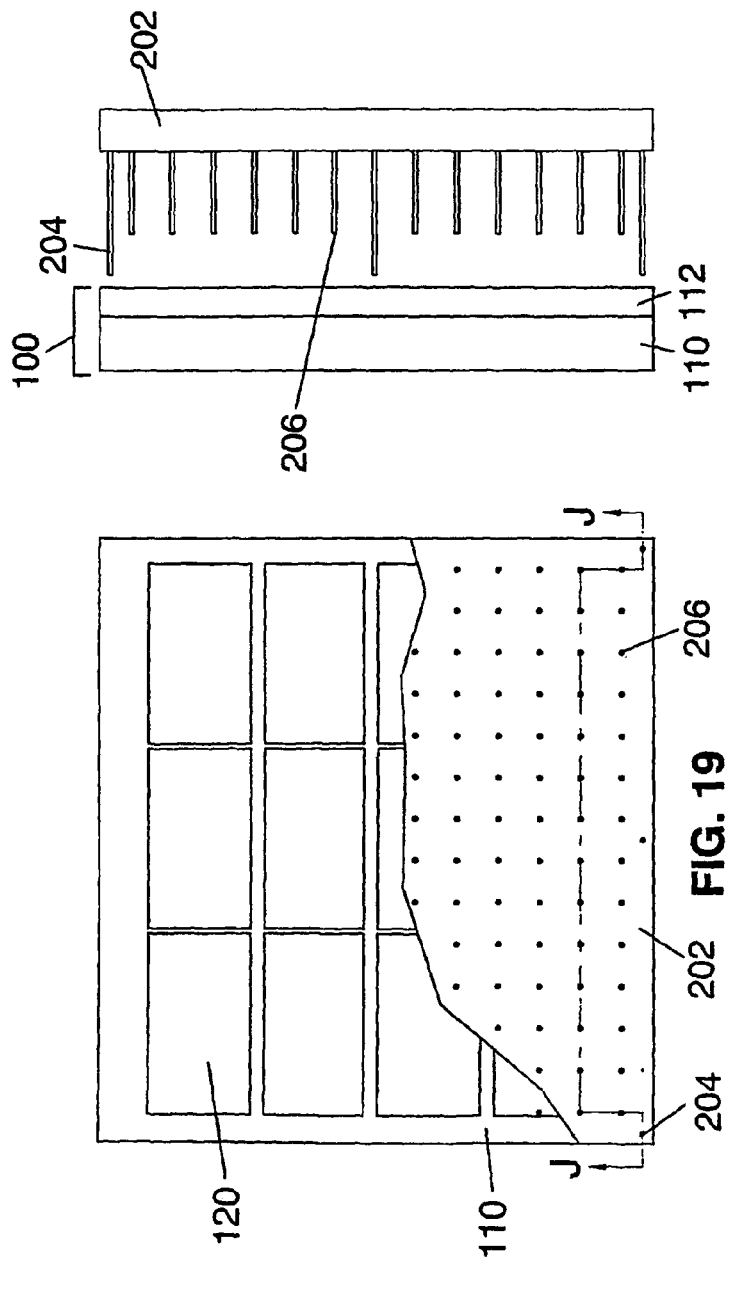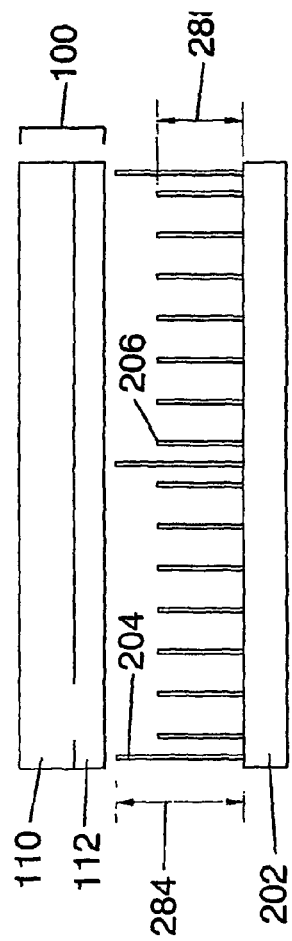

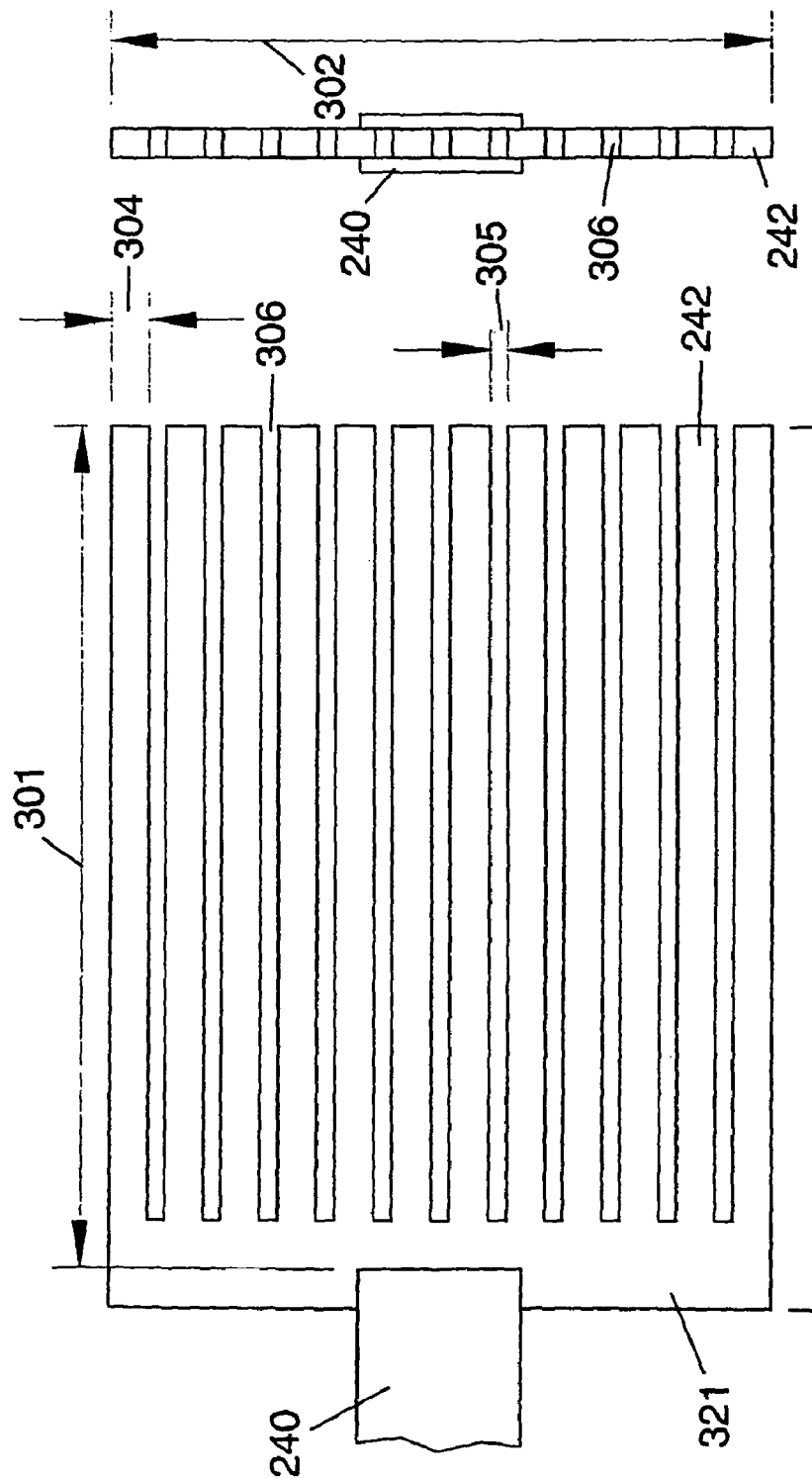
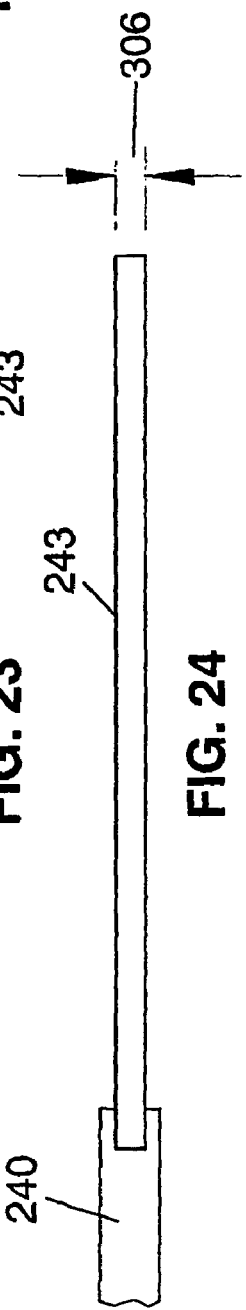
FIG. 23
FIG. 24
FIG. 25

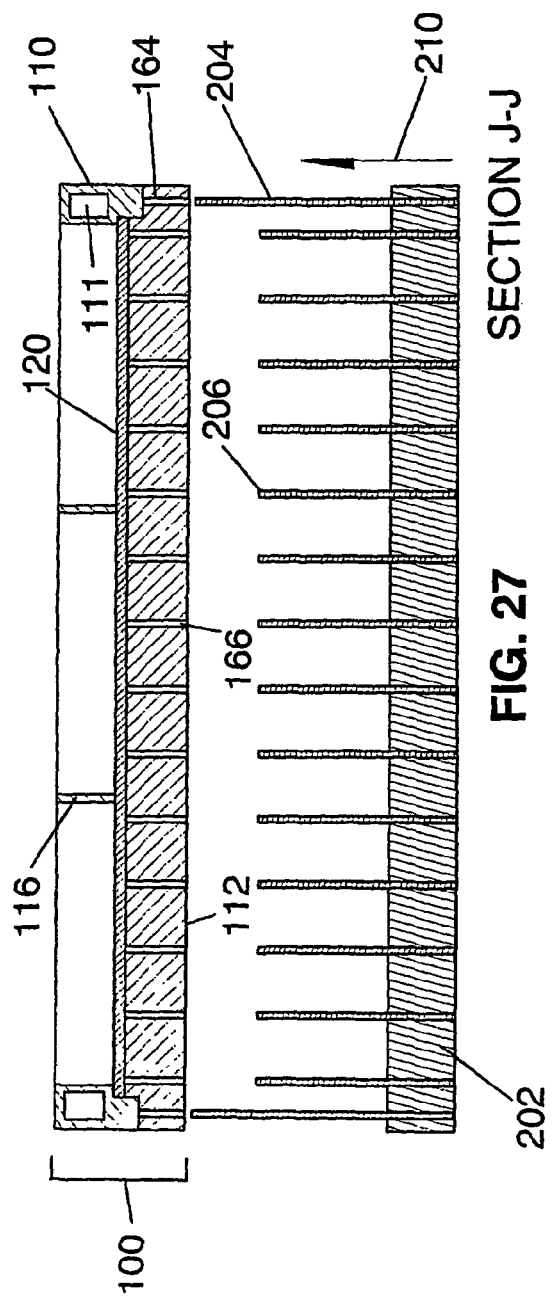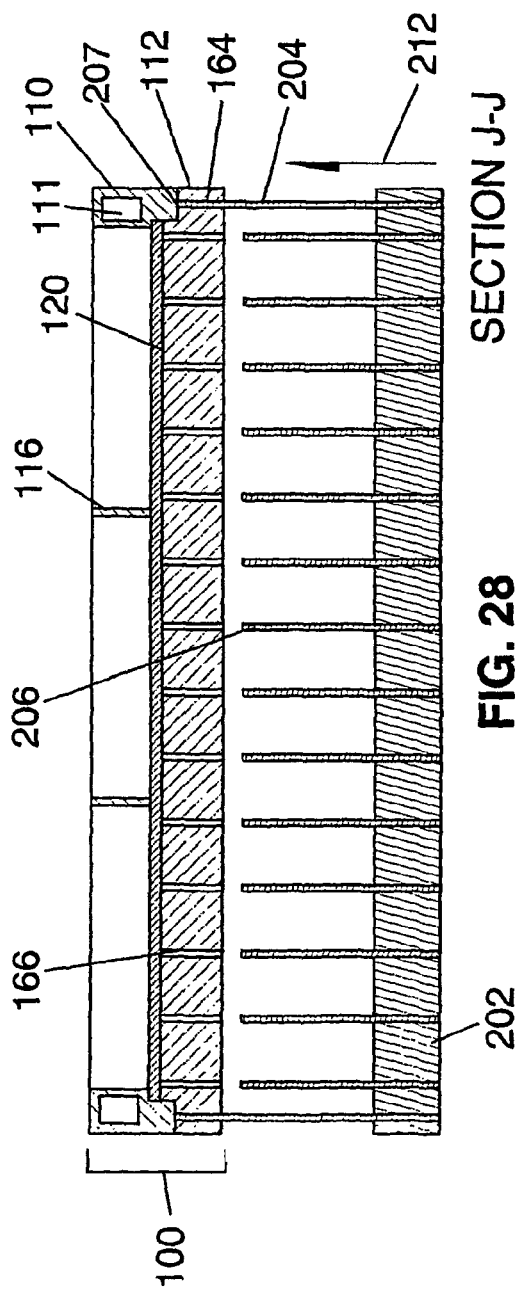

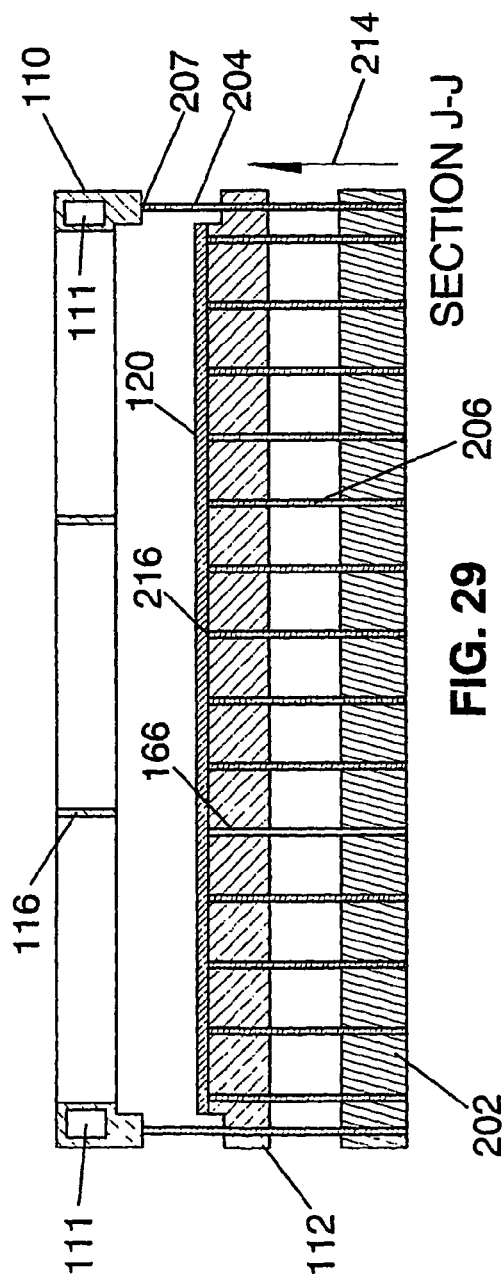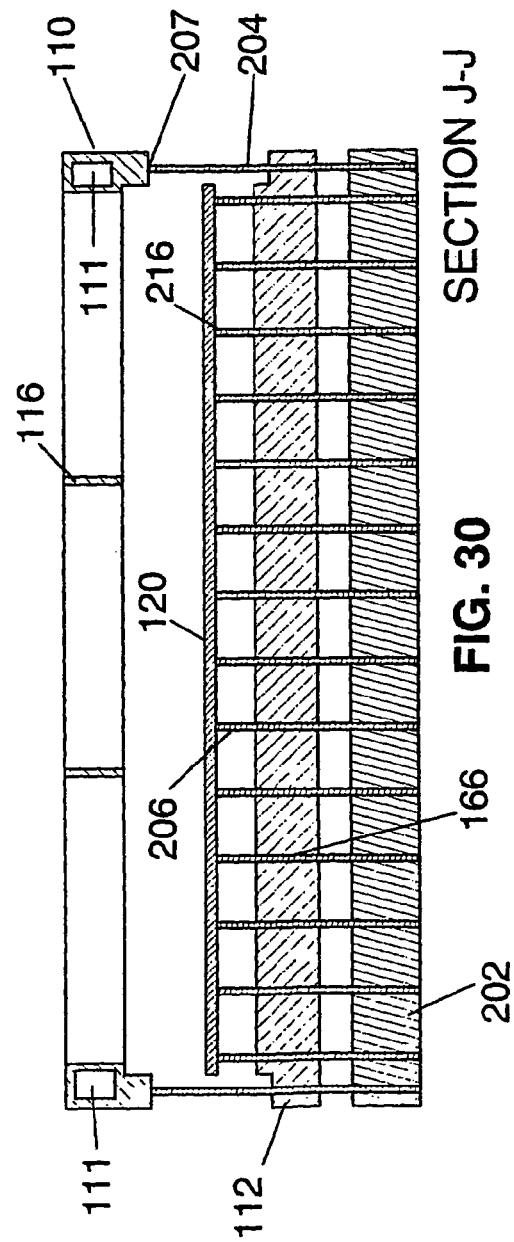

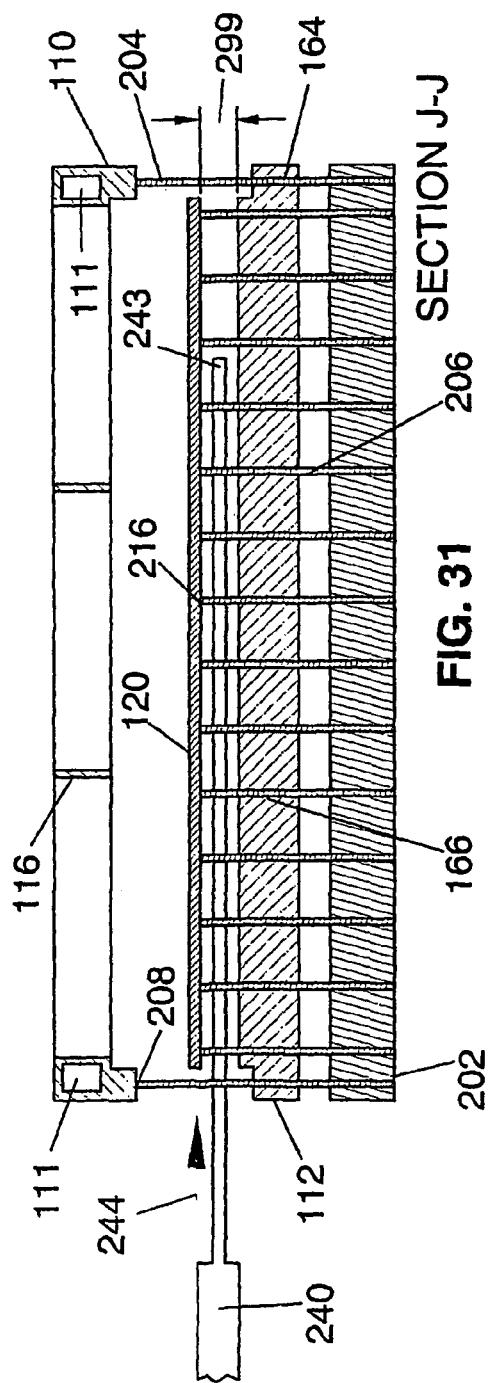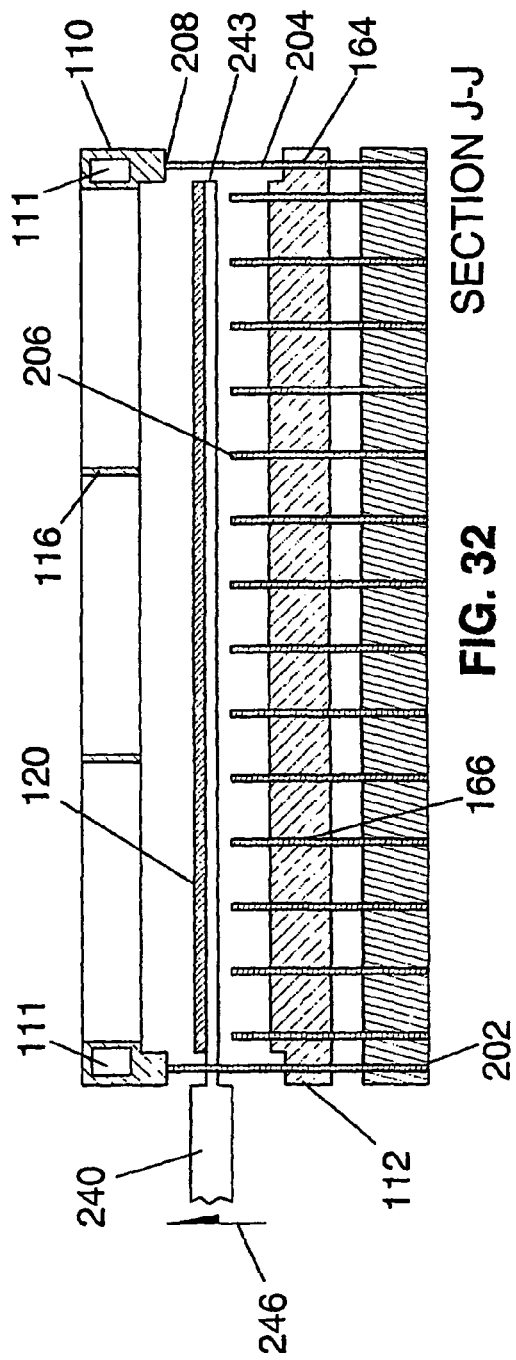

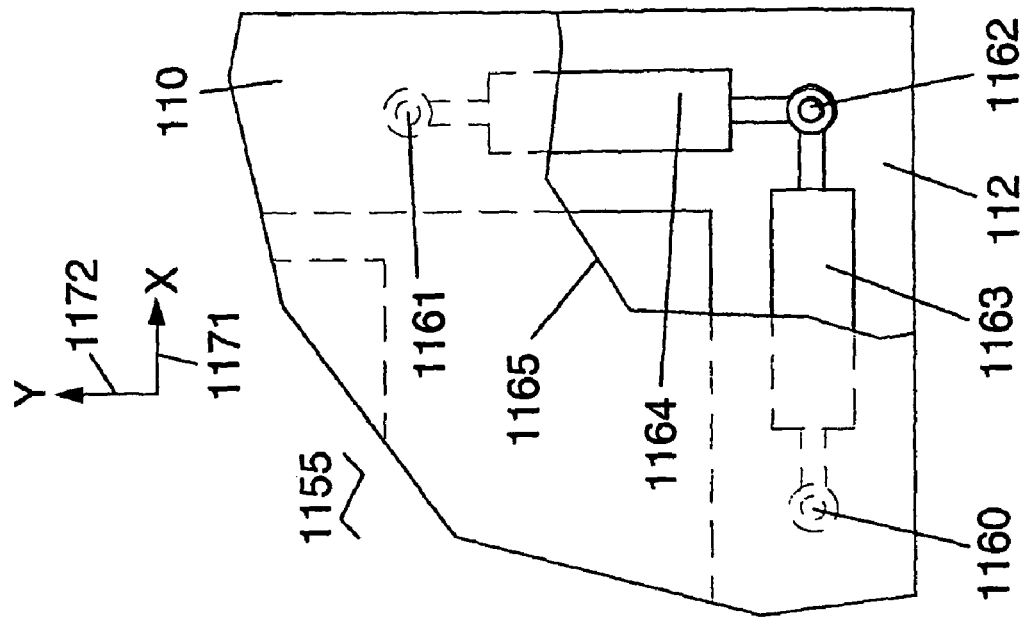
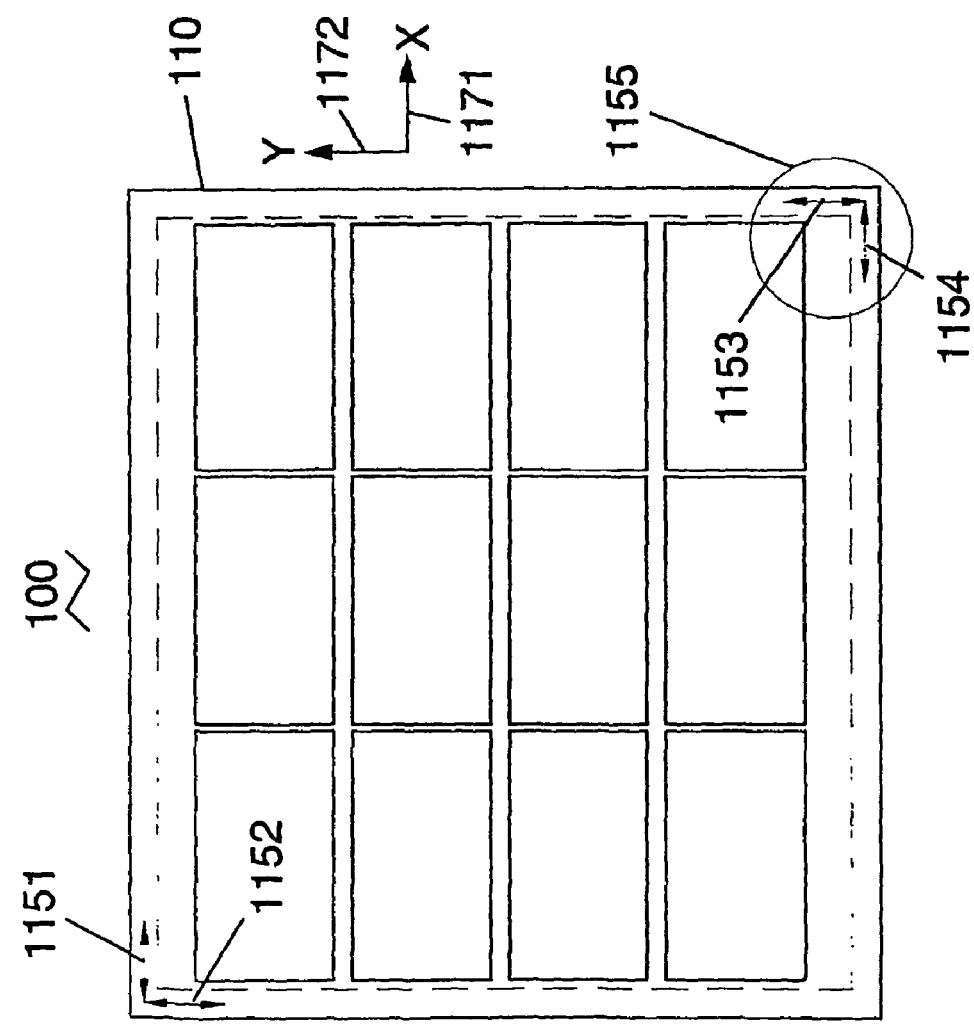
FIG. 39B
FIG. 39A

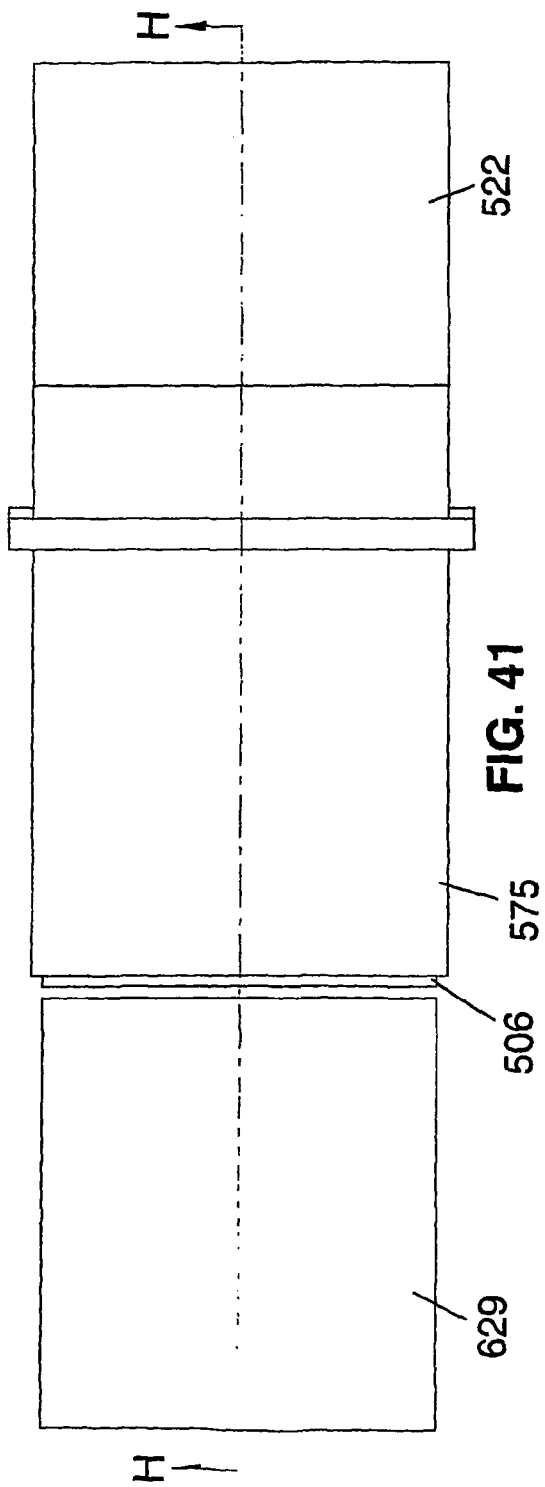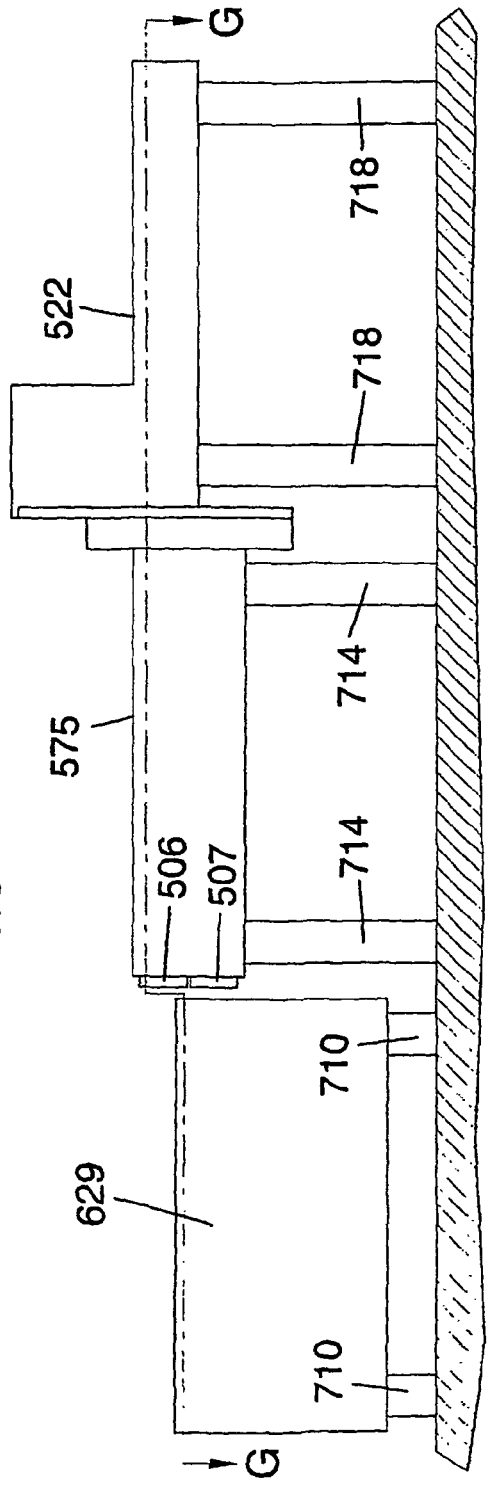
FIG. 41
FIG. 42

FIG. 43 SECTION H-H

SECTION G-G

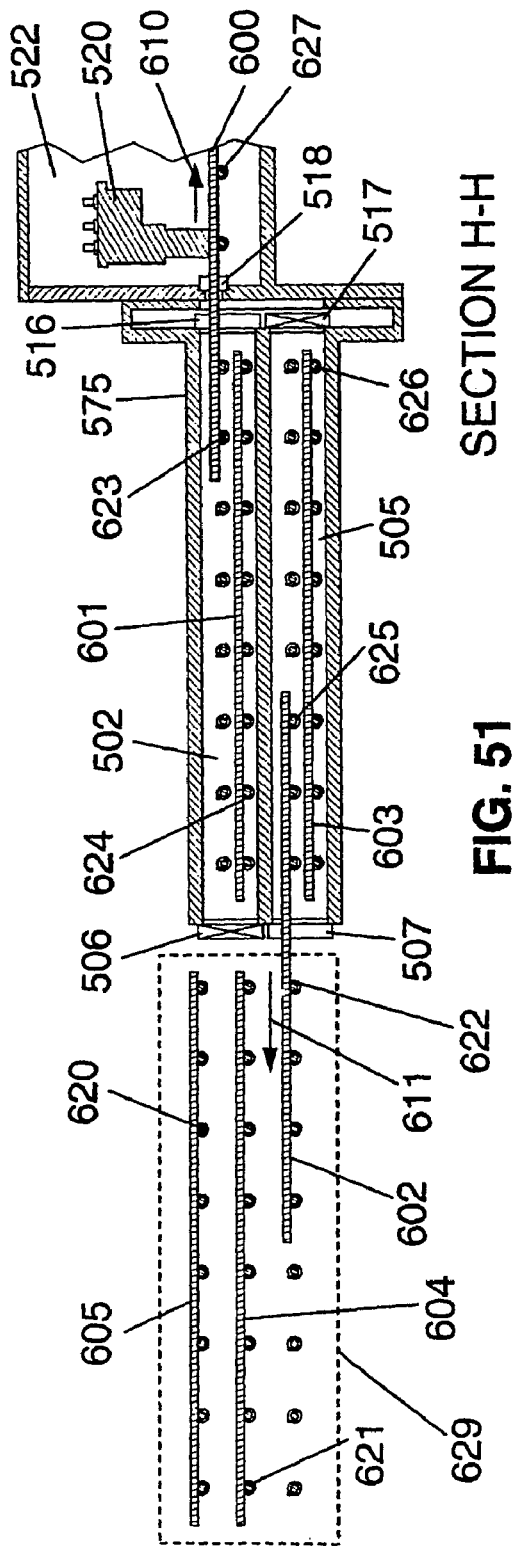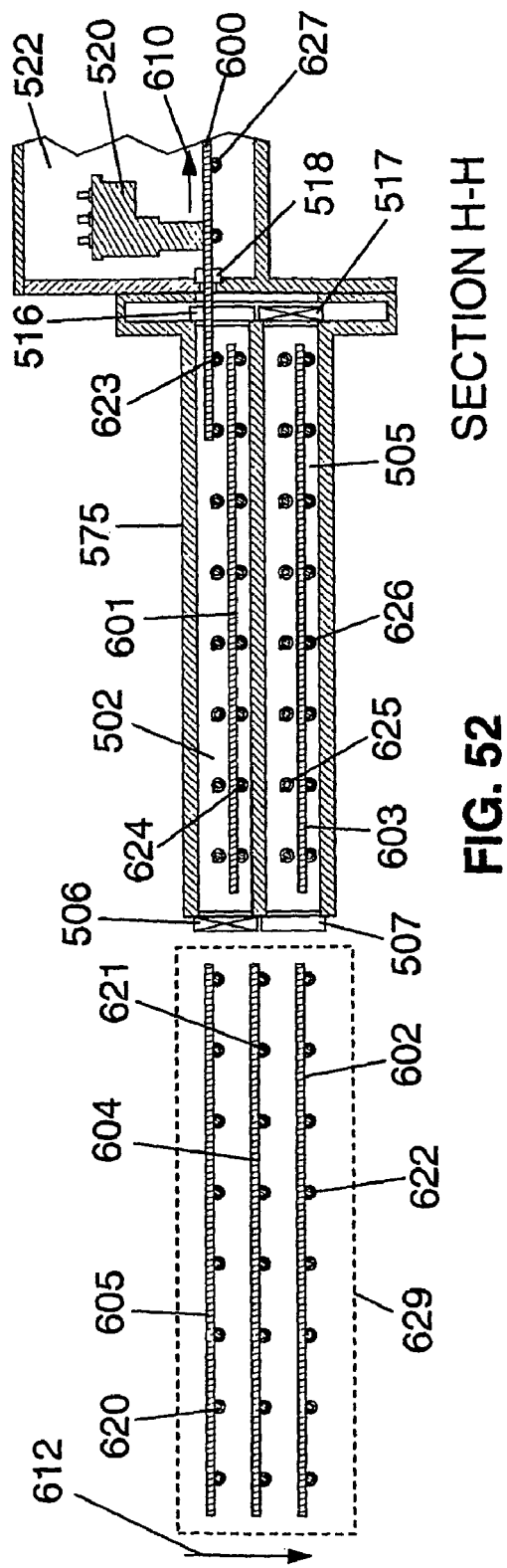

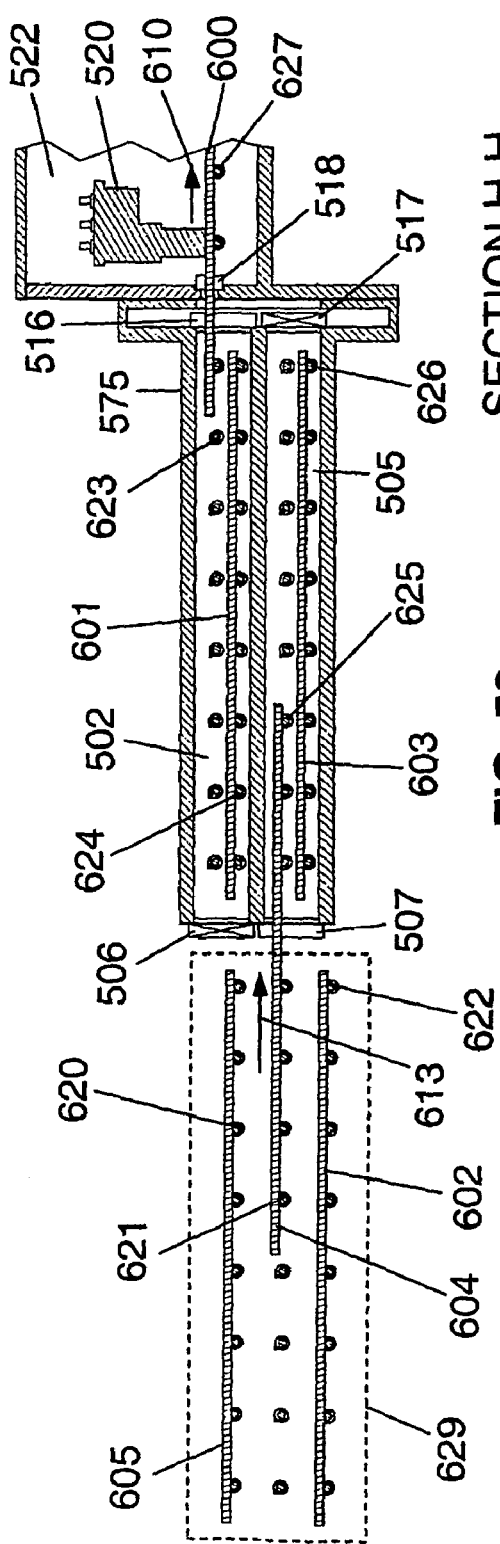
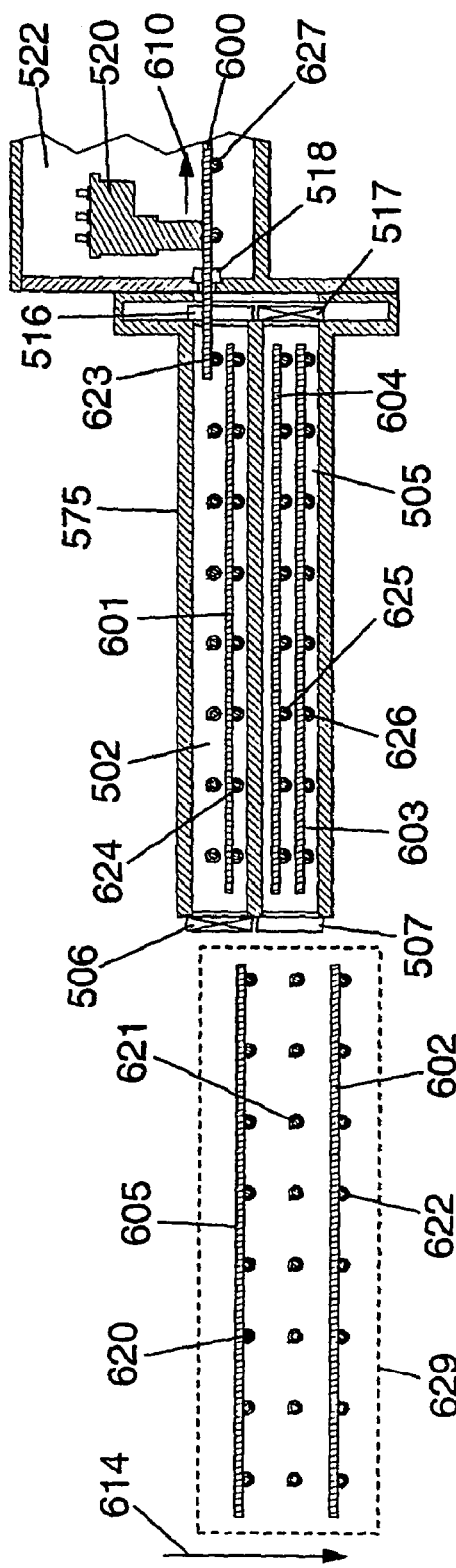

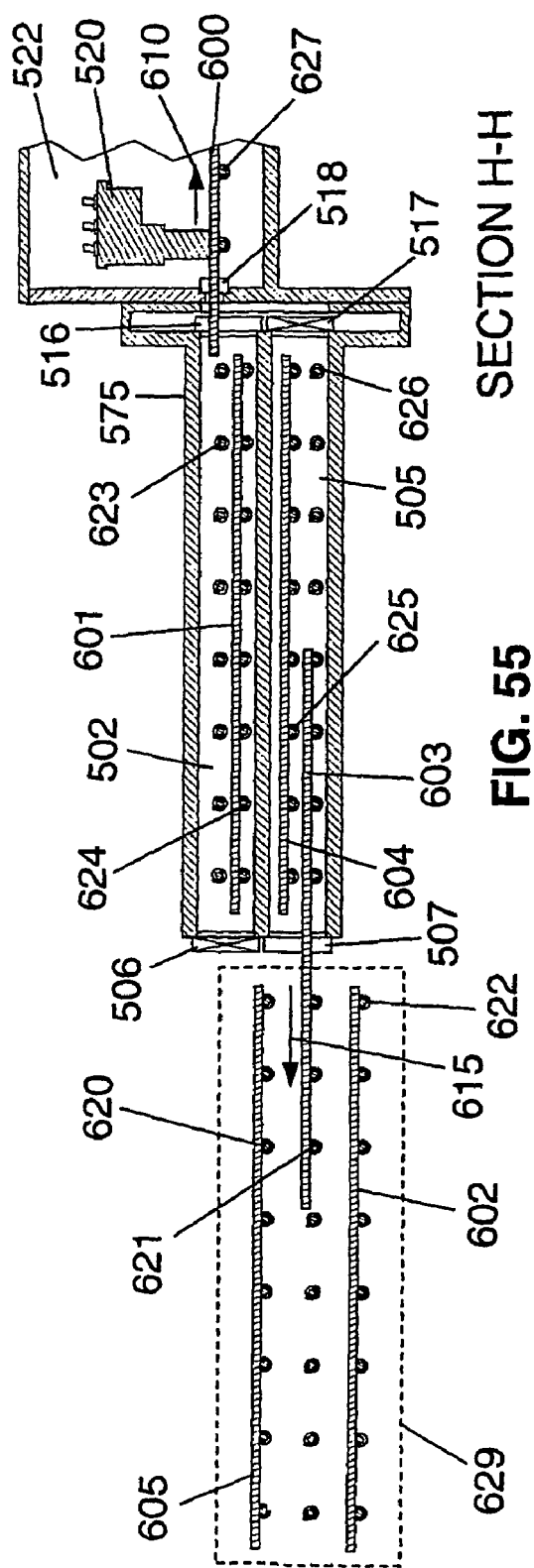
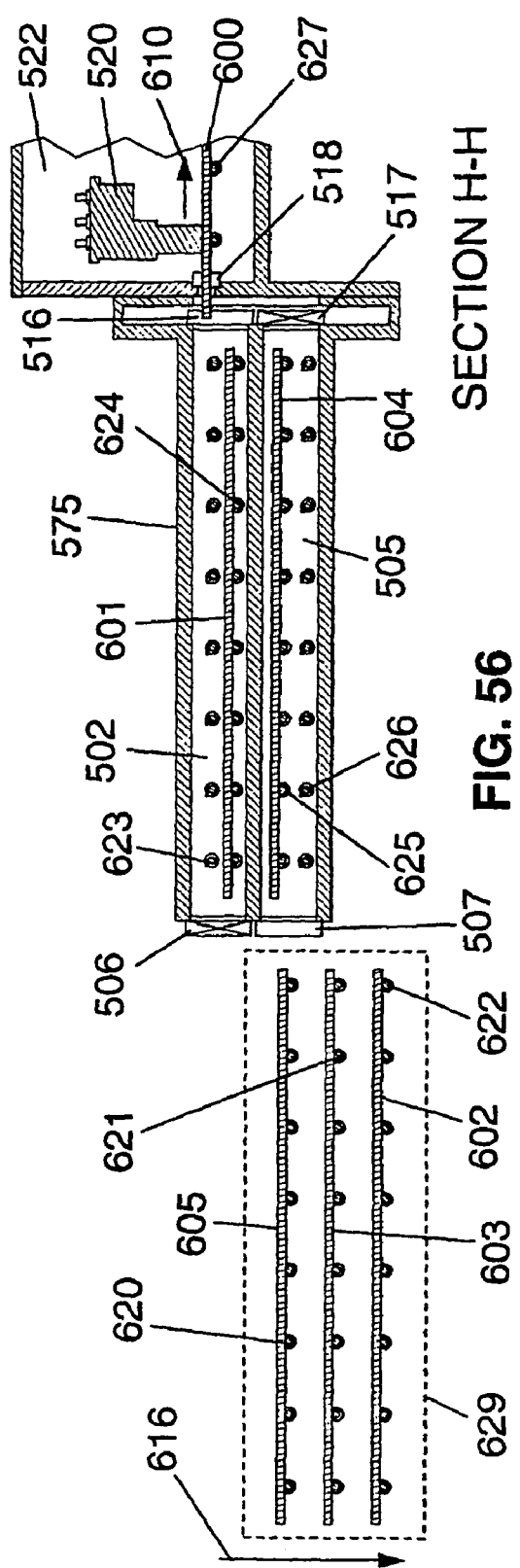
FIG. 55
FIG. 56
SECTION H-H

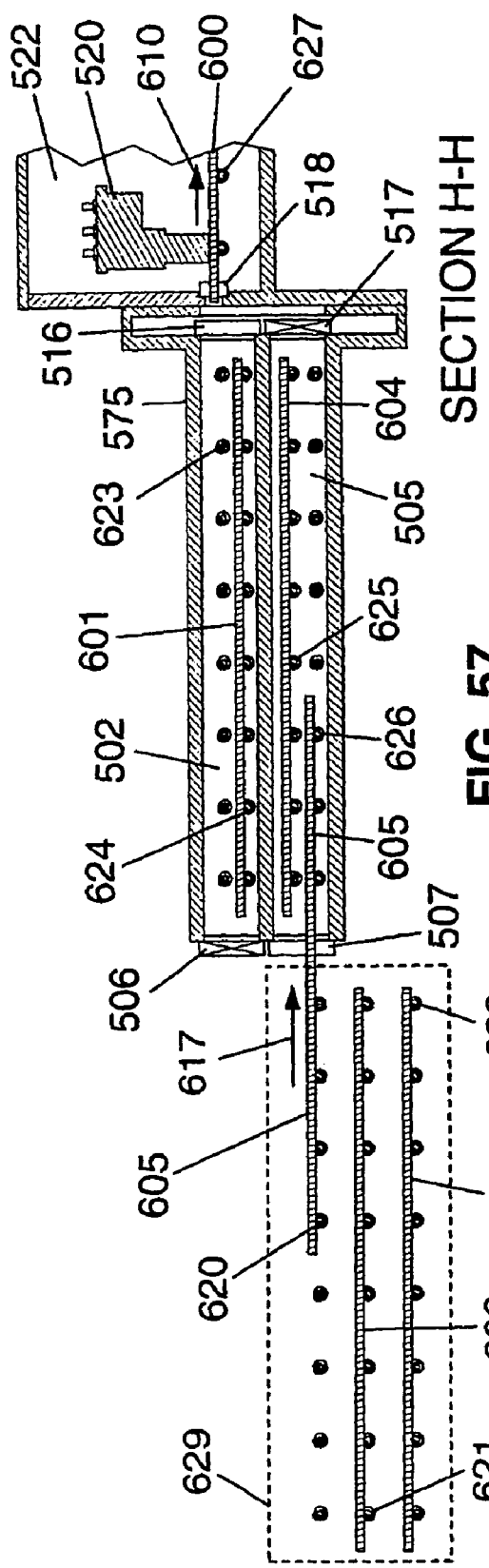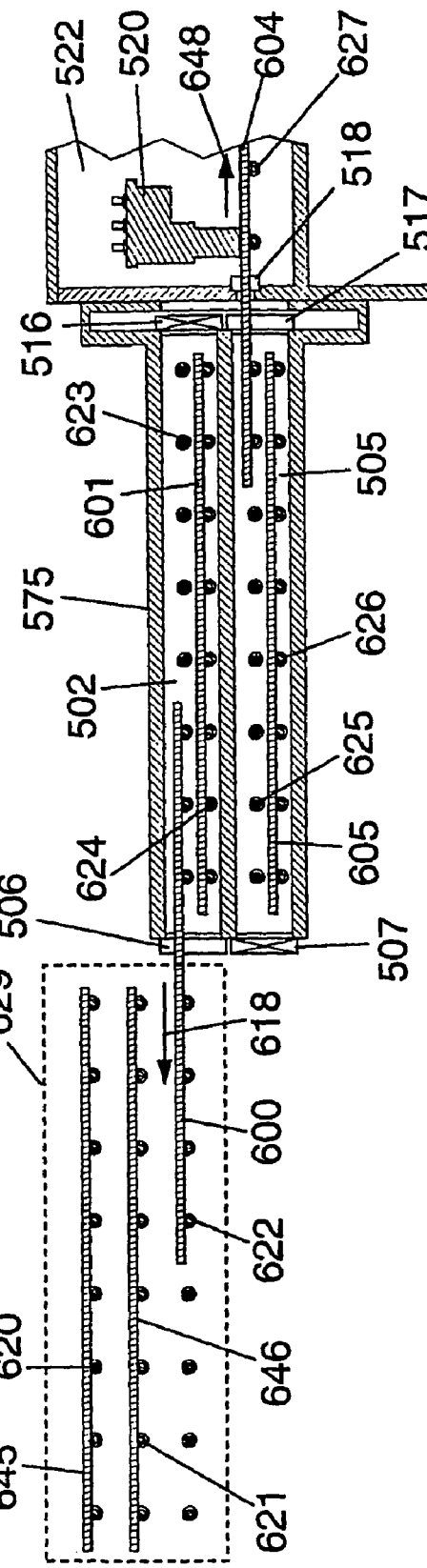

FLAT PANEL DISPLAY SUBSTRATE TESTING SYSTEM

CROSS-REFERENCE TO RELATED APPLICATION

This application is a continuation-in-part of application Ser. No. 11/379,207 filed on Apr. 18, 2006, and PCT/US06/14794 filed Apr. 19, 2006 now abandoned, the content of which is fully incorporated herein by reference.

BACKGROUND OF THE INVENTION

1. Field of the Invention

This invention relates generally to the field of systems for processing of large substrates, and more particularly to high-throughput electron-beam flat panel display substrate (FPDS) testing systems.

2. Description of the Related Art

The use of electron beams to inspect and electrically test flat panel display (FPD) substrates (FPDSs) is an established technique. For FPDS testing, it is necessary to be able to test 100% of the pixels on the FPDS surface since, typically, a display with more than a few defective pixels is unusable. In some cases, if defective pixels are detected early enough in the manufacturing process, these pixels can be repaired. In other cases, if a substrate is found to have numerous defective pixels, it is more economical to scrap that FPDS prior to further processing. FPDS testing also provides process feedback: if successive FPDSs show increasing numbers of defective pixels, a deviation from proper process parameters (etch, deposition, lithography, etc.) may have occurred, which must be corrected quickly to restore normal production yields. 100% pixel inspection requires that every pixel on the FPDS must be able to be targeted by at least one of the electron beams from the linear column array.

Prior art e-beam systems for testing FPDSs employ a process chamber, pumped down to high vacuum, for containing one or more electron beam columns. The electron beams generated by these columns are scanned across the surface of the FPDS under test, thereby causing the emission of secondary electrons (SEs) and backscattered electrons (BSEs) which are collected by a detector, as is familiar to those skilled in the art. A typical FPD has a large number of pixels, arranged in an X-Y array, each consisting of a thin-film transistor connected to a large pixel electrode. For proper operation of the FPD, it is necessary for nearly all pixels to be functional. During FPD fabrication, large numbers of pixels are connected together to "shorting bars", which, in turn, are connected to test pads around the periphery of each FPD on the FPDS. For electrical testing of the FPDS, connections are made to each of these test pads and voltages are thereby applied to the pixels in all of the FPDs on the FPDS. These electrical connections are typically made using a "probe frame", which contains a large number of contactors physically arranged to match the placement of test pads on the FPDS. After insertion of an FPDS into the process chamber, the probe frame (or its functional equivalent) is lowered onto the FPDS. Then, using the electron beams from the columns in the process chamber, electrical measurements of pixel performance may be made in order to detect if any pixels are defective.

Prior art testing systems typically employ a loadlock, attached to the process chamber, into which FPDSs for testing are loaded, pumped down, then inserted into the process chamber. After the probe frame has been lowered onto the FPDS, it may be aligned with the FPDS. If alignment is performed, no e-beam testing can be performed during the alignment process, representing a loss in system throughput. FPDSs are typically >2 m in X-Y, but <1 mm thick, and are made of glass—transporting such a delicate object clearly represents a significant difficulty, both in terms of throughput (i.e., the maximum transport speed and acceleration may be limited), and in terms of potential breakage within the system (leading to system downtime). After e-beam testing of the FPDS is completed, the probe frame is lifted off the FPDS, and the FPDS is then removed from the process chamber, followed by insertion of another FPDS into the process chamber, etc.

FIG. 1 is a schematic of a prior art multiple electron beam FPDS testing system. A typical FPDS contains a number of flat panel displays (FPDs)—six FPDs are shown in the FPDS 1398 of FIG. 1. Each FPD contains a large number of pixels arranged in an X-Y configuration. At the stage of FPD manufacturing where e-beam testing is normally performed, each pixel typically comprises a thin-film transistor (TFT) connected to a pixel electrode (generally larger than 100 µm in both dimensions). To facilitate testing, a large number of the TFT sources are shorted together with shorting bars, connected to test pads (TPs) around the periphery of each FPD on the FPDS. Similarly, large numbers of the TFT gates are also shorted together to other shorting bars, connected to another set of TPs. The prior art e-beam testing process is discussed in U.S. patent application Ser. No. 11/225,376 filed Sep. 12, 2005 incorporated by reference herein. In prior art abeam FPDS testing systems as shown in FIG. 1, after the FPDS 1398 to be tested has been inserted into the process chamber (not shown), probe frame 1399 is lowered onto FPDS 1398. Probe frame 1399 contains a large number of contactors (not shown) which must align with, and make good electrical contact to, every one of the TPs on the FPDS. If any contactors fail to make contact with the TPs, it will not be possible to fully test the FPDS, with the result that substantial numbers of defective pixels may go undetected. Since the TPs are generally positioned around the border of each FPD, and the FPDS contains a number of FPDs, probe frame 1399 must be designed with connections both to the perimeter and the middle of the FPDS—the cross-members in probe frame 1399 crossing FPDS 1398 contain these connections.

In FIG. 1, four electron beam columns 1311 generate electron beams 1330, each being scanned over an area of the FPDS 1398 typically >300 mm square. The impact of the electron beams 1330 with FPDS 1398 causes the emission of secondary electrons (SEs) and backscattered electrons (BSEs). Signal electrons 1395 may comprise only SEs, only BSEs, or a mixture of SEs and BSEs. The electron optics is configured to ensure than the signal electrons 1395 from each beam 1330 are collected only by the detector 1390 associated with that particular beam 1330 in order to avoid cross-talk between pixel test signals.

Because the square scan areas of the beams 1330 do not fully span the width of FPDS 1398, it is necessary to mount FPDS 1398 on an X-Y stage in order to position any point on the FPDS 1398 surface under one of the beams 1330. The stage comprises motion axis position sensors 1386 and 1387 and stage motors 1360 and 1361, as is familiar to those skilled in the art. Because the dimensions of the FPDS are >2 m in each axis, the X-Y stage must be very large, leading to high cost and potential reliability and maintenance issues. It would be advantageous to eliminate the need for an X-Y stage in an FPDS testing system.

Cables 1312 connect columns 1311 to optics control 1301. Cables 1391 connect detectors 1390 to detectors control 1304. Data lines 1310 connect position sensors 1386 and 1387 to X-Y position readout 1302. Cables 1325 connect stage motors 1360 and 1361 to stage control 1300. Controls 1300-1302, and 1304, are connected to system control 1303 by control links 1326, 1320, 1319, and 1392, respectively. Cable 1385 conducts control signals to the probe frame 1399 from system control 1303.

There are a number of disadvantages for prior art FPDS electron-beam testing methods:

1) The FPDS, with typical dimensions >2 m in X and Y, must be supported during testing by a large and expensive X-Y stage, which enables the FPDS to be moved around under one or more electron beams for testing of the entire FPDS surface (100% of all pixels).
2) Connection to the test pads on the FPDS requires a probe frame, which remains in the process chamber and must be aligned to the test pads for proper electrical connections. The use of a probe frame has several significant disadvantages:
   a. The probe frame-to-FPDS alignment step is performed within the process chamber—it is not possible to test the FPDS during this step, thus system throughput is adversely affected. In addition, it may be more difficult to achieve good alignment due to the difficulty of working within the confines of the process chamber.
   b. If the probe frame-to-FPDS alignment is accelerated or omitted to improve throughput, there will be cases in which some test pads are not connected to the testing system electronics, causing large numbers of pixels to go untested.
   c. When there is a change in the FPDS design, the process chamber must be opened to replace the probe frame since the probe frame design must be consistent with the particular arrangement of test pads on the FPDS. This has a serious negative impact on throughput and tool availability.
   d. If there is a failure of the probe frame, the process chamber must be opened for replacement or repair of the probe frame—during this time, the system is down.
   e. Because prior art systems use an X-Y stage to move the FPDS during testing, moving cables are required to make contact to the probe frame which is moving along with the FPDS. It is well known by those skilled in the art that two major sources of system unreliability are cables and cable connectors, especially if the cables connect to a moving assembly such as the probe frame.
3) Prior art electron-beam FPDS testing systems generally transport the FPDS without any protective surroundings, e.g. a pallet, for physical support—this raises issues of potential FPDS breakage within the FPDS testing system, leading to system downtime while fragments of the broken FPDS are removed from valves, mechanisms, pump openings, etc.
4) In prior art testing systems, when the FPD fab switches from one size FPDS to another (usually larger) size FPDS, typically either substantial changes to the testing system are required, or an entirely new testing system is needed.

Thus there is a need for an electron-beam FPDS testing system with the following improvements from prior art e-beam FPDS testing systems:

1) Elimination of the need for a large and expensive X-Y stage for supporting the FPDS under test.
2) Elimination of a probe frame which remains in the process chamber, and substituting a method of connecting to the test pads on the FPDS which eliminates the disadvantages of prior art system designs described above.
3) Elimination of all moving cables and cable connectors between the FPDS under test and the system.
4) Adding a capability for rapid changeover from one size FPDS to another size FPDS with minimal or no system downtime.

SUMMARY OF THE INVENTION

The present invention includes an equally spaced linear array of electron beam columns, each configured with a main scan axis parallel to the linear array of electron beam columns such that the scans of neighboring columns overlap, thereby providing 100% scanning across the full width of the FPDS under test. The multiple electron beam columns may instead be multiple ion beam columns, each generating a single ion beam which is focused onto the surface of the FPDS for imaging and/or testing purposes. The present invention provides a system for testing of FPDSs which addresses all three areas for improvement described in the background of the invention:

1) Instead of the X-Y stage, the present invention employs a set of bi-directional motor-driven rollers to move a pallet containing the FPDS along one axis within the process chamber, while a line of e-beam columns (oriented perpendicularly to the FPDS motion axis) tests pixels across the full width of the FPDS. The pallet provides physical support and protection for the delicate FPDS at all times within the system.
2) Instead of using a probe frame, the present invention uses the pallet described above to also provide electrical connection to the test pads on the FPDS. Advantages of electrically connecting to the FPDS using a pallet include:
   a. Since the pallet travels with the FPDS throughout the system, it does not remain within the process chamber. Alignment of contactors to test pads may be done simultaneously with e-beam testing of another FPDS (thereby improving throughput).
   b. Since alignment of the contactors to the test pads is done outside the confines of the process chamber, potentially alignment may be easier and/or faster. Also, since alignment now has no effect on throughput, it is possible take sufficient time for alignment to ensure that all contactors are making proper contact prior to insertion of the pallet into the process chamber—thus e-beam testing need never be aborted due to contact failure within the process chamber.
   c. When there is a change in the FPDS design, different pallets (adapted to the new FPDS design) can be immediately substituted with no need to open the process chamber and with no loss in throughput or system availability.
   d. If there is a failure of the contactors on a particular pallet, another pallet may be substituted, with no need for opening the process chamber and with minimal throughput effect.
3) Rather than using moving cables and cable connectors between the FPDS under test and the system, a method of wireless communication is used to/from the pallet as it moves within the process chamber, thereby improving system reliability.
4) Since the pallet transport mechanisms deal only with pallets and not with the FPDS, it is simple to convert the testing system from one size FPDS to another size by using a different pallet (having the same X-Y outer dimensions), with no system downtime for the conversion.

The detailed specification is divided into a number of sections, each describing various aspects of the present invention. Some of these sections apply to both embodiments, while others apply to only the first embodiment or only to the second embodiment. Each section is described briefly below:

Flat Panel Display Substrate Pallet Design

FIGS. 3-9 describe the overall mechanical design of the FPDS pallet used in both embodiments. The pallet has a pallet top and a pallet bottom, with provision for the FPDS to be clamped between them.

Internal Structure and Electronics of the Pallet

FIGS. 10-17 describe the electronics within the pallet used in both embodiments, including the internal drive electronics which provides voltages to contactors which connect to test pads on the FPDS under test, as well as wireless data links to/from the system control, and three alternative means for supplying power to charge batteries in the pallet.

Pin Plate and Robot End Effector Design

FIGS. 18-25 describe the design of the pin plate used to disassemble pallets, and the robot end effector used to remove FPDSs from disassembled pallets. The pin plate and end effector designs apply to both the first and second embodiments.

Detailed Pallet Disassembly Procedure

FIGS. 26-33 show the disassembly procedure for pallets in detail. Two sets of pins (long and short) on the pin plate are able to separate the pallet top, FPDS, and pallet bottom in one vertical actuator-driven motion. After the pallet is separated, the robot end effector is able to enter the assembly (which is being held apart by the pin plate), remove the already-tested FPDS, insert another FPDS (ready for testing), and then reassemble the pallet. This procedure applies to both the first and second embodiments.

Procedure for Aligning the Pallet Top to the FPDS

FIGS. 34-40 illustrate a procedure for aligning the pallet top with the FPDS. This alignment is necessary to ensure that all of the large number of contactors in the pallet top align (to within a few μm) with the test pads on the FPDS under test. Two alternative means for detecting alignment marks on the FPDS are described, along with a procedure for precisely moving the pallet top in X-Y-Yaw relative to the FPDS. After proper alignment has been achieved, the pallet top and pallet bottom are firmly locked together, clamping the FPDS under test between them. This alignment and clamping procedure applies to both the first and second embodiments.

First Embodiment of An FPDS Testing System

FIGS. 41-44 describe a first embodiment of the present invention, comprising three subsystems: a pallet elevator, a dual loadlock, and a process chamber. The pallet elevator is the interface to the FPD fab, while the dual loadlock enables the process chamber to run nonstop testing of FPDSs using a multiple electron beam column assembly with no down-time for pumping down or venting the loadlock.

Pallet X-Y-Yaw Positional Measurement System

FIGS. 45-50 discuss a system for measuring the X-Y-Yaw position of the pallet during e-beam testing. Given the X-Y-Yaw positional data, the system control directs the optics control to deflect the multiple e-beams to correct for any positional errors. The X-Y-Yaw positional measurement system applies to both the first and second embodiments.

Pallet Transfer between Pallet Elevator, Dual Loadlock, and Process Chamber

FIGS. 51-58 illustrate the pallet transfer process back and forth between the pallet elevator and dual loadlock, and back and forth between the dual loadlock and the process chamber in the first embodiment.

Pallet Disassembly and FPDS Removal from Pallet Elevator

FIGS. 59-63 describe the following: disassembly of two pallets within the pallet elevator, then removal of FPDSs from the pallet elevator into the FPD fab. The process for insertion of FPDSs for testing, then pallet reassembly, is the reverse: FIGS. 63-59. The process shown applies only to the first embodiment.

Timing Diagram for the First Embodiment of an FPDS Testing System

FIG. 64 is a timing diagram for the first embodiment of the present invention describing the 240 s cycle during which four FPDSs are fully tested by the multiple e-beam column assembly within the process chamber.

Second Embodiment of An FPDS Testing System

FIGS. 65-70 describe a second embodiment of the present invention, comprising two subsystems: a dual loadlock and a process chamber. The functions provided by both the pallet elevator and the dual loadlock in the first embodiment are combined into the dual loadlock in the second embodiment. This saves FPD fab floor space which is typically at a premium. The process chamber for the second embodiment is identical to that of the first embodiment.

Timing Diagram for the Second Embodiment of an FPDS Testing System

FIG. 70 is a timing diagram for the second embodiment of the present invention describing the 240 s cycle during which four FPDSs are fully tested by the multiple e-beam column assembly within the process chamber.

Schematic View of the Electron Optical Column and Detector Optics

FIG. 71 is a schematic cross-section of one of the electron optical columns 1211 and the corresponding detector 1240 shown in FIG. 2. Details of the electron source, focusing lenses, beam blanker, and deflectors are shown.

BRIEF DESCRIPTION OF THE FIGURES

FIG. 4 is a schematic top view of pallet 100 in FIG. 3;

FIG. 5 is a schematic side view of pallet 100 in FIG. 3;

FIG. 6 is a schematic end view of pallet 100 in FIG. 3;

FIG. 7 is a schematic bottom view of pallet 100 in FIG. 3;

FIG. 8 is a schematic view through section A-A of pallet 100 in FIG. 4;

FIG. 9 is a schematic view through section E-E of pallet 100 in FIG. 7;

FIG. 13 is a schematic view through section B-B showing the internal power system of pallet 100 in FIG. 6;

FIG. 14 is a schematic view through section F-F showing the internal power system of pallet 100 in FIG. 4;

FIG. 15 is a schematic view through section C-C showing the internal data bus of pallet 100 in FIG. 6;

FIG. 18 is a schematic isometric view of pallet 100 and pin plate 202, illustrating the insertion direction for pin plate 202 into pallet 100;

FIG. 19 is a schematic top view with a partial cutaway of pallet 100 and pin plate 202 in FIG. 18;

FIG. 20 is a schematic side view of pallet 100 and pin plate 202 in FIG. 18;

FIG. 21 is a schematic end view of pallet 100 and pin plate 202 in FIG. 18;

FIG. 23 is a schematic top view of the robot end effector in FIG. 22;

FIG. 24 is a schematic side view of the robot end effector in FIG. 22;

FIG. 25 is a schematic end view of the robot end effector in FIG. 22;

FIG. 27 is a schematic view through section J-J of pallet 100 and pin plate 202 in FIG. 19 showing pin plate 202 before insertion into pallet 100;

FIG. 28 is a schematic view through section J-J of pallet 100 and pin plate 202 in FIG. 19 showing pin plate 202 inserted into pallet 100, positioned to separate pallet top 110 from pallet bottom 112;

FIG. 29 is a schematic view through section J-J of pallet 100 and pin plate 202 in FIG. 19 showing pin plate 202 inserted into pallet 100, positioned to separate FPDS 120 from pallet bottom 112;

FIG. 30 is a schematic view through section J-J of pallet 100 and pin plate 202 in FIG. 19 showing pin plate 202 fully inserted into the separated pallet;

FIG. 31 is a schematic view through section J-J of pallet 100 and pin plate 202 in FIG. 19 showing a robot end effector entering the separated pallet underneath FPDS 120;

FIG. 32 is a schematic view through section J-J of pallet 100 and pin plate 202 in FIG. 19 showing the robot end effector lifting FPDS 120 off pin plate 202;

FIG. 39A is a schematic view of X-Y-Yaw relative motion vectors between the pallet top 110 and pallet bottom 112 for alignment of contactors 425 with pads 426 as shown in FIG. 17;

FIG. 39B is detail view 1155 with partial cutaway of X-Y-Yaw actuators mounted between pallet top 110 and pallet bottom 112 in FIG. 39A;

FIG. 41 is a top view of a first embodiment of an FPDS testing system embodying the present invention, including pallet elevator 629, dual loadlock 575 and process chamber 522;

FIG. 42 is a side view of the FPDS testing system in FIG. 41;

FIG. 51 is a schematic view through section H-H of the FPDS testing system in FIG. 41 showing an FPDS in pallet 600 from upper loadlock 502 being tested while processed pallet (i.e., a pallet containing an already-tested FPDS) 602 is being removed from lower loadlock 505 into pallet elevator 629;

FIG. 52 is a schematic view through section H-H of the FPDS testing system in FIG. 41 showing an FPDS in pallet 600 from upper loadlock 502 being tested while pallet elevator 629 is indexing to enable insertion of unprocessed pallet (i.e., a pallet containing an FPDS ready for testing) 604 from pallet elevator 629 into lower loadlock 505;

FIG. 53 is a schematic view through section H-H of the FPDS testing system in FIG. 41 showing an FPDS in pallet 600 from upper loadlock 502 being tested while unprocessed pallet 604 is being inserted from pallet elevator 629 into lower loadlock 505;

FIG. 54 is a schematic view through section H-H of the FPDS testing system in FIG. 41 showing an FPDS in pallet 600 from upper loadlock 502 being tested while pallet elevator 629 is indexing to enable removal of processed pallet 603;

FIG. 55 is a schematic view through section H-H of the FPDS testing system in FIG. 41 showing an FPDS in pallet 600 from upper loadlock 502 being tested while processed pallet 603 is being removed from lower loadlock 505 into pallet elevator 629;

FIG. 56 is a schematic view through section H-H of the FPDS testing system in FIG. 41 showing an FPDS in pallet 600 from upper loadlock 502 being tested while pallet elevator 629 is indexing to enable insertion of unprocessed pallet 605 from pallet elevator 629 into lower loadlock 505;

FIG. 57 is a schematic view through section H-H of the FPDS testing system in FIG. 41 showing an FPDS in pallet 600 from upper loadlock 502 being tested while unprocessed pallet 605 is being inserted from pallet elevator 629 into lower loadlock 505;

FIG. 58 is a schematic view through section H-H of the FPDS testing system in FIG. 41 showing an FPDS in pallet 604 from lower loadlock 505 being tested while processed pallet 600 is being removed from upper loadlock 502 into pallet elevator 629

DETAILED DESCRIPTION

Figure 1:
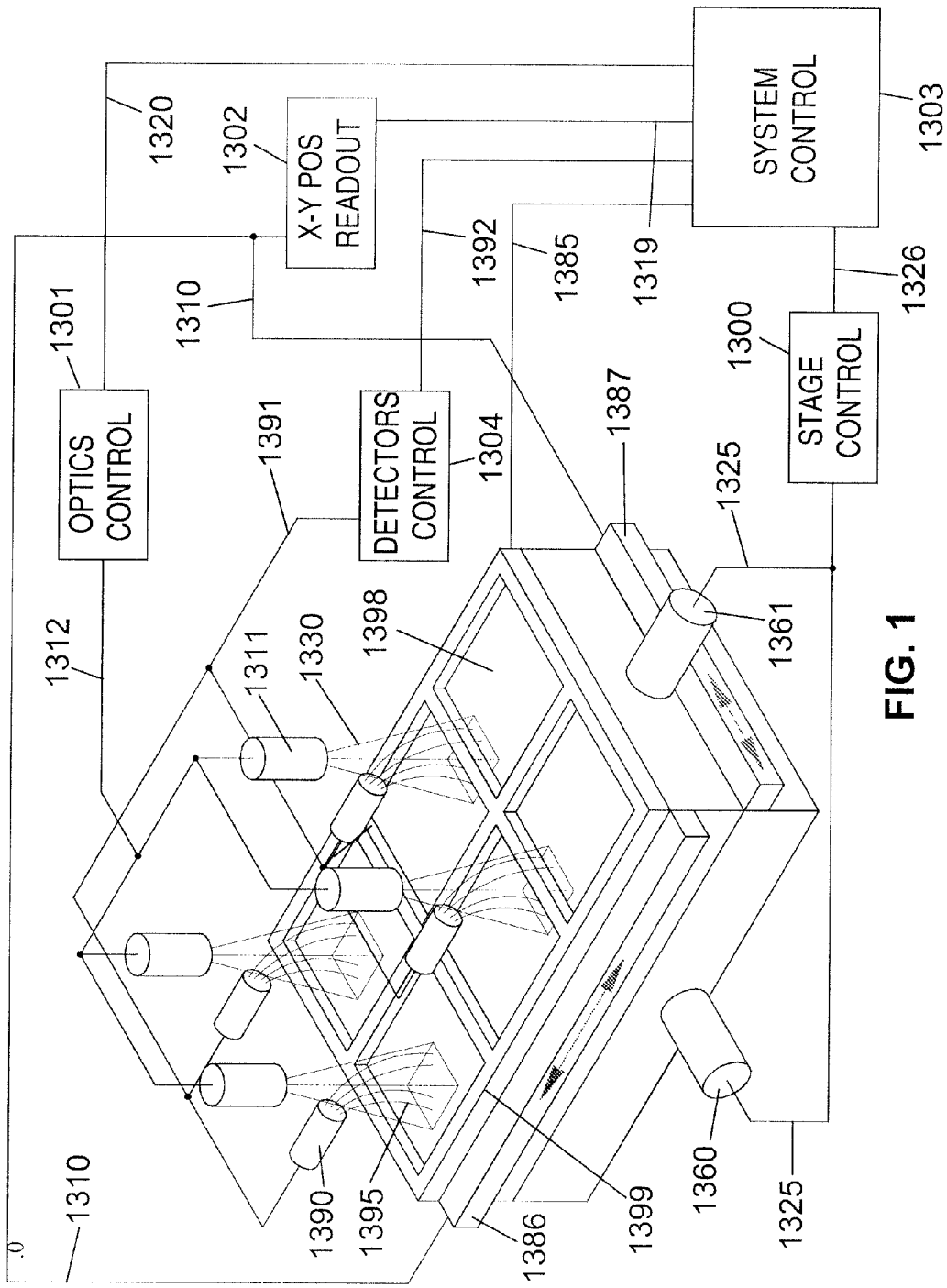
FIG. 1 is a schematic of certain functional elements of a prior art multiple electron beam FPDS testing system.
Figure 2:
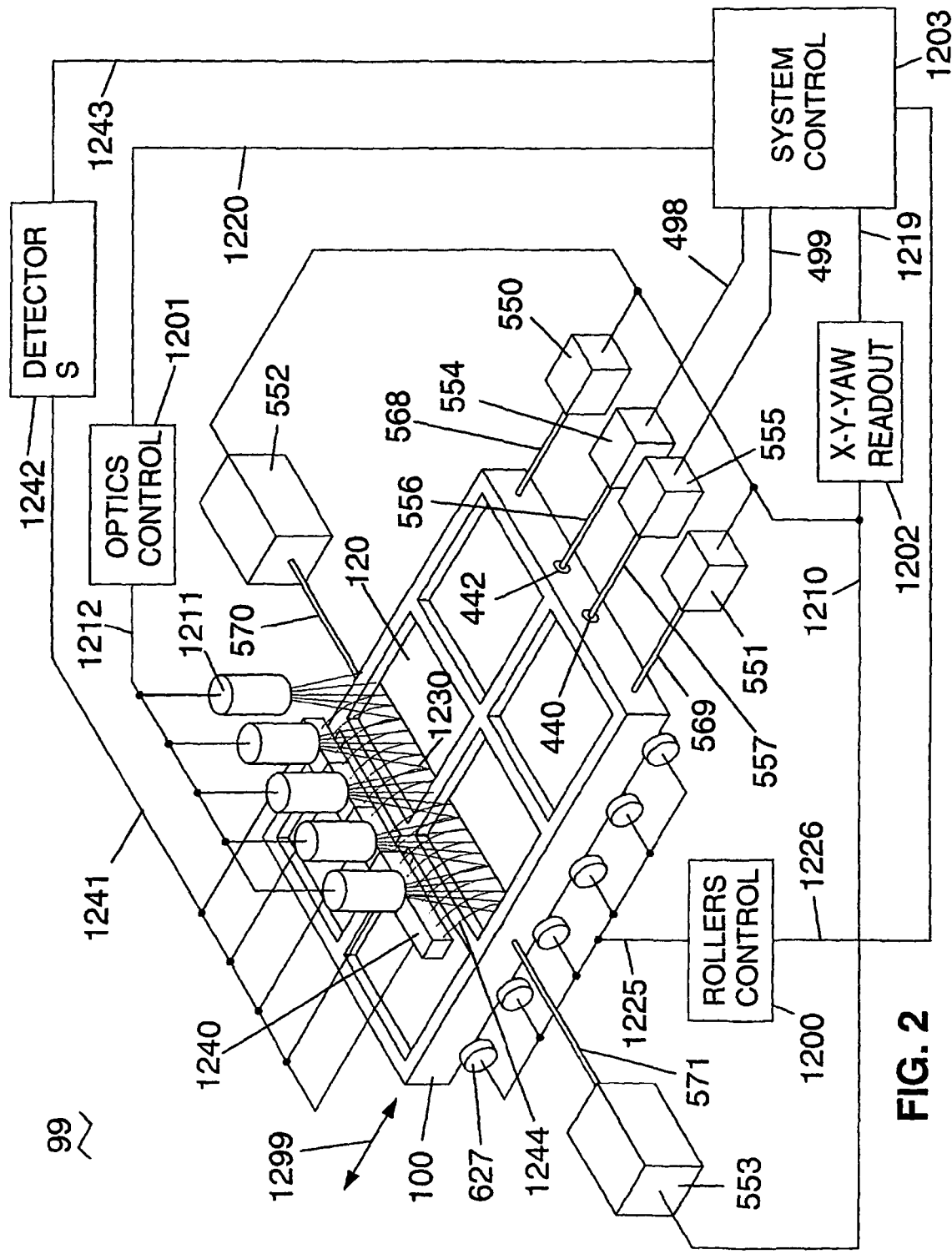
FIG. 2 is a schematic 99 of certain functional elements of a multiple electron beam FPDS testing system according to the present invention.

FIG. 2 is a schematic 99 of certain functional elements of a multiple electron beam system for testing substrates. Although the present invention applies to various types of substrates requiring electrical testing, the following disclosure describes in detailed example a FPDS testing system according to the present invention. To avoid the disadvantages of a probe frame which were discussed in reference to FIG. 1, FPDS 120 (which may have a plurality of FPDs, such as six FPDs in the FPDS shown in FIG. 2) is carried in a pallet 100 which provides the following benefits during the operation of an FPDS testing system 99 according to the present invention:

1) Pallet 100 supports and protects the delicate FPDS 120 during transport and e-beam testing within the process chamber (not shown)—this support virtually eliminates the chance of FPDS breakage in the system which would lead to unplanned tool downtime. In the prior art, the FPDS alone is transported through the testing system with no protection against breakage.

2) The pallet 100 supplies electrical connections to the FPDS under test—if a contactor within the pallet fails, the pallet can be replaced with no need to vent and open a process chamber of the present invention, which will be described in reference to the figures of the drawing. There is also no impact on either throughput or tool availability.

3) The pallet 100 contains internal alignment mechanisms which enable the pallet contactors to be accurately aligned to all of the test pads on the FPDS 120 with no impact on throughput—see FIGS. 39A-39B (this is accomplished by performing the alignment step outside the process chamber, while another FPDS is being tested).

4) The pallet 100, in conjunction with a linear array of e-beams spanning the full width of the FPDS, eliminates the need for an X-Y stage, thereby substantially reducing system cost and increasing reliability.

5) If there is a change in the FPDS design, a new pallet (with different connections to the test pads, if necessary) can be substituted with no effect on either throughput or tool availability.

6) Since the pallet 100 interacts with the FPDS testing system using wireless communication, all moving cables are eliminated, improving reliability.

7) The FPDS testing system can use pallets containing FPDSs of different sizes as long as the outer dimensions of the pallets are the same—there is no system downtime for the conversion. This capability enables the system design to have increased extensibility to future FPDS generations.

Pallet 100 is supported by bi-directional motor-driven rollers 627 to transport pallet 100 into and out of the process chamber (not shown) along direction 1299.

Figure 71:
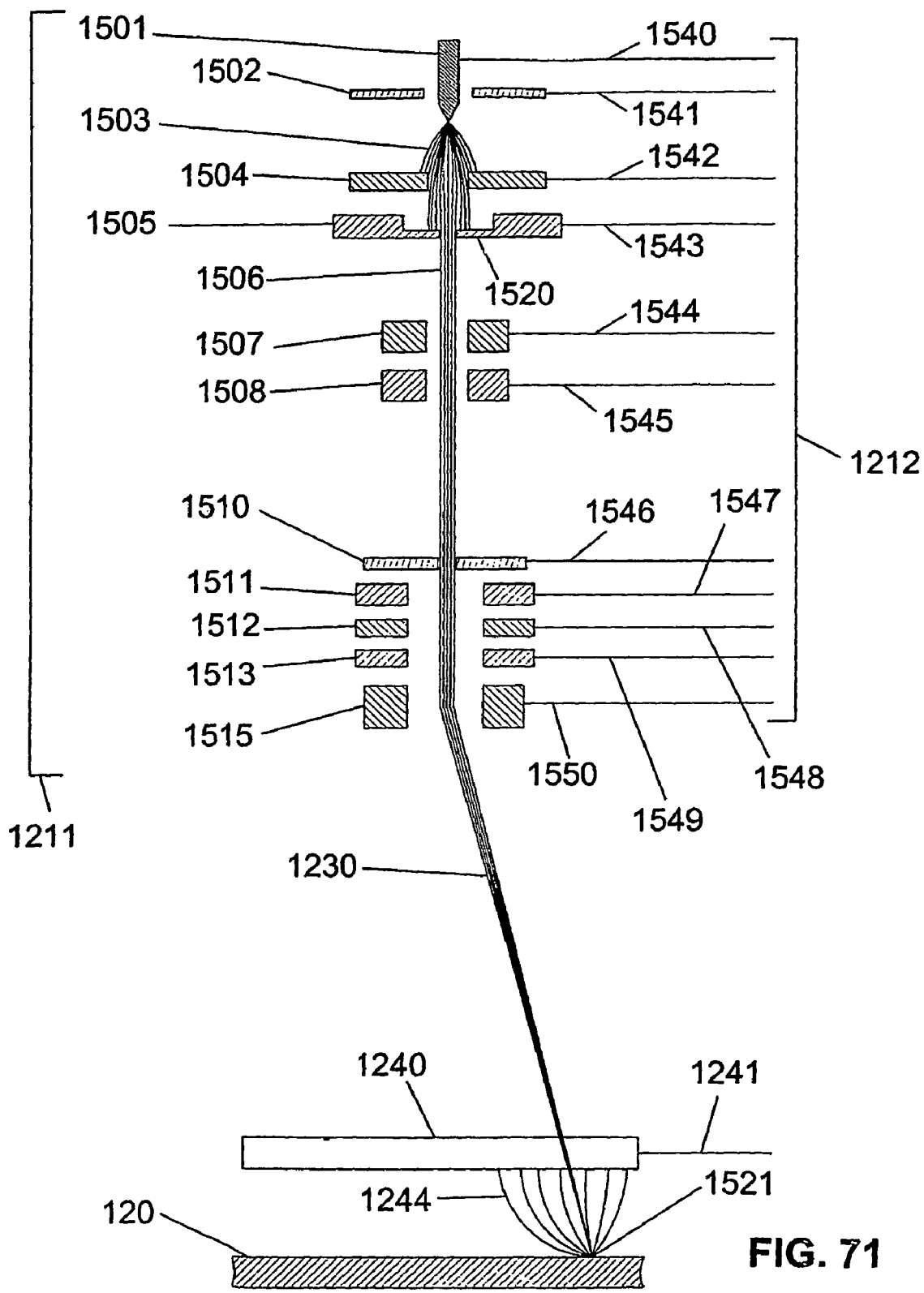
FIG. 71 is a schematic cross-section of one of the electron optical columns 1211 and the corresponding detector 1240 shown in FIG. 2.

Each column 1211 includes an electron source for generating an electron beam 1230, one or more lenses for focusing electron beam 1230 onto the surface of FPDS 120, and a deflector for deflecting electron beam 1230 on the surface of FPDS 120. The design of columns 1211 is optimized to scan beams 1230 substantially along an axis perpendicular to the direction of travel 1299 (X direction) of pallet 100. FIG. 71 is a schematic cross-section of one of the electron optical columns 1211 and the corresponding detector 1240 shown in FIG. 2. Details of the e-beam testing process applicable to the present invention are discussed in U.S. patent application Ser. No. 11/225,376 filed Sep. 12, 2005 incorporated by reference herein.

In FIG. 2, five electron beam columns 1211 generate electron beams 1230, each beam 1230 being configured to scan substantially along an axis perpendicular to the direction of travel 1299 of pallet 100. The scan distance of each beam 1230 is typically ~125 mm wide and the spacing of columns 1211 is less than or equal to the width of the beam scans, thus neighboring scans overlap or abut, enabling the full width of FPDS 120 to be scanned with at least one e-beam 1230 without the need for motion in the Y direction. This allows the entire X-Y surface of FPDS 120 to be scanned using motion along only one axis 1299 (X axis), with pallet 100 supported and moved by the set of bi-directional motor-driven rollers 627.

As for the prior art in FIG. 1, the impact of the electron beams 1230 with FPDS 120 causes the emission of secondary electrons (SEs) and backscattered electrons (BSEs). Signal electrons 1244 may comprise only SEs, only BSEs, or a mixture of SEs and BSEs. The detector optics design is configured to ensure than the signal electrons 1244 from each beam 1230 are collected only by the detector 1240 associated with that particular beam 1230 in order to avoid cross-talk between pixel test signals. Details of the detector optics design and operation applicable to the present invention are discussed in U.S. patent application Ser. No. 11/093,000 filed Mar. 28, 2005 and in U.S. patent application Ser. No. 11/355,256 filed Feb. 14, 2006, both incorporated by reference herein.

The FPDS testing system of the present invention in FIG. 2 utilizes a different method for measuring and controlling the position of FPDS 120 under testing e-beams 1230 than is used in the prior art of FIG. 1. Position sensors 550-553 emit laser beams 568-571, respectively, toward the reflective sides of pallet 100. The laser beams are then reflected off the sides of pallet 100 back to each sensor 550-553, respectively (i.e., with no crosstalk between sensors 550-553). Sensors 550-553 may employ various methods of determining the distances from each sensor to the reflective sides of pallet 100, including laser interferometry, laser beam triangulation, or some other method for distance determination—the accuracy of the X-Y-Yaw position measurements preferably should be in the ~2-10 µm range, substantially smaller than the dimensions of the test pads on the FPDS 120. The respective distances from each of sensors 550-553 to pallet 100 can then be used to accurately determine the pallet X-Y-Yaw position as is familiar to those skilled in the art. Details of the pallet X-Y-Yaw position sensing methodology are given in FIGS. 45-50, below.

System control 1203 sends control signals along data line 498 to data transmitter 554 which transmits signal beam 556 to data receiver 442 mounted in the side of pallet 100. Pallet 100 communicates with system control 1203 using data transmitter 440 (mounted in the side of pallet 100) to transmit signal beam 557 to data receiver 555. The signal from data receiver 555 passes along data line 499 to system control 1203.

The signals being transmitted from system control 1203 to pallet 100 include the following:
1) Data on the X-Y-Yaw position of pallet 100 relative to optics assembly 520 (first embodiment) or 806 (second embodiment). The pallet uses this data to determine which pixels are within range of beams 1230, and therefore which test pads should have voltages sent to them for activating the thin-film transistors which drive the pixel elements to be tested.
2) Confirmation of status information received—this allows pallet 100 to verify that system control 1203 received the correct status information.
3) Control information for when to activate battery charger 406 (FIG. 10), 471 (FIG. 11), or 482 (FIG. 12).
4) Any other necessary control information needed by internal drive electronics 410.

The signals being transmitted from pallet 100 to system control 1203 include the following:

1) Confirmation of X-Y-Yaw data received—this allows system control 1203 to verify that pallet 100 received the correct X-Y-Yaw data.
2) Status information on internal drive electronics 410 and the charge state of battery 408.

Signal beams 556 and 557 may be any form of radiation capable of being modulated with the control data, such as radio waves, IR, visible light, or UV. An important advantage of the present invention over the prior art is the complete elimination of cables and cable connectors between system control 1203 and the FPDS 120 under test which is moving along direction 1299 within the process chamber (not shown). The elimination of cables and cable connectors leads to higher throughput (since the speed of pallet 100 is not limited by the cables) and increased reliability.

Cables 1212 connect columns 1211 to optics control 1201. Cables 1241 connect detectors 1240 to detectors control 1242. Data lines 1210 connect position sensors 550-553 to X-Y-Yaw readout 1202. Cables 1225 connect bi-directional motor-driven rollers 627 to rollers control 1200. Controls 1200-1202 and 1242 are connected to system control 1203 by control links 1226, 1220, 1219, and 1243, respectively.

Flat Panel Display Substrate Pallet Design

Figure 3:
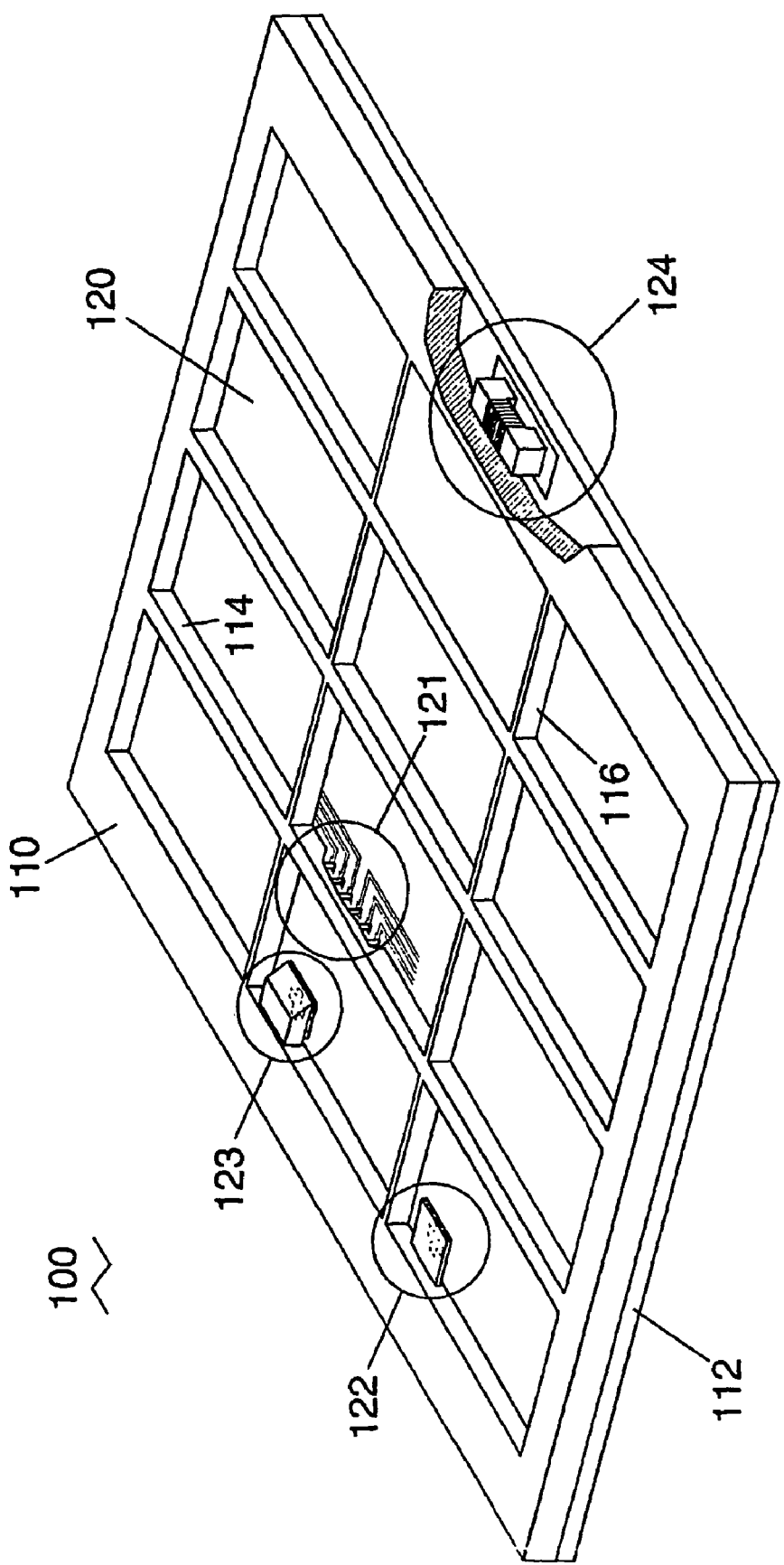
FIG. 3 is a schematic isometric view of a pallet 100.

FIG. 3 is a schematic isometric view of a pallet 100. Pallet 100 includes pallet top 110 and pallet bottom 112, with provision for an FPDS 120 to be clamped between them. Typically, multiple flat panel displays (FPDs) will be fabricated on a single FPDS 120—pallet top 110 is configured with cross-members 114 and 116 which cover areas on FPDS 120 which are not to be tested or otherwise processed, but which typically contain test pads connecting to shorting bars as discussed in FIG. 1. Detail view 121 shows contactors making electrical connections with test pads on FPDS 120 (see FIG. 17). Detail view 122 shows a capacitive sensor locating an alignment mark on FPDS 120 (see FIGS. 34-37). Detail view 123 shows an optical sensor locating an alignment mark on FPDS 120 (see FIG. 38). Detail view 124 shows a locking mechanism between pallet top 110 and pallet bottom 112.

FIGS. 4-7 are schematic top, side, end and bottom views, respectively, of pallet 100 in FIG. 3. In the top view in FIG. 4, the overall X-Y pallet dimensions 130 and 132 are shown. Also shown is outline 146 of FPDS 120. The X-Y dimensions of pallet 100 must be somewhat larger than the X-Y dimensions of FPDS 120 in order to accommodate internal drive electronics 410 within pallet 100 (see FIGS. 13-16). Clearly, pallets with the same overall dimensions 130 and 132 can accommodate any generation FPDS which has the same size as outline 146, or is smaller than outline 146—this is a key advantage of the present invention relative to the prior art: a single FPDS testing system can test multiple FPDS generations with no need for any system hardware modifications. As long as the system is designed to handle sufficiently large pallets, a number of FPDS generations can be accommodated with a single FPDS testing system. For example, a "Gen-9" tool is fully capable of testing "Gen-8" or "Gen-7" FPDSs with no tool downtime for conversion. Any changes to the e-beam testing procedure required when converting between FPDS generations can be done entirely within system control 1203 which drives the test signals to/from pallet 100—these changes would typically involve software modifications only. Often, even within a given FPDS generation, the layout of test pads and/or alignment marks on the FPDS can change—with the present invention, only modifications to the pallet top would be required (to reconfigure the positions of contactors and/or alignment mark detectors) which can be done off-line from system operation, and thus would have no effect on either system throughput or system availability (i.e., there is no downtime for changing the probe frame).

Dimensions 134 and 136 show the distances along the X-axis (horizontal in FIG. 4) from outline 146 to the sides of pallet 100. Dimensions 138 and 140 are the distances along the Y-axis (vertical in FIG. 4) from outline 146 to the sides of pallet 100. The openings for each FPD on FPDS 120 have dimensions 142 (along the X-axis) and 144 (along the Y-axis). Here, all the FPDs on the FPDS 120 are assumed to have the same size, however this is not mandatory for the pallet concept. Cross-members 114 and 116 extend across areas of FPDS 120 between the individual FPDs, and may contain contactors for electrical connection to test pads on FPDS 120 (see FIG. 17). Cross-sections A-A and F-F through pallet 100 are also illustrated in FIG. 4.

In the side view of pallet 100 shown in FIG. 5, pallet height 139 is exaggerated relative to the (horizontal) X-axis dimension. The heights of pallet top 110 and pallet bottom 112 stack up to generate pallet height 139.

FIG. 6 is an end view of pallet 100, again showing the stacking of pallet top 110 and pallet bottom 112. Data receiver 442 and data transmitter 440 are visible, as well as cross-sections B-B, C-C and D-D.

FIG. 7 is a schematic bottom view of pallet 100 in FIG. 3. At least three holes 164 (seven shown) penetrate pallet bottom 112 to permit passage of long pins 204 (see FIG. 28)—note that holes 164 must be outside outline 146 in order to prevent long pins 204 from striking FPDS 120. A multiplicity of holes 166 also penetrate pallet bottom 112 to permit passage of short pins 206 (see FIG. 29)—note that holes 166 must be within outline 146 to ensure that short pins 206 will lift FPDS 120. Holes 164 are at distances 150 and 152 from the four corners of pallet bottom 112 and three other holes 164 are spaced midway along three sides of pallet bottom 112. It is not necessary to place a hole 164 in the left side of pallet bottom 112 since there is no corresponding long pin 204 on the left side of the pin plate (see FIG. 18). The exact number and placement of holes 164 (and the corresponding pins 204 in pin plate 202) is not critical to the pallet disassembly operation (see FIGS. 27-30)—it is only important to have sufficient holes 164 (and long pins 204) to lift pallet top 110 without slippage or instability without interfering with the ability to insert a robot end effector between pallet top 110 and pallet bottom 112 during FPDS removal/insertion (see FIGS. 31-33). The X-Y spacings 160 and 162, respectively, of holes 166 must be close enough to ensure minimal sagging of an FPDS between pins 206 as explained in FIG. 30. Cross-section E-E is also illustrated in FIG. 7.

FIG. 8 is a schematic view through section A-A of pallet 100 in FIG. 4 with dimensions perpendicular to FPDS 120 exaggerated. Pallet top 110 has a downward-facing lip which enables pallet top 110 to clamp FPDS 120 (shown exaggerated in thickness) down against the upper center surface of pallet bottom 112. For proper operation of the alignment procedure shown in FIGS. 39A-39B, it is preferred that the upper surface 129 of pallet bottom 112 (which comes into contact with the undersurface of FPDS 120) have sufficient friction to prevent slippage between FPDS 120 and pallet bottom 112 when pallet top 110 is being moved relative to pallet bottom 112. Pallet top 110 fits loosely over pallet bottom 112 to allow for small X-Y-Yaw displacements of pallet top 110 relative to pallet bottom 112 in order to align contactors 425 in pallet top 110 with test pads 426 (see FIG. 17) on FPDS 120 (see FIGS. 39A-39B). Openings 111 contain internal drive electronics and wiring necessary for electrical biasing of FPDS 120 (see FIGS. 13-16). Cross-members 116 may also contain wiring (not shown) allowing for additional contactors along the Y-axis edges of the FPDs on the FPDS.

FIG. 9 is a schematic view through section E-E of pallet 100 in FIG. 7, with dimensions perpendicular to FPDS 120 exaggerated. Openings 111 contain internal drive electronics and wiring necessary for electrical biasing of the FPDS 120 (see FIGS. 13-16). Openings 113 in cross-members 114 contain wiring (not shown) connecting to contactors 425 (see FIG. 16). Holes 164 and 166 penetrate pallet bottom 112 to permit passage of pins 204 and 206, respectively, on pin plate 202 (see FIGS. 28-29).

Internal Structure and Electronics of the Pallet

Figure 10:
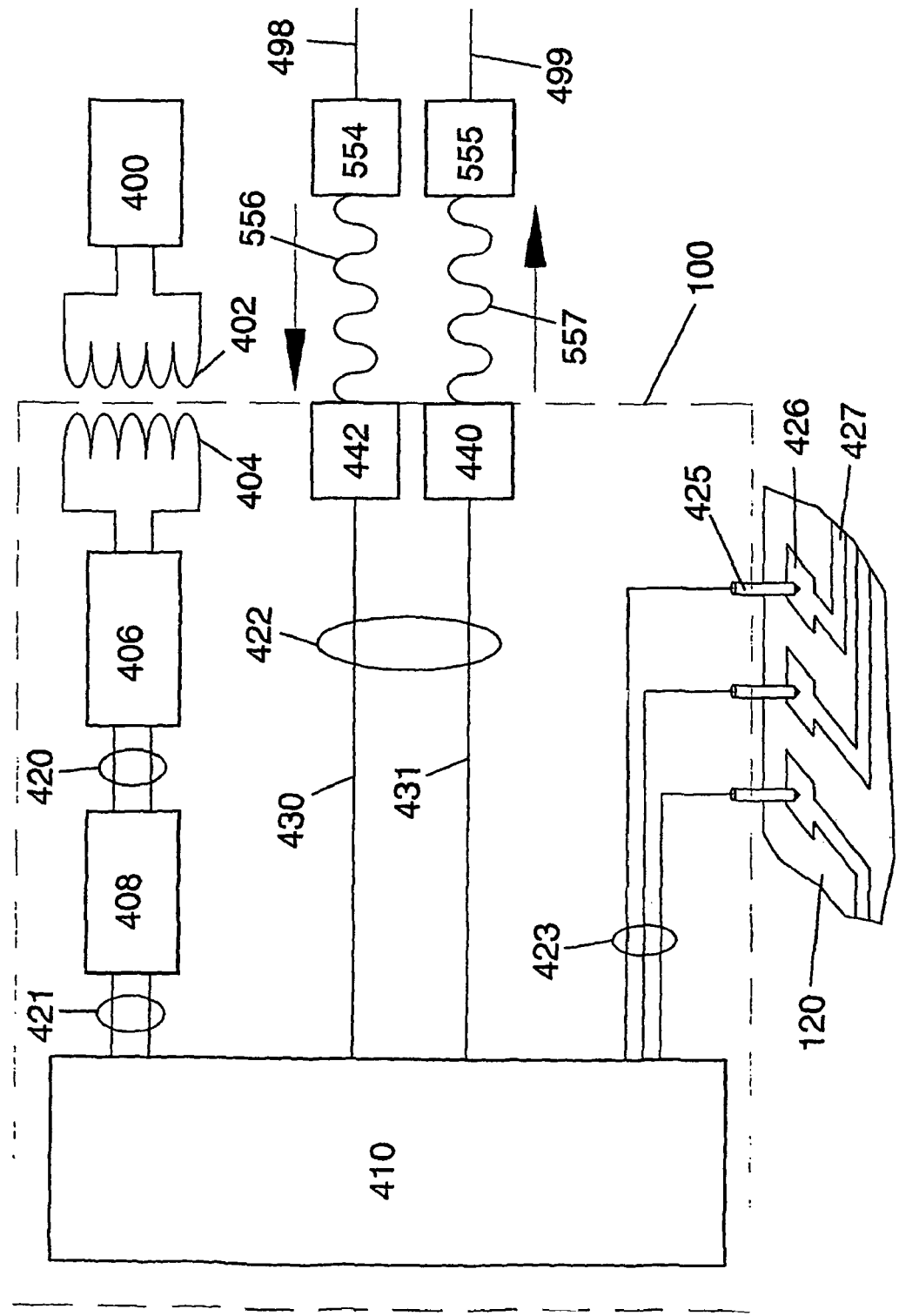
FIG. 10 is a schematic diagram of the circuits within pallet 100, external communication circuits to/from pallet 100, and an inductive power transfer system.

FIG. 10 is a schematic diagram of the electronics within pallet 100, data circuits to/from pallet 100, and an inductive power transfer system. Pallet 100 contains internal drive electronics 410 which provides control voltages through control lines 423 to contactors 425. These control voltages bias the source and gate connections to the TFTs on the FPDS as is familiar to those skilled in the art of FPDS testing—see U.S. patent application Ser. No. 11/225,376 filed Sep. 12, 2005 incorporated by reference herein.

Contactors 425, which typically can be "POGO" pins or some other type of spring-loaded contactor, make contact with test pads 426 on the surface of FPDS 120. Test pads 426 are connected to shorting bars (not shown) on FPDS 120 by traces 427. Control of internal drive electronics 410 is effected through a first data link comprising data line 498 from system control 1203 (see FIG. 2), data transmitter 554, signal beam 556, data receiver 442, and input signal line 430. Internal drive electronics 410 communicates with system control 1203 (see FIG. 2) by means of a second data link comprising output data line 431, data transmitter 440, signal beam 557, data receiver 555, and data line 499 to system control 1203 (see FIG. 2). Internal data bus 422 includes signal lines 430 and 431.

Figure 65:
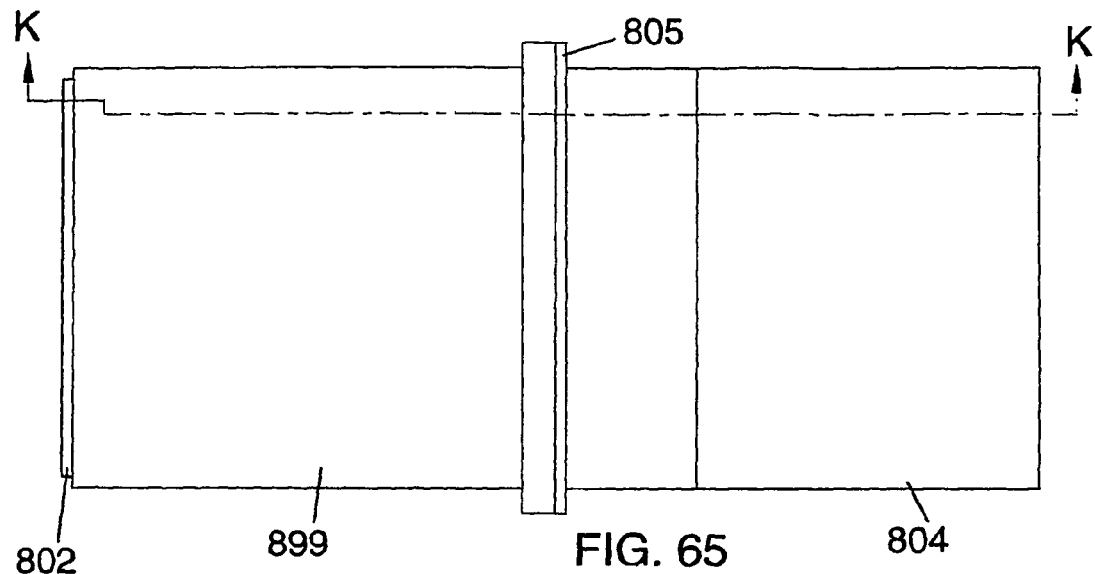
FIG. 65 is a schematic top view of a second embodiment of an FPDS testing system.
Figure 66:
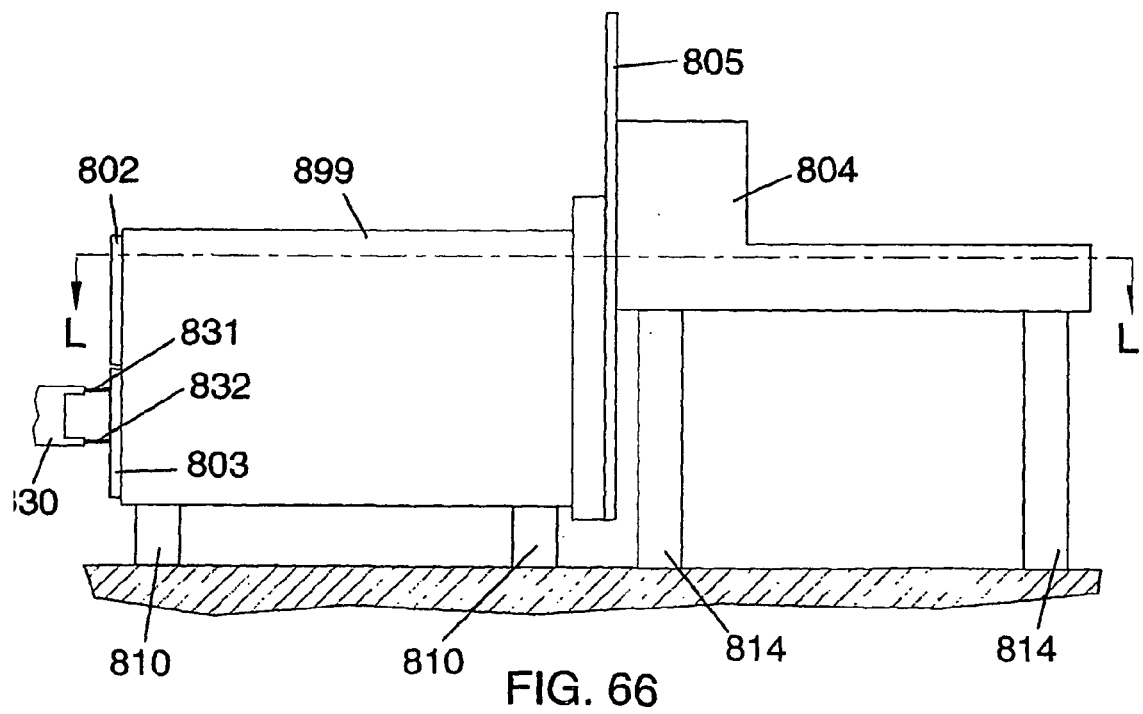
FIG. 66 is a schematic side view of the FPDS testing system in FIG. 65.

Internal drive electronics 410 are powered through an inductive power transfer system (IPTS) wherein the components outside pallet 100 comprise ac power supply 400 and primary transformer coil 402 which may be mounted within dual loadlock 575 and/or within pallet elevator 629 (first embodiment—see FIGS. 41-44) or within dual loadlock 899 (second embodiment—see FIGS. 65-66). The components of the IPTS within pallet 100 comprise secondary transformer coil 404, battery charger 406, wires 420 to charge battery 408, and pallet dc power lines 421 to internal drive electronics 410. Internal drive electronics 410 are powered by battery 408 at all times, but battery 408 is recharged only when pallet 100 is out of process chamber 522 (FIGS. 41-42), or out of process chamber 804 (FIGS. 65-66). It is desirable to maximize the magnetic flux coupling efficiency between primary coil 402 and secondary coil 404 to minimize the amount of stray magnetic flux which can have a negative effect on the operation of columns 1211 in FIG. 2. Methods of maximizing the flux coupling are well known to those skilled in the art. One such method is the use of a first core inside coil 402 with two pole faces positioned opposite two pole faces in a second core inside coil 404. Magnetic shielding can be placed around coils 402 and 404 to reduce stray magnetic field generation further.

Figure 11:
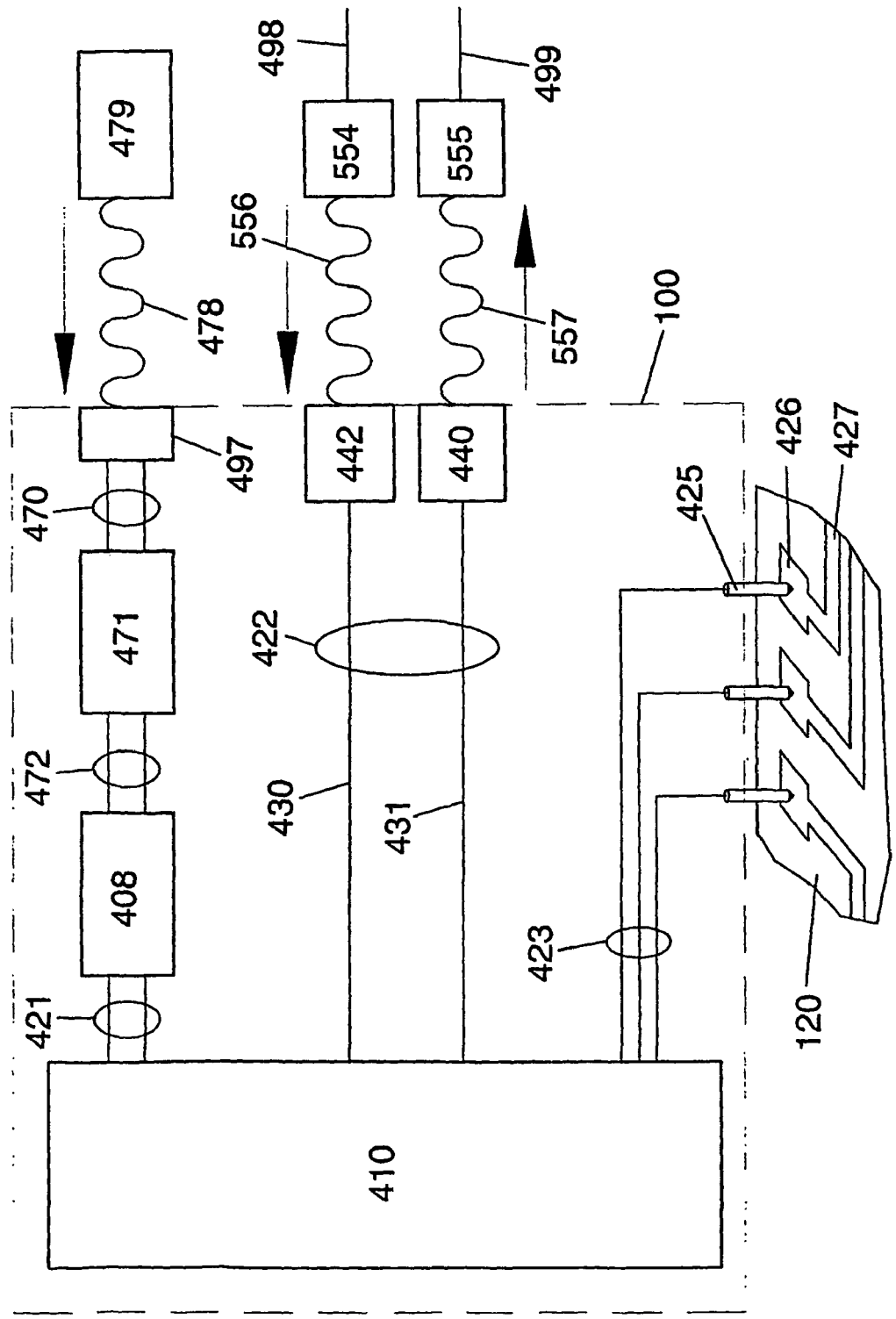
FIG. 11 is a schematic diagram of the circuits within pallet 100, external communication circuits to/from pallet 100, and a radiative power transfer system.

FIG. 11 is a schematic diagram of the electronics within pallet 100, data circuits to/from pallet 100, and a radiative power transfer system. All data links and connections are the same as for FIG. 10. FIG. 11 differs from FIG. 10 only in the use of a radiative power transfer system (RPTS) to charge battery 408. Light transmitter 479 radiates a strong light beam 478 to photocell 497 mounted on the exterior of pallet 100. Photocell 497 generates a dc current which is fed through wires 470 to battery charger 471, which charges battery 408 through wires 472. The main advantage of an RPTS over the IPTS in FIG. 10 is the lack of stray magnetic field generation which could allow the RPTS to operate within process chamber 522 (FIGS. 41-42) or process chamber 804 (FIGS. 65-66). The main disadvantage of the RPTS is potentially less efficient power transfer due to the relatively low efficiency of photocells relative to transformers.

Figure 12:
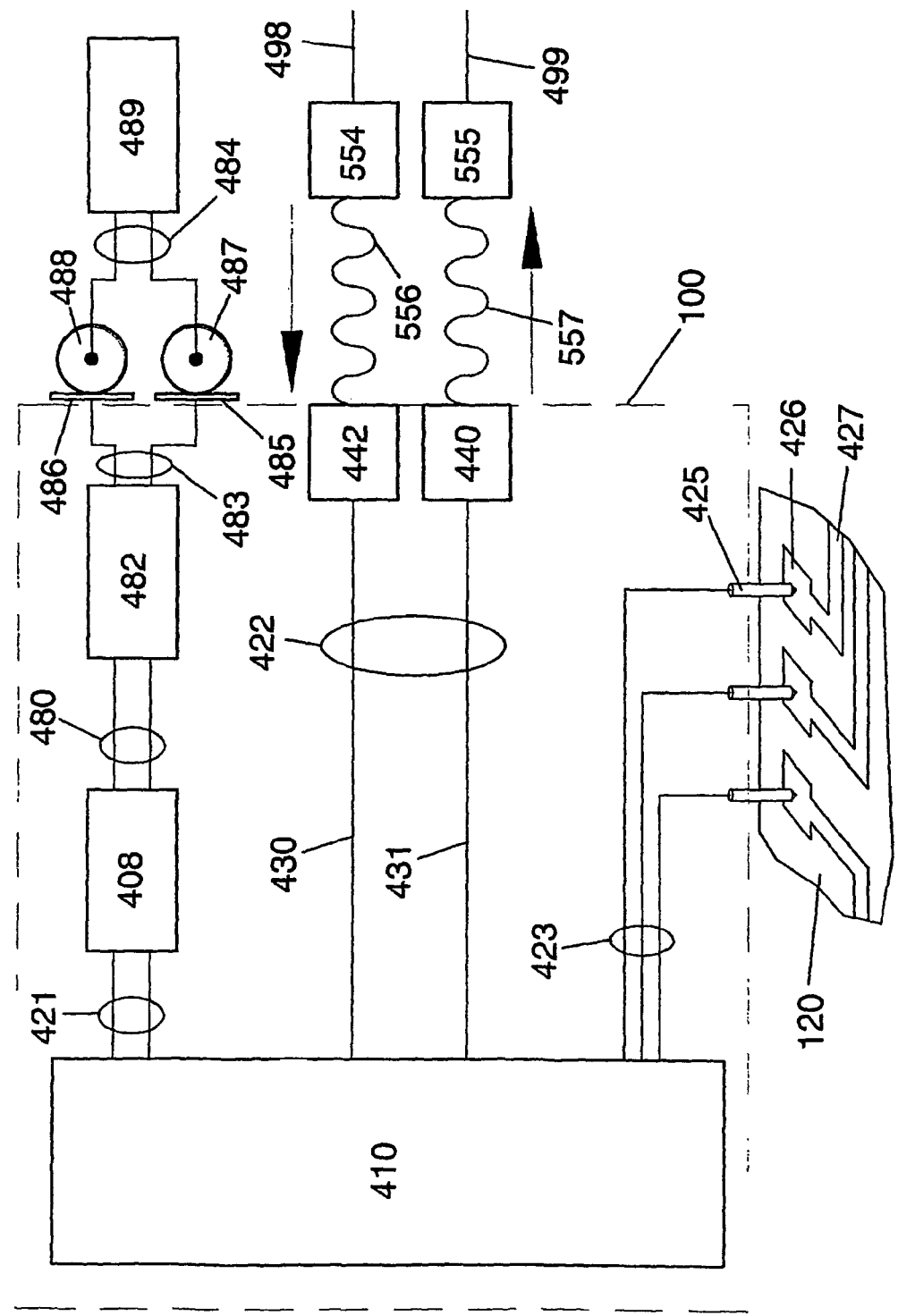
FIG. 12 is a schematic diagram of the circuits within pallet 100, external communication circuits to/from pallet 100, and a dual roller power transfer system.

FIG. 12 is a schematic diagram of the electronics within pallet 100, data circuits to/from pallet 100, and a dual roller power transfer system. All data links and connections are the same as for FIGS. 10 and 11. FIG. 12 differs from FIGS. 10 and 11 only in the use of a dual roller power transfer system (DRPTS) to charge battery 408. Power supply 489 supplies an ac or a dc voltage difference through wires 484 to rollers 487 and 488 which roll along two contact strips 485 and 486, respectively, on the exterior of pallet 100. The voltage difference picked up between power strips 485 and 486 is fed through wires 483 to battery charger 482, which charges battery 408 through wires 480. The main advantage of a DRPTS over the IPTS in FIG. 10 is the lack of stray magnetic field generation which could allow the RPTS to operate within the process chamber. The main disadvantage of the DRPTS is the need for physical contact to pallet 100 which may involve reliability issues, in particular relating to the need to keep the contact strips 485 and 486 and rollers 487 and 488 clean enough to provide good electrical contact. A variant of the configuration shown in FIG. 12 would place rollers 487 and 488 on pallet 100 and contact strips 485 and 486 outside pallet 100.

FIG. 13 is a schematic view through section B-B in FIG. 6 showing the inductive power transfer system from FIG. 10. External ac power supply 400 drives primary transformer coil 402. The magnetic field generated by coil 402 passes through secondary coil 404, thereby generating an ac voltage which is conducted to battery charger 406 which rectifies the ac voltage to a dc voltage used to charge battery 408 through connections 420. Battery 408 powers internal drive electronics 410 by means of power circuit 421. It is important that power connections 421 be coaxial cables or twisted pairs to avoid the generation of external magnetic fields during FPDS testing. Primary coil 400 can be mounted in pallet elevator 629 and/or dual loadlock 575 (first embodiment—FIGS. 41-42) or dual loadlock 899 (second embodiment—FIGS. 65-66) and would be used only when the pallet is not in either process chamber 522 (FIGS. 41-42) or process chamber 804 (FIGS. 65-66)—this avoids possible problems with the ac magnetic field between coils 402 and 404 potentially deflecting the electron beams used for FPDS testing. A preferred embodiment would include two iron cores, one within coil 402 and the other core within coil 404 with opposing pole faces to minimize field leakage. This method is familiar to those skilled in the art. Alternative methods of transferring power to the pallet are possible, as described in FIGS. 11 and 12. The key requirement is that all transfer of power to the pallet must cause no negative effects on the FPDS testing process—this requires a battery on-board the pallet to power the internal drive electronics 410 between charging cycles. Since the pallet is exposed to vacuums in the loadlock and process chamber in the range of $\sim 10^{-6}$ torr, it is necessary that battery 408 and internal drive electronics 410 be vacuum compatible (i.e., demonstrate minimal outgassing) and also that battery 408 not explode or be damaged due to internal pressure when in the vacuum. The X-Y dimensions 130 and 132 (FIG. 4) of pallet 100 must be larger than the X-Y dimensions of FPDS 100 in order to accommodate battery charger 406, battery 408, and internal drive electronics 410, which are housed in opening 111 around the perimeter of pallet top 110 as shown. To simplify the figure, the internal data bus and connections between internal drive electronics 410 and pallet 100 are not shown in FIGS. 13 and 14 (see FIGS. 15 and 16).

FIG. 14 is a schematic view through section F-F in FIG. 4 of pallet 100 showing the internal power system of pallet 100 in FIG. 10. All of the electronics shown in FIGS. 13-16 is in pallet top 110.

FIG. 15 is a schematic view through section C-C showing the internal data bus of pallet 100 in FIG. 6. Data receiver 442 is a sensor for whatever type of radiation is used for beam 556 (FIG. 10). Similarly, data transmitter 440 is a sensor for whatever type of radiation is used for beam 557 (FIG. 10). Both data receiver 442 and data transmitter 440 are used to communicate between system control 1203 (FIG. 2) and pallet 100 as illustrated in FIGS. 2 and 10-12. Communication between data receiver 442, data transmitter 440 and internal drive electronics 410 is by way of internal data bus 422, contained in channel 111, which must not generate any external magnetic fields that could affect the electron beams used for FPDS testing. In addition, internal data bus 422 must be immune to external RF interference.

Figure 16:
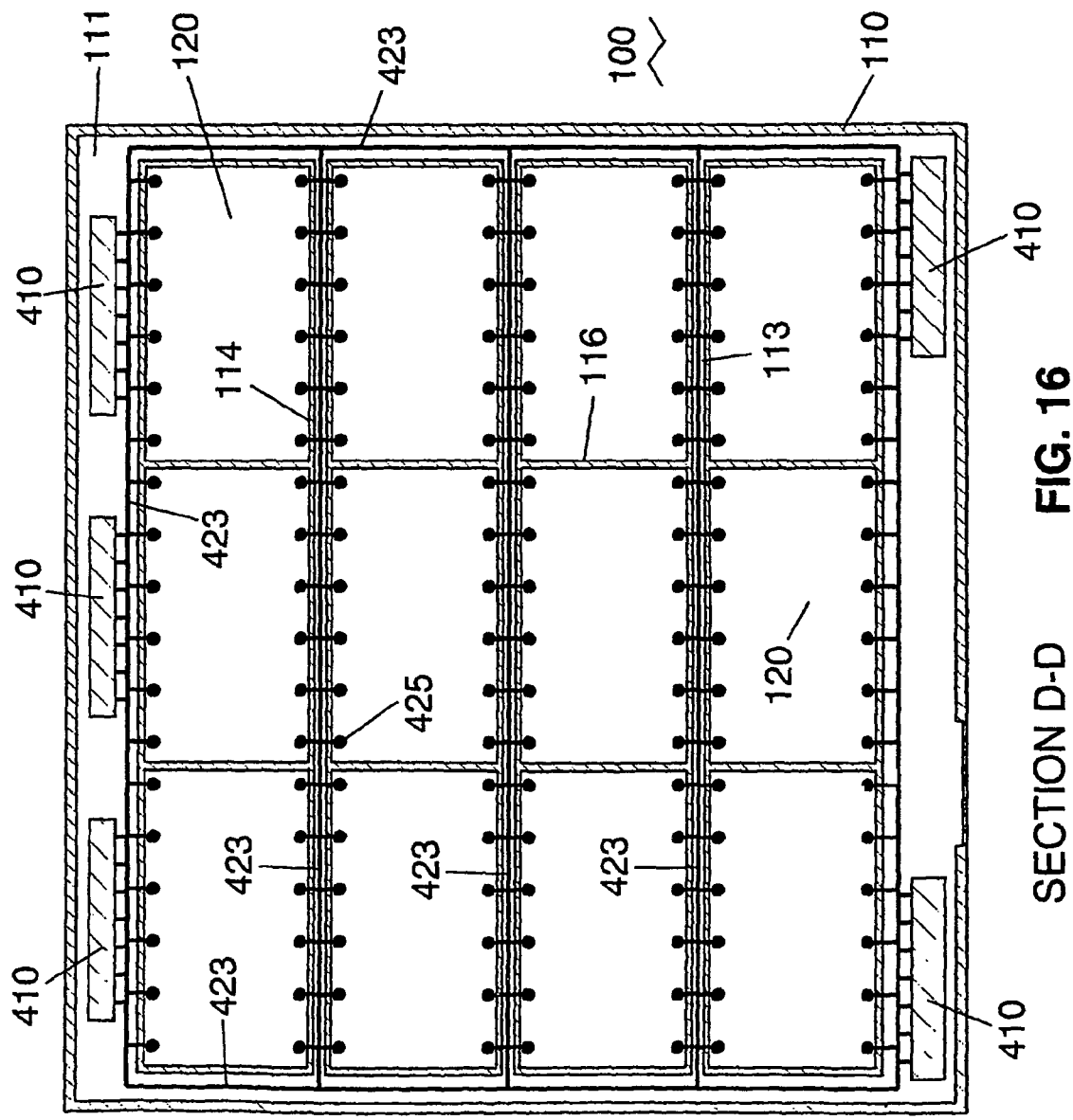
FIG. 16 is a schematic view through section D-D showing the connections between the internal drive electronics and the FPD test pads on the FPDS within pallet 100 in FIG. 6.

FIG. 16 is a schematic view through section D-D showing connections 423 between internal drive electronics 410 and contactors 425 within pallet 100 in FIG. 6. For clarity, contactors 425 are shown outside cross-members 114—in reality, contactors 425 would be inside cross-members 114 (see FIG. 17) and inside the outer perimeter of pallet top 110. Additional contactors (not shown) could also be within cross-members 116. Pallet 100 must be fabricated to provide adequate stiffness to assure that all contactors 425 make good electrical contact with test pads 426 on FPDS 120—if POGO pins are used for contactors 425, each pin will exert an upward force on pallet top 110 of at least a few g (force), adding up to sizeable total upward forces in the case of large numbers of POGO pins.

Figure 17:
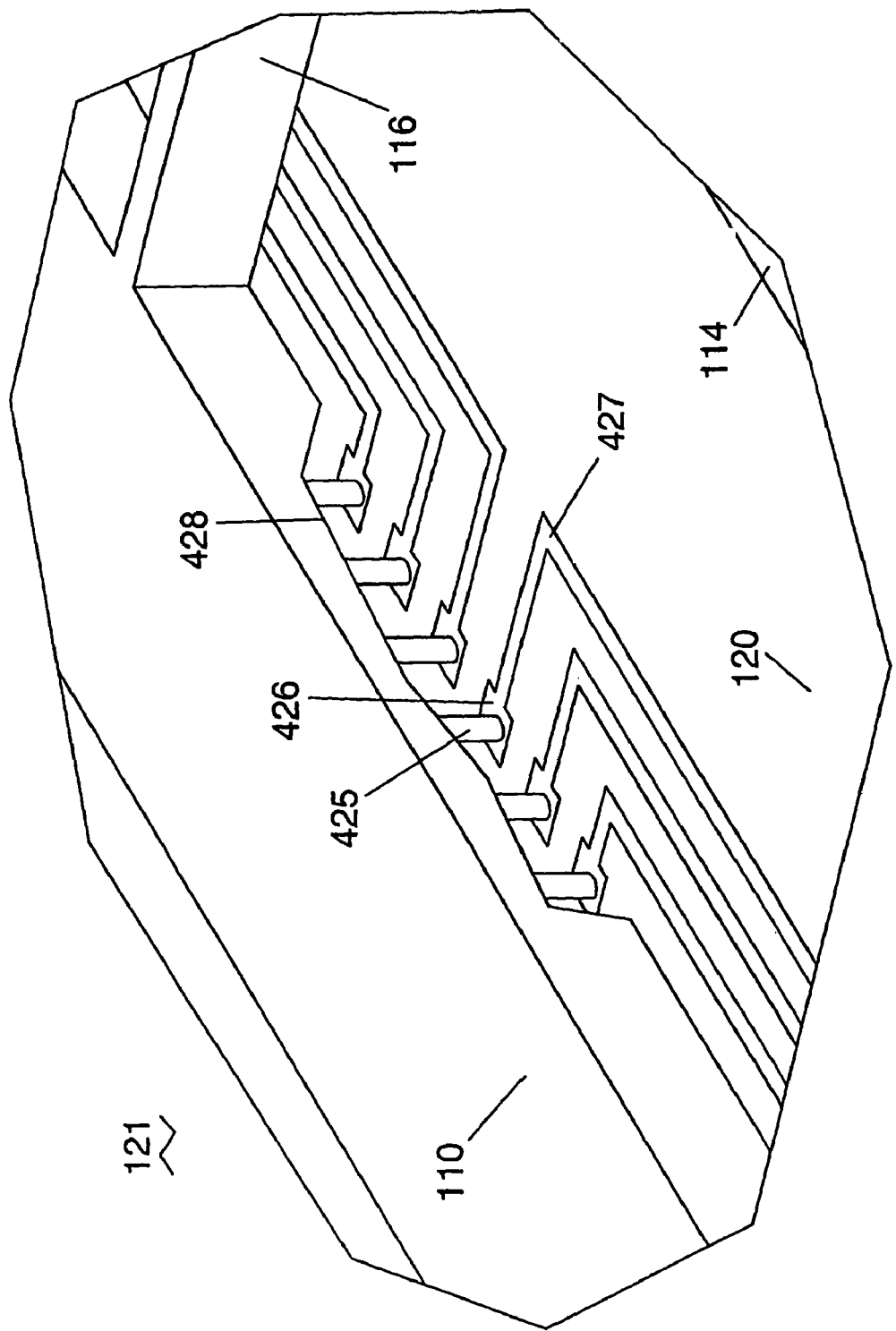
FIG. 17 is schematic detail view 121 of contactors 425 connecting to FPD test pads 426 on FPDS 120 within pallet 100 in FIG. 3.

FIG. 17 is schematic detail view 121 with cutaway 428 showing contactors 425 within pallet 100 connecting to test pads 426 on FPDS 120 in FIG. 3. As shown in FIGS. 10-12 and 16, the voltages on contactors 425 are driven by internal drive electronics 410 within pallet top 110. Contactors 425 are spring-loaded downwards against test pads 426, typically with forces of at least a few g. Test pads 426 connect to traces 427, which it turn connect to shorting bars (not shown) on FPDS 120 as explained in FIG. 1. The design of pallet 100 implements a one-to-one mapping between contactors 425 in pallet top 110 and test pads 426 on FPDS 120. Precise alignment of contactors 425 with test pads 426 is desirable in order to preserve this one-to-one mapping so that all test pads 426 receive the necessary bias voltages—the procedure illustrated in FIGS. 34-39B implements a procedure to accomplish contactor-to-test pad alignment across the entire surface of FPDS 120 simultaneously.

Pin Plate and Robot End Effector Design

FIG. 18 is a schematic isometric view of pallet 100 and pin plate 202, illustrating the insertion direction 208 for pin plate 202 to enter pallet 100. Pallet 100 is comprised of pallet top 110 and pallet bottom 112, with provision for FPDS 120 to be clamped between them. As is shown in detail in FIGS. 27-30, long pins 204 fit through holes 164 in pallet bottom 112 (see FIG. 7) to lift pallet top 110 off FPDS 120 and off pallet bottom 112. Similarly, short pins 206 fit through holes 166 in pallet bottom 112 (see FIG. 7) to lift FPDS 120 off pallet bottom 112.

FIGS. 19-21 are schematic top, side and end views of pallet 100 and pin plate 202 in FIG. 18, respectively. FIG. 19 has a partial cutaway to show pin plate 202 beneath pallet 100. In FIGS. 20 and 21, the vertical scales (perpendicular to the plane of pallet 100) of both pallet 100 and pin plate 202 are exaggerated for clarity. The locations of pins 204 and 206 must match the locations of holes 164 and 166 (see FIG. 7), respectively. The diameters of pins 204 and 206 should be large enough to prevent bending or buckling when supporting the weights of pallet top 110 and FPDS 120, respectively (see FIG. 30). The diameters of holes 164 and 166 (see FIG. 7) should allow some clearance with pins 204 and 206, respectively, to enable X-Y-Yaw alignment of pallet top 110 with pallet bottom 112, as shown in FIGS. 39A-39B. The lengths 288 of pins 206 must be sufficient to raise FPDS 120 far enough above pallet bottom 112 to allow room for robot end effector 243 (see FIG. 31) to fit between FPDS 120 and pallet bottom 112. The lengths 284 of pins 204 must be enough longer than the lengths 288 of pins 206 to allow FPDS 120 to be lifted off pins 206 by robot end effector 243 (see FIG. 32).

Figure 22:
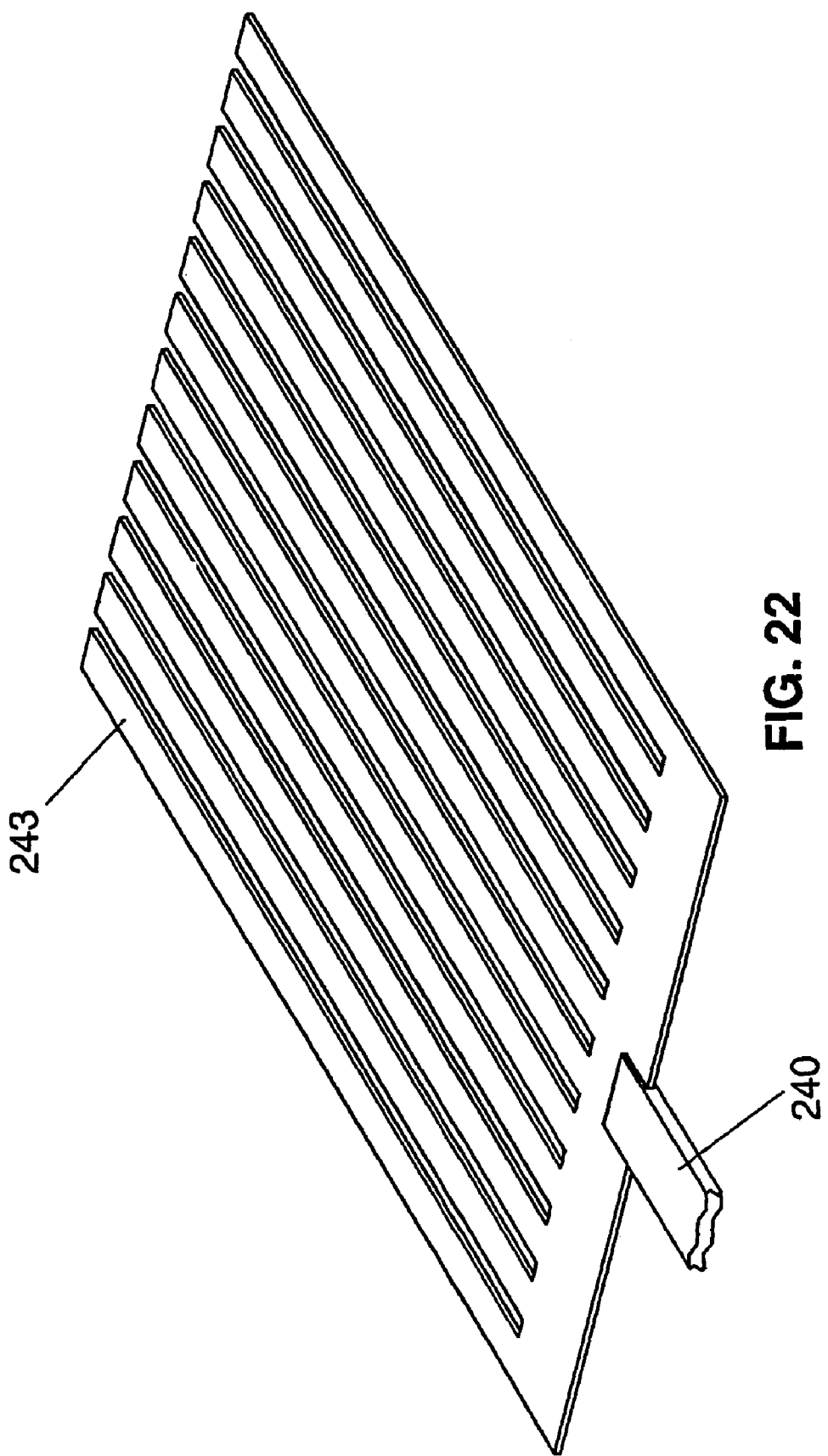
FIG. 22 is a schematic isometric view of a robot end effector.
Figure 67:
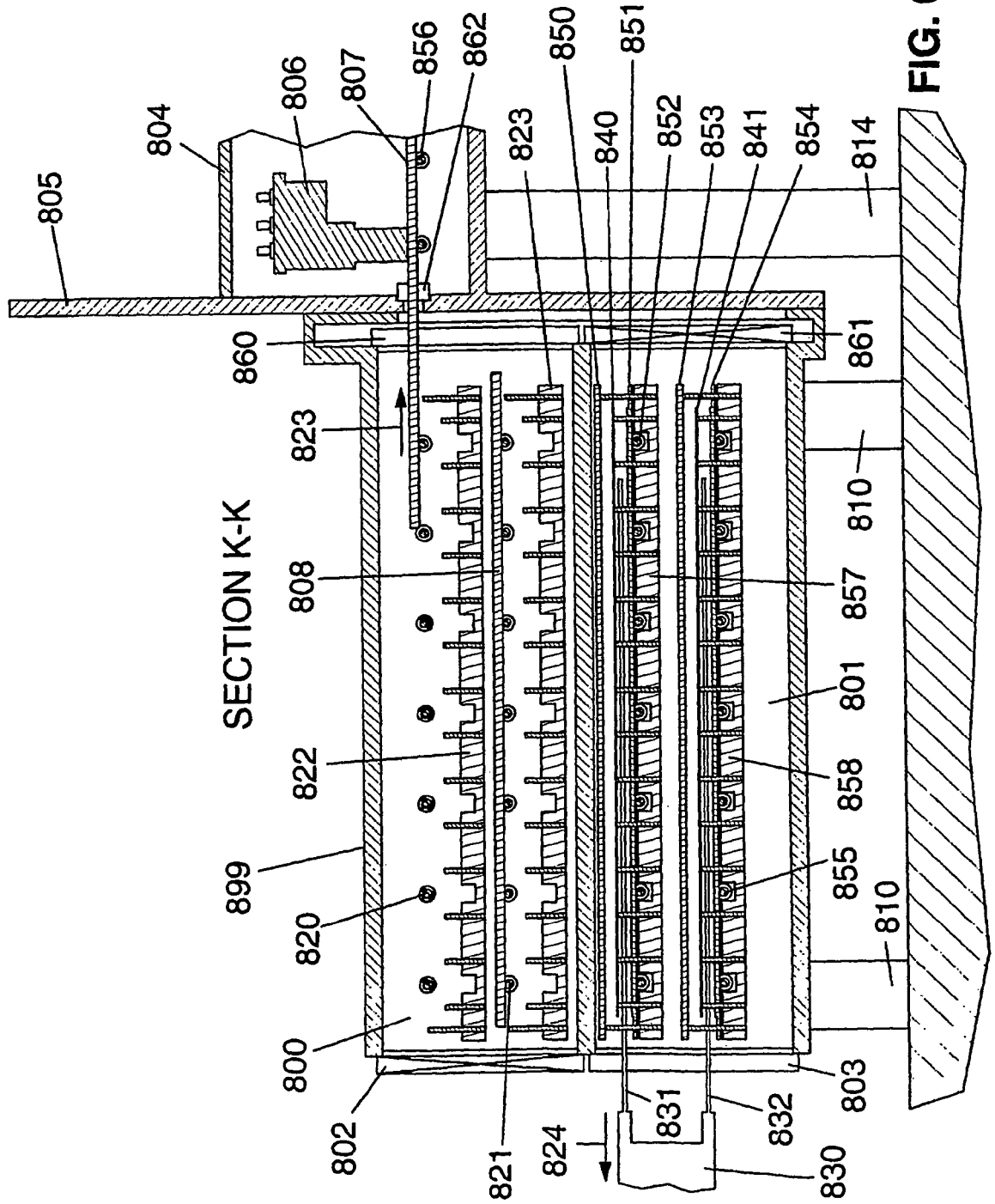
FIG. 67 is a schematic view through section K-K of the FPDS testing system in FIG. 65 showing an FPDS in pallet 807 from upper loadlock 800 being tested while a two-blade robot is entering lower loadlock 800.
Figure 68:
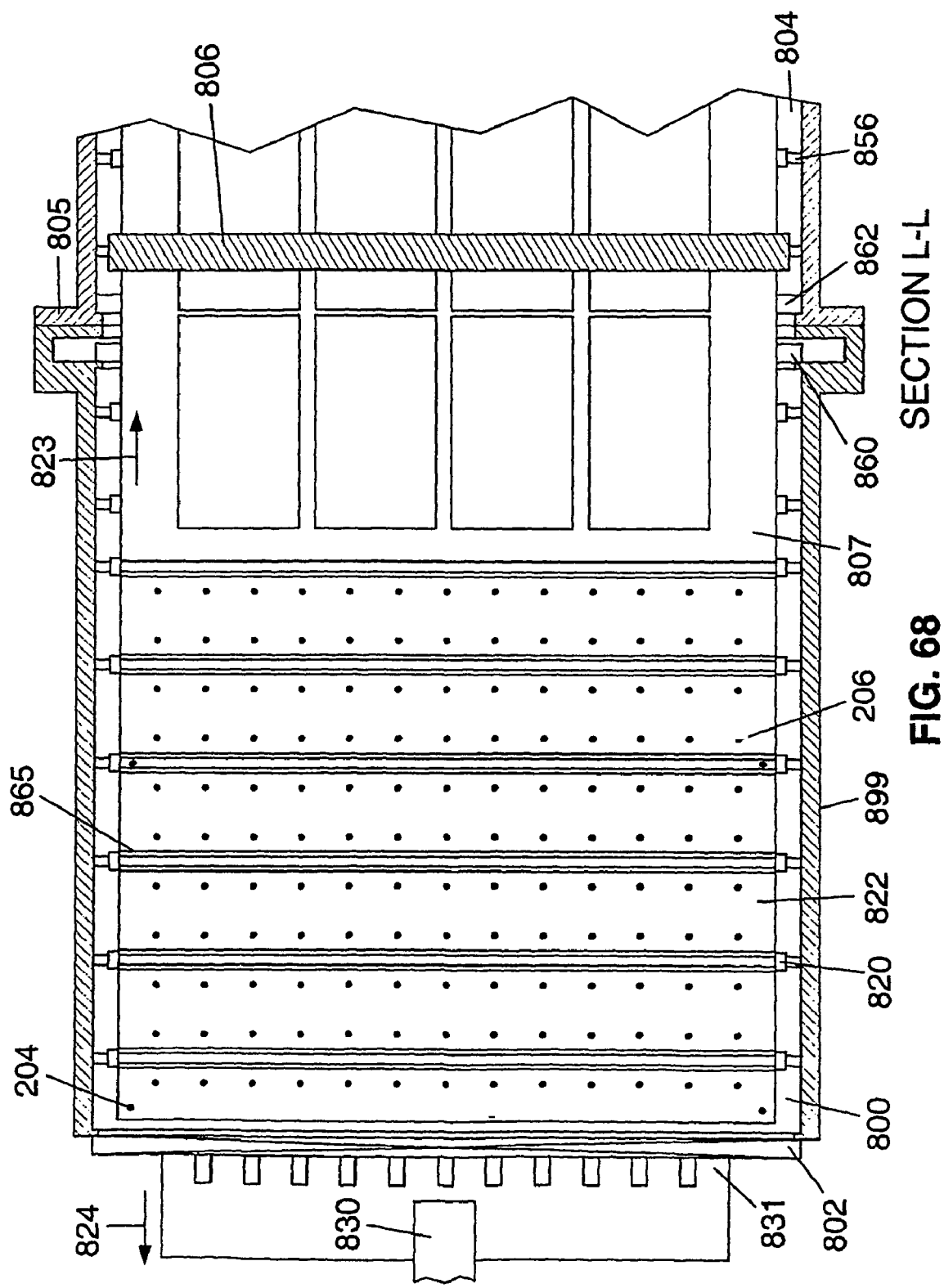
FIG. 68 is a schematic view through section L-L of the FPDS testing system in FIG. 66.
Figure 69:
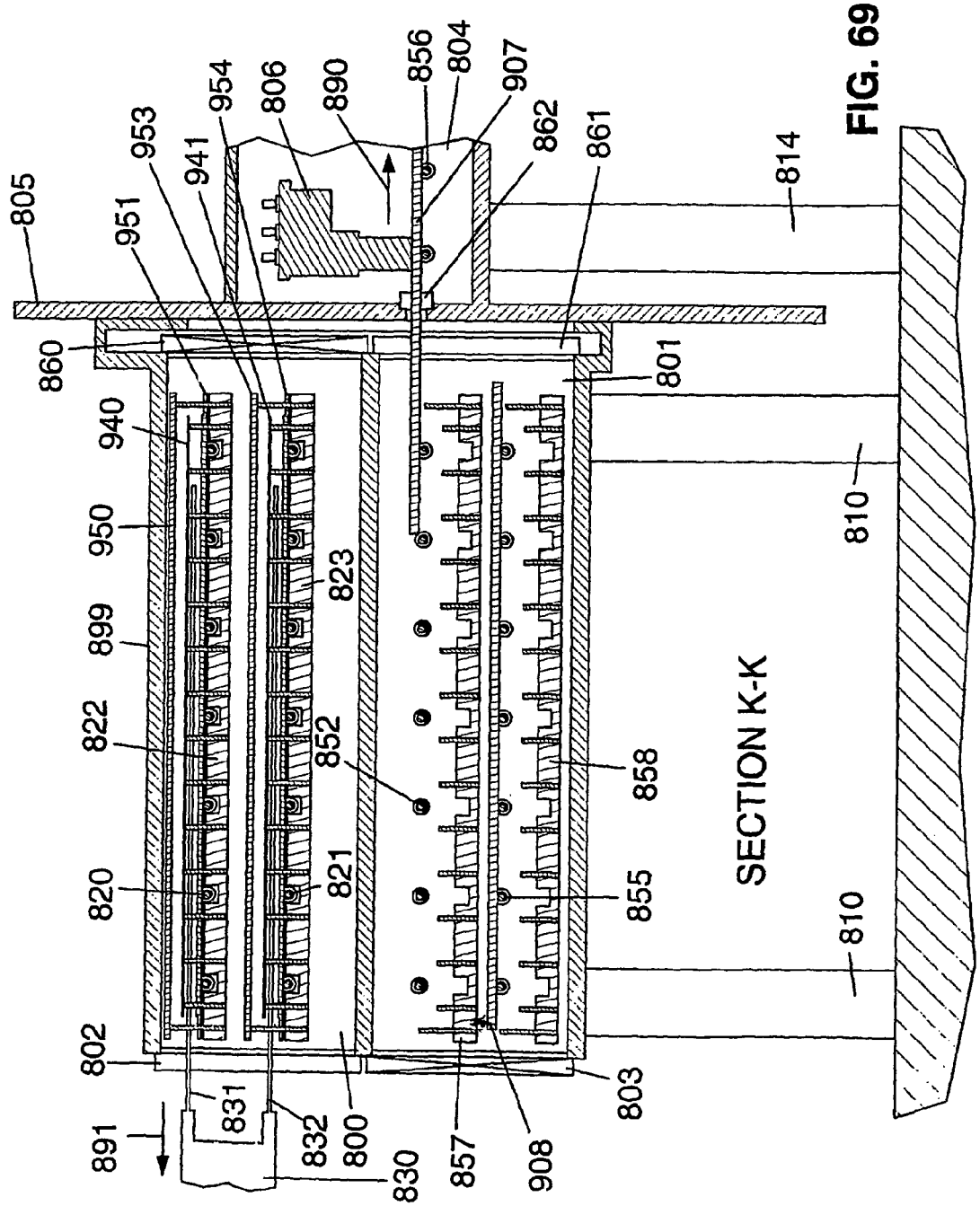
FIG. 69 is a schematic view through section K-K of the FPDS testing system in FIG. 65 showing an FPDS in pallet 907 from lower loadlock 801 being tested while the two-blade robot is entering upper loadlock 800.

FIG. 22 is a schematic isometric view of a robot end effector 243 attached to end effector mount 240. End effector 243 is equivalent to end effectors 731-733 (FIGS. 61-63) and end effectors 831-832 (FIGS. 67-69). End effector mount 240 is equivalent to end effector mounts 730 (FIGS. 61-63) and 830 (FIGS. 67-69).

FIG. 23 is a schematic top view of robot end effector 243 and end effector mount 240 in FIG. 22. End effector 243 is comprised of end effector bars 242 and end effector bars connector 321. Dimension 301 is preferably greater than the length of an FPDS to ensure that the FPDS is fully supported during FPDS transport. The purpose of slots 306 is to allow end effector 243 to fit between short pins 204 on pin plate 202 (see FIG. 19). The widths 305 of slots 306 between end effector bars 242 must be larger that the diameters of short pins 206 but not so large that an FPDS can sag excessively between end effector bars 242. The sum of the widths 304 and 305 must equal the Y-axis spacing of short pins 206 (which must match the Y-axis spacing 162 of holes 166—see FIG. 7).

FIG. 24 is a schematic side view of robot end effector 243 and end effector mount 240 in FIG. 22. The thickness 306 of end effector 243 (which is the thickness of end effector bars 242) must be adequate to prevent excessive sagging of end effector bars 242 under their own weight plus the weight of an FPDS being transported. "Excessive sagging" here is any amount of sagging which may result in damage to the FPDS being transported or which would interfere with the FPDS exchange process (see FIGS. 61-63 and 67-69).

FIG. 25 is a schematic end view of robot end effector bars 242 and end effector mount 240 in FIG. 22. Dimension 302 is preferably as wide as possible to give maximum support to the FPDS being transported while still fitting between long pins 204 along the two long sides of pin plate 202 (see FIG. 19).

Detailed Pallet Disassembly Procedure

FIGS. 26-33 show various views of pin plate 202 disassembling a pallet. This process occurs within pallet elevator 629 in the first embodiment of the present invention shown in FIGS. 41 and 42, and within dual loadlock 899 in the second embodiment shown in FIGS. 65 and 66. Note that pin plate 202 is shown simplified—the trenches to allow clearance for the bi-directional motor-driven rollers are omitted for clarity, as are the rollers themselves.

Figure 26:
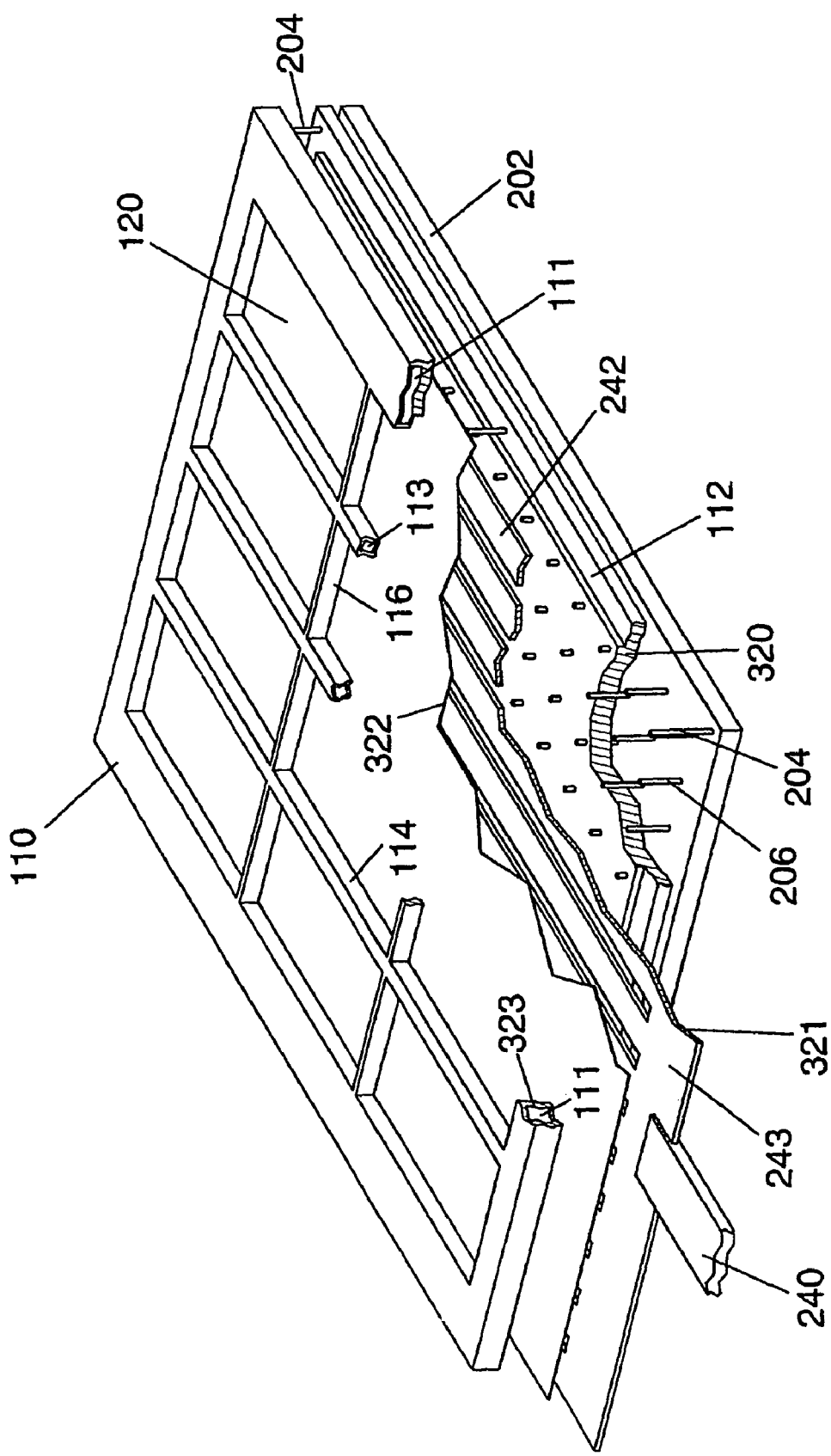
FIG. 26 is a schematic isometric cutaway view of pallet 100 and pin plate 202 in FIG. 18 showing pin plate 202 disassembling pallet 100.

FIG. 26 is a schematic isometric cutaway view of pin plate 202 disassembling a pallet (including pallet top 110 and pallet bottom 112, with provision for FPDS 120 to be clamped between them). Cutaway 323 of pallet top 110 reveals internal spaces 111 and 113 for internal drive electronics 410 and wiring (not shown—see FIGS. 13-16). Cutaway 322 of FPDS 120 reveals robot end effector 243 (attached to end effector mount 240) supporting FPDS 120. Cutaway 321 of robot end effector 243 (comprised of end effector bars 242 and end effector bars connector 321) reveals pallet bottom 112 as well as short pins 206 and long pins 204 on pin plate 202 protruding through holes 166 and 164, respectively (see FIG. 7), in pallet bottom 112. At the upper right, a long pin 204 can be seen supporting the edge of pallet top 110. Cutaway 320 in pallet bottom 112 reveals pin plate 202 underneath, showing a few short pins 206 and a long pin 204 at the corner of pin plate 202 at the center front in FIG. 26.

FIGS. 27-30 show the sequence of steps by which pin plate 202 disassembles pallet 100, enabling already-tested FPDS 120 to be removed.

FIG. 27 is a schematic view through section J-J of pallet 100 and pin plate 202 in FIG. 19. Long pins 204 in pin plate 202 are aligned coaxially with, and ready for insertion into, holes 164 in pallet bottom 112. Pin plate 202 starts moving upwards (arrow 210) to begin the pallet 100 disassembly procedure.

FIG. 28 is a schematic view through section J-J of pallet 100 and pin plate 202 in FIG. 19. The pin plate actuator (not shown) has raised pin plate 202 to insert long pins 204 into holes 164. The upper ends of long pins 204 are now making contact with undersurface 207 of pallet top 110. Pallet 100 is still assembled at this point. Pin plate 202 continues moving upwards (arrow 212).

FIG. 29 is a schematic view through section J-J of pallet 100 and pin plate 202 in FIG. 19. The pin plate actuator (not shown) has raised pin plate 202 an additional distance upwards from FIG. 28, lifting pallet top 110 off FPDS 120. The upwards motion of pin plate 202 has also inserted short pins 206 into holes 166. The upper ends of short pins 206 are now making contact with undersurface 216 of FPDS 120. Pin plate 202 continues moving upwards (arrow 214).

FIG. 30 is a schematic view through section J-J of pallet 100 and pin plate 202 in FIG. 19. The pin plate actuator (not shown) has raised pin plate 202 an additional distance upwards from FIG. 29, lifting pallet top 110 farther away from pallet bottom 112—note that pallet top 110 is the same distance above FPDS 120 as in FIG. 29. The upwards motion of pin plate 202 has also lifted FPDS 120 off pallet bottom 112. Upwards motion of pin plate 202 ceases at this point.

Figure 33:
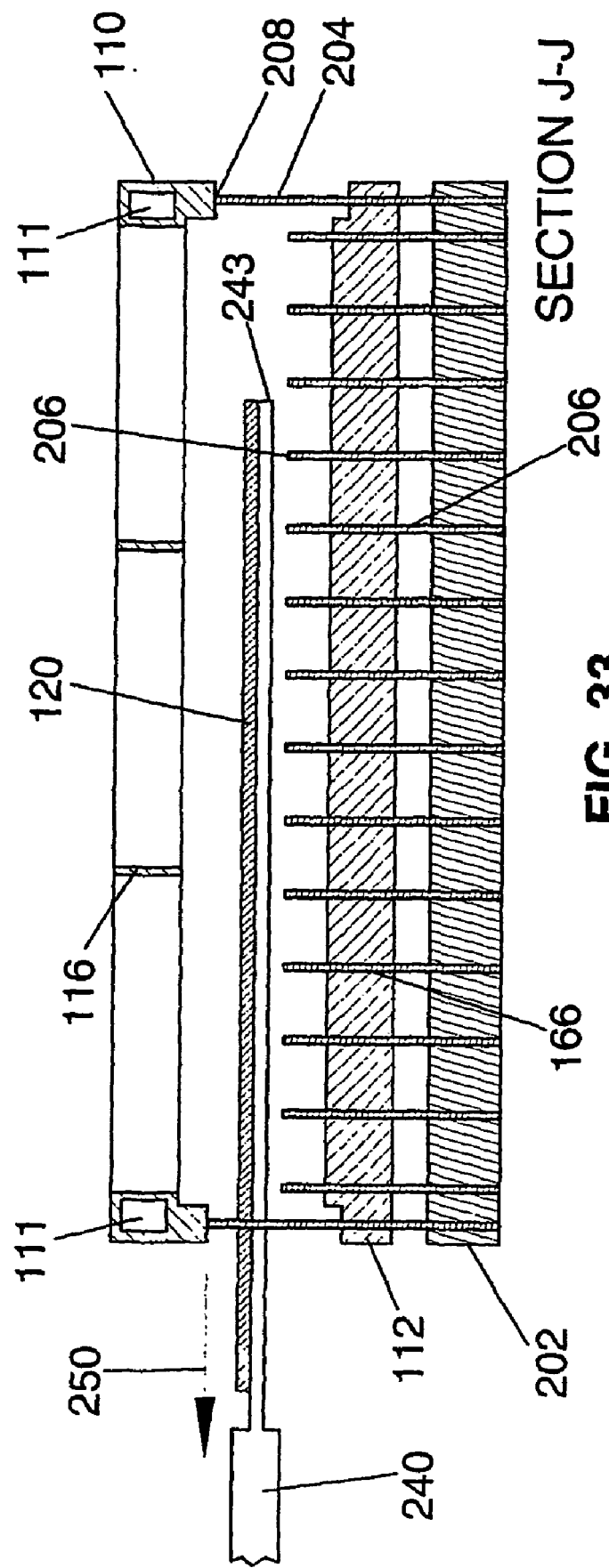
FIG. 33 is a schematic view through section J-J of pallet 100 and pin plate 202 in FIG. 19 showing the robot end effector removing FPDS 120 from the separated pallet.

FIGS. 31-33 show the sequence of steps by which a robot, having an end effector 243 and end effector mount 240, removes an already-tested FPDS 120 from a disassembled pallet. End effector 243 is equivalent to end effectors 731-733 in the three-blade robot shown in FIGS. 61-63 or to end effectors 831-832 in the two-blade robot shown in FIGS. 67-69.

FIG. 31 is a schematic view through section J-J of pallet 100 and pin plate 202 in FIG. 19. End effector 243 is moving in (arrow 244) under FPDS 120 and above pallet bottom 112. It is important that spacing 299 between the under surface of FPDS 120 and the upper surface of pallet bottom 112 is wide enough to accommodate the thickness 306 (FIG. 24) of end effector 243 in order to avoid striking (and possibly damaging) FPDS 120 and/or pallet bottom 112.

FIG. 32 is a schematic view through section J-J of pallet 100 and pin plate 202 in FIG. 19. End effector 243 is moving up (arrow 246) to lift FPDS 120 off short pins 206 on pin plate 202. Relative lengths 284 and 288 of long pins 204 and short pins 206, respectively, (see FIG. 20) must be chosen to ensure adequate clearance for end effector 243 to lift FPDS 120 and exit from the disassembled pallet without dragging the upper surface of FPDS 120 along the under surface of pallet top 110, thereby possibly damaging FPDS 120 and/or pallet top 110.

FIG. 33 is a schematic view through section J-J of pallet 100 and pin plate 202 in FIG. 19. End effector 243 is withdrawing (arrow 250) FPDS 120 from the disassembled pallet.

The reverse process from that shown in FIGS. 27-33 is used to insert an FPDS 120 for testing into pallet 100:

1) FIG. 33: End effector 243 carries (arrow 250 reversed) FPDS 120 into disassembled pallet 100.
2) FIG. 32: End effector 243 lowers (arrow 246 reversed) FPDS 120 onto short pins 206 on pin plate 202.
3) FIG. 31: End effector 243 withdraws (arrow 244 reversed) from disassembled pallet 100.
4) FIG. 30: Pin plate 202 is ready to begin reassembling pallet 100.
5) FIG. 29: Pin plate 202 has lowered (arrow 214 reversed) FPDS 120 onto pallet bottom 112.
6) FIG. 28: Pin plate 202 has lowered (arrow 212 reversed) pallet top 100 onto FPDS 120 and onto pallet bottom 112, clamping FPDS 120 between pallet top 110 and pallet bottom 112.
7) FIG. 27: Pin plate 202 actuator has lowered (arrow 210 reversed) far enough to remove long pins 204 and short pins 206 completely from holes 164 and 166, respectively, in pallet bottom 112. At this point, pallet 100 has been reassembled, clamping an untested FPDS 120 between pallet top 110 and pallet bottom 112, ready for alignment of pallet top 110 to FPDS 120 (see FIGS. 34-39B), followed by e-beam testing.

Procedure for Aligning the Pallet Top to the FPDS

Figure 34:
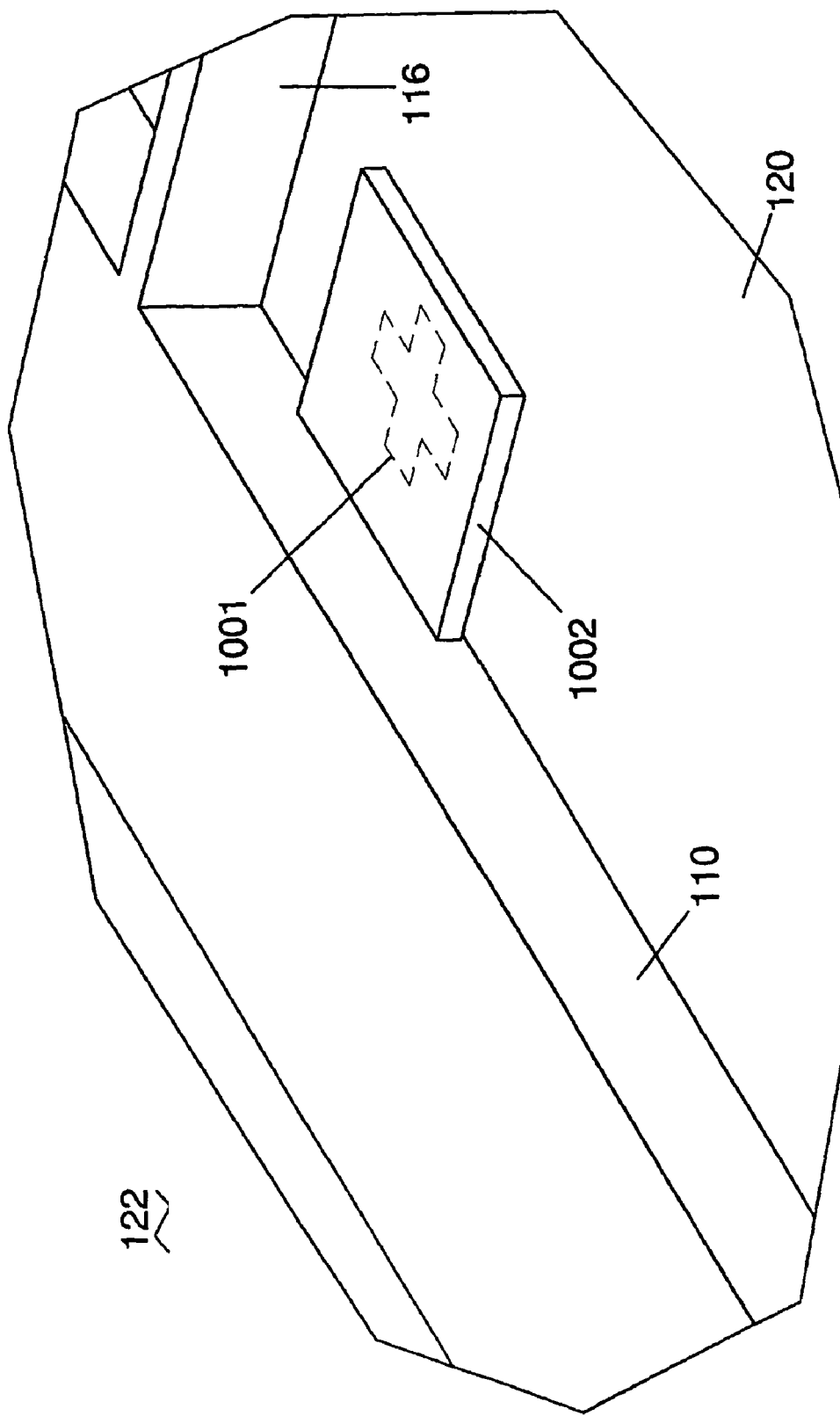
FIG. 34 is schematic detail view 122 showing capacitive sensor 1002 detecting the location of passivated alignment mark 1001 on FPDS 120 in FIG. 3.

FIG. 34 is a schematic detail view 122 showing a capacitive sensor 1002 attached to pallet top 110 detecting the location of a passivated alignment mark 1001 on FPDS 120 in FIG. 3. An FPDS has a number of alignment marks 1001, typically with a "+" shape. In order to make good electrical contact between the contactors 425 in pallet top 110 and test pads 426 on FPDS 120 (see FIG. 17), in general it will be necessary to adjust the position of pallet top 110 relative to FPDS 120. The upper center surface of pallet bottom 112 is made from a material, such as rubber, which prevents FPDS 120 from sliding relative to pallet bottom 112. Thus, if pallet top 110 is moved a certain amount relative to pallet bottom 112, it will move the same amount relative to FPDS 120. FIGS. 39A-39B illustrate a method for accomplishing relative motion between pallet top 110 and pallet bottom 112. It is not possible to make direct electrical connection to alignment mark 1001 because at this stage in the manufacturing of FPDS 120, alignment mark 1001 is already covered by an insulating passivation layer. Because what is important is the alignment between contactors 425 (which are part of pallet top 110) and test pads 426 (which are part of FPDS 120—see FIG. 17), it is necessary to mount capacitive sensor 1002 on pallet top 110 so that the alignment mechanism shown in FIGS. 39A-39B serve to move both contactors 425 and capacitive sensor 1002 together.

Figure 35:
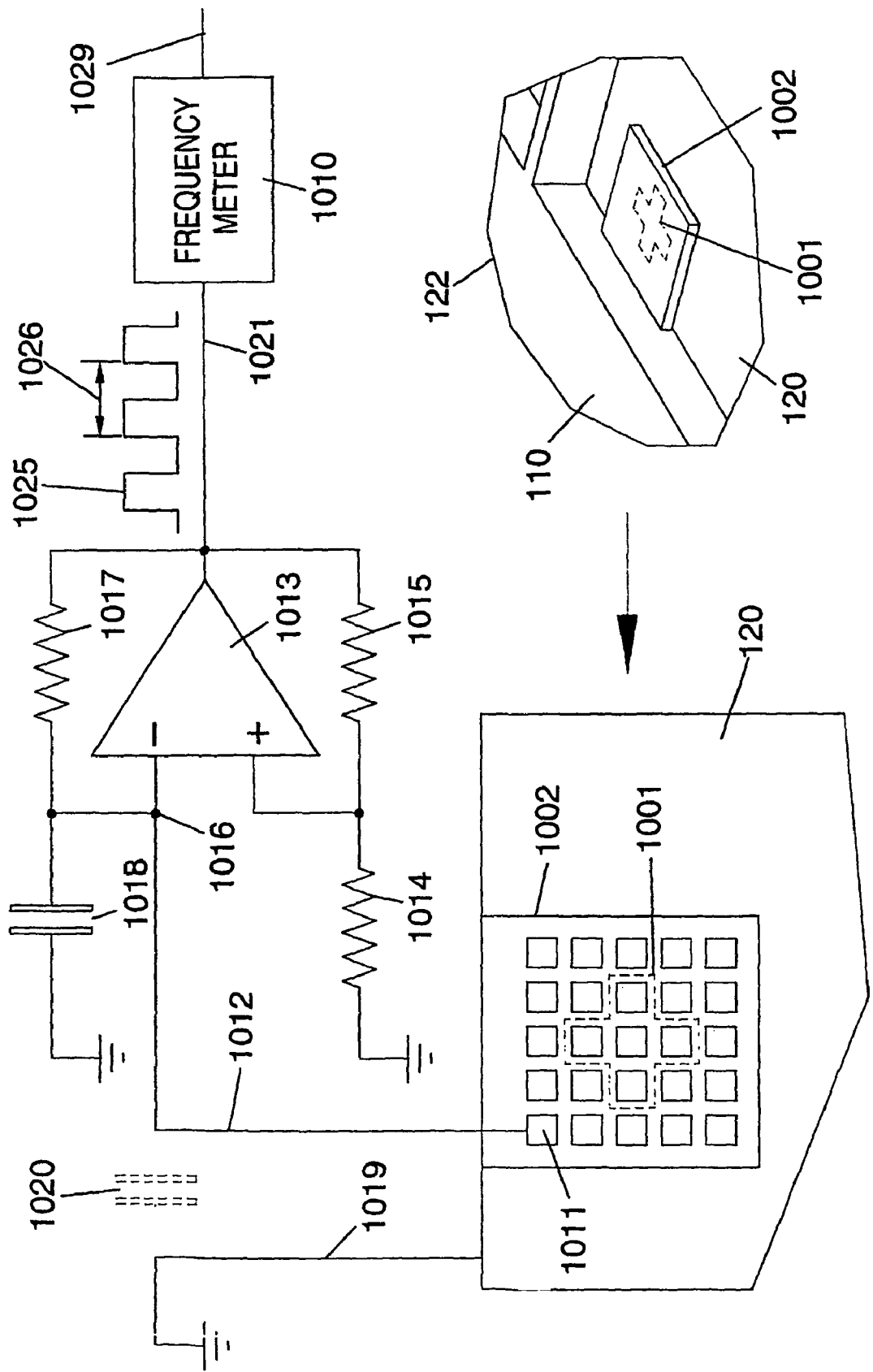
FIG. 35 is a schematic view of capacitive sensor 1002 and its associated electronics.

FIG. 35 is a schematic view of capacitive sensor 1002 and its associated electronics, with detail 122 shown as an inset. Capacitive sensor 1002 is shown with 25 individual sensing elements 1011, in a 5×5 array. The electrical circuits shown connected to one sensing element 1011 are identical to circuits (not shown) which would be connected to the other 24 sensing elements. The method used here to detect the position of alignment mark 1001 is capacitive sensing of the underlying passivated mark—the mark itself is made from conducting material, so it will have a small capacitance which can be sensed by each of the 25 sensing elements. In FIG. 35, alignment mark 1001 is shown aligned with capacitive sensor 1002—thus the center of the "+" mark is under the center sensing element of the 5×5 array.

The square-wave relaxation oscillator circuit formed by op-amp 1013, op-amp output 1021, resistors 1014, 1015, and 1017, capacitor 1018, capacitance 1020 (arising from connection 1012 to sensing element 1011 and the ground connection 1019 to FPDS 120), and summation node 1016 will be understood by those skilled in the art. In this oscillator, the voltage 1025 on output 1021 of op-amp 1013 swings back-and-forth between voltages near the op-amp 1013 power supply rails (not shown) at a frequency which is inversely proportional to the total capacitance of the parallel combination of capacitor 1018 and capacitance 1020 (the capacitance between sensing element 1011 and alignment mark 1001). When a sensing element 1011 is over alignment mark 1001, capacitance 1020 will be larger, increasing oscillation period 1026; conversely, when a sensing element 1011 is not over alignment mark 1001, capacitance 1020 will be smaller, decreasing oscillation period 1026. Although it is not permitted for the undersurface of capacitive sensor 1002 to touch the upper surface of FPDS 120, it is desirable to make the gap between capacitive sensor 1002 and FPDS 120 as small as possible to increase the variation in capacitance 1020, thereby making the process for locating alignment mark 1001 more sensitive. The square wave 1025 on op-amp 1013 output line 1021 is the input to frequency meter 1010 which generates a time-varying frequency measurement 1029 which is a function of the distance between sensing element 1011 and alignment mark 1001. The 25 parallel circuits combine to generate a 5×5 array of time-varying frequency measurements wherein the lowest frequencies (i.e., longest oscillation periods 1026) indicate sensing elements 1011 which are directly over alignment mark 1001, while higher frequencies correspond to sensing elements 1011 which are partially, or completely, off of alignment mark 1001.

Figure 36:
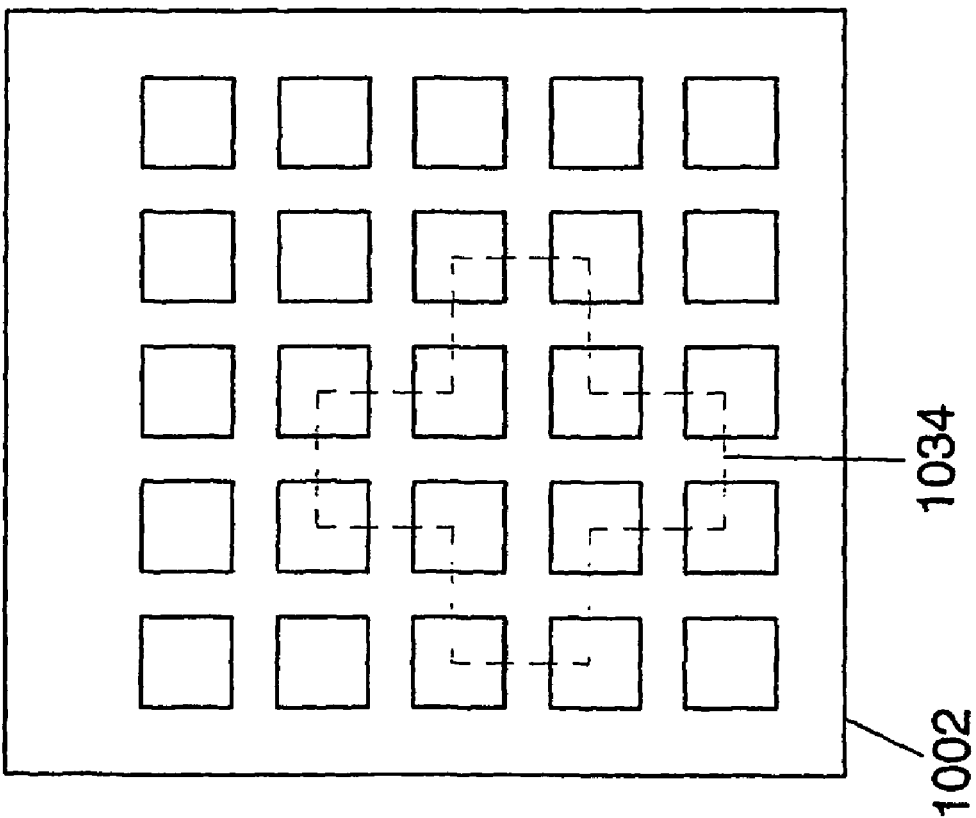
FIG. 36 shows alignment mark 1034 underneath capacitive sensor 1002 in the case of FPDS misalignment.

FIG. 36 shows an alignment mark 1034 underneath capacitive sensor 1002 in the case of FPDS misalignment. Table I shows the percent of overlap between various sensor elements 1011 and alignment mark 1034 in the case of misalignment between capacitive sensor 1002 and alignment mark 1034.

TABLE I

Sensor element 1011 signals for misalignment between capacitive sensor 1002 and alignment mark 1034.

| 0%  | 0%  | 0%  | 0%  | 0% |
| --- | --- | --- | --- | --- |
| 0%  | 25% | 25% | 0%  | 0% |
| 25% | 75% | 75% | 25% | 0% |
| 25% | 75% | 75% | 25% | 0% |
| 0%  | 25% | 25% | 0%  | 0% |

Comparison with Table II (for proper alignment) shows that the difference is substantial and provides a clear definition of the required displacement vector (i.e., the motion of pallet top 110 relative to FPDS 120) which will correct the misalignment.

Figure 37:
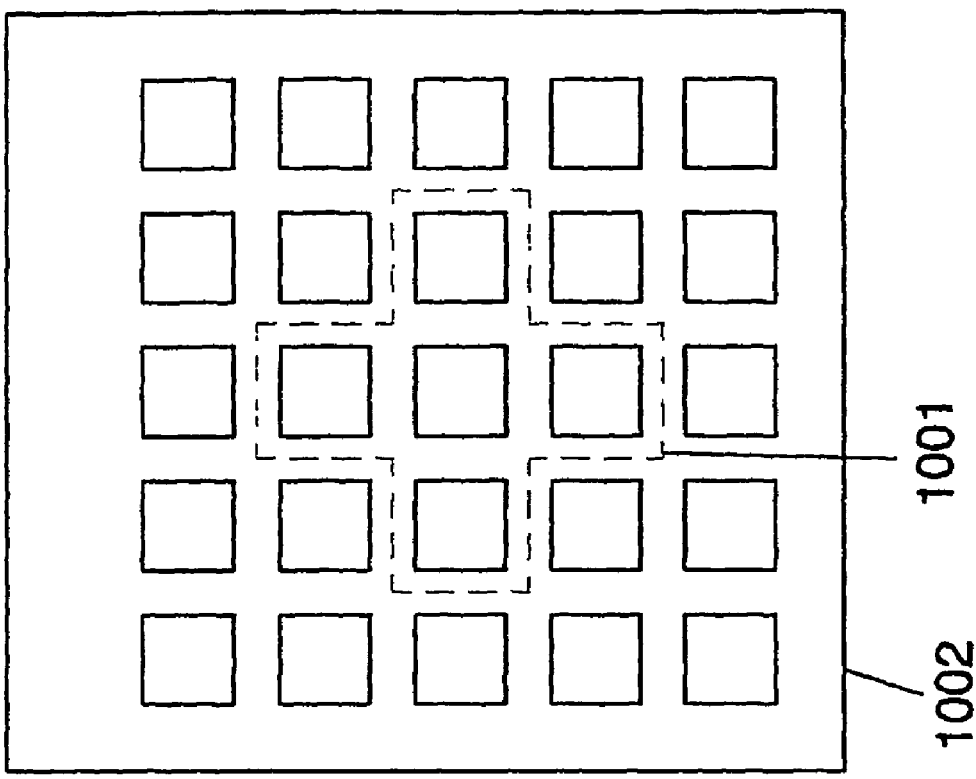
FIG. 37 shows alignment mark 1034 underneath capacitive sensor 1002 in the case of correct FPDS alignment.

FIG. 37 shows alignment mark 1001 underneath capacitive sensor 1002 in the case of correct FPDS alignment. Table II shows the percent of overlap between various sensor elements 1011 and alignment mark 1001 in the case of proper alignment between capacitive sensor 1002 and alignment mark 1001.

TABLE II

Sensor element 1011 signals for alignment between capacitive sensor 1002 and alignment mark 1001.

| 0% | 0% | 0%   | 0% | 0% |
| --- | --- | --- | --- | --- |
| 0% | 0% | 100% | 0% | 0% |

TABLE II-continued

Sensor element 1011 signals for alignment between capacitive sensor 1002 and alignment mark 1001.

| 0% | 100% | 100% | 100% | 0% |
|----|------|------|------|----|
| 0% | 0%   | 100% | 0%   | 0% |
| 0% | 0%   | 0%   | 0%   | 0% |

Figure 38:
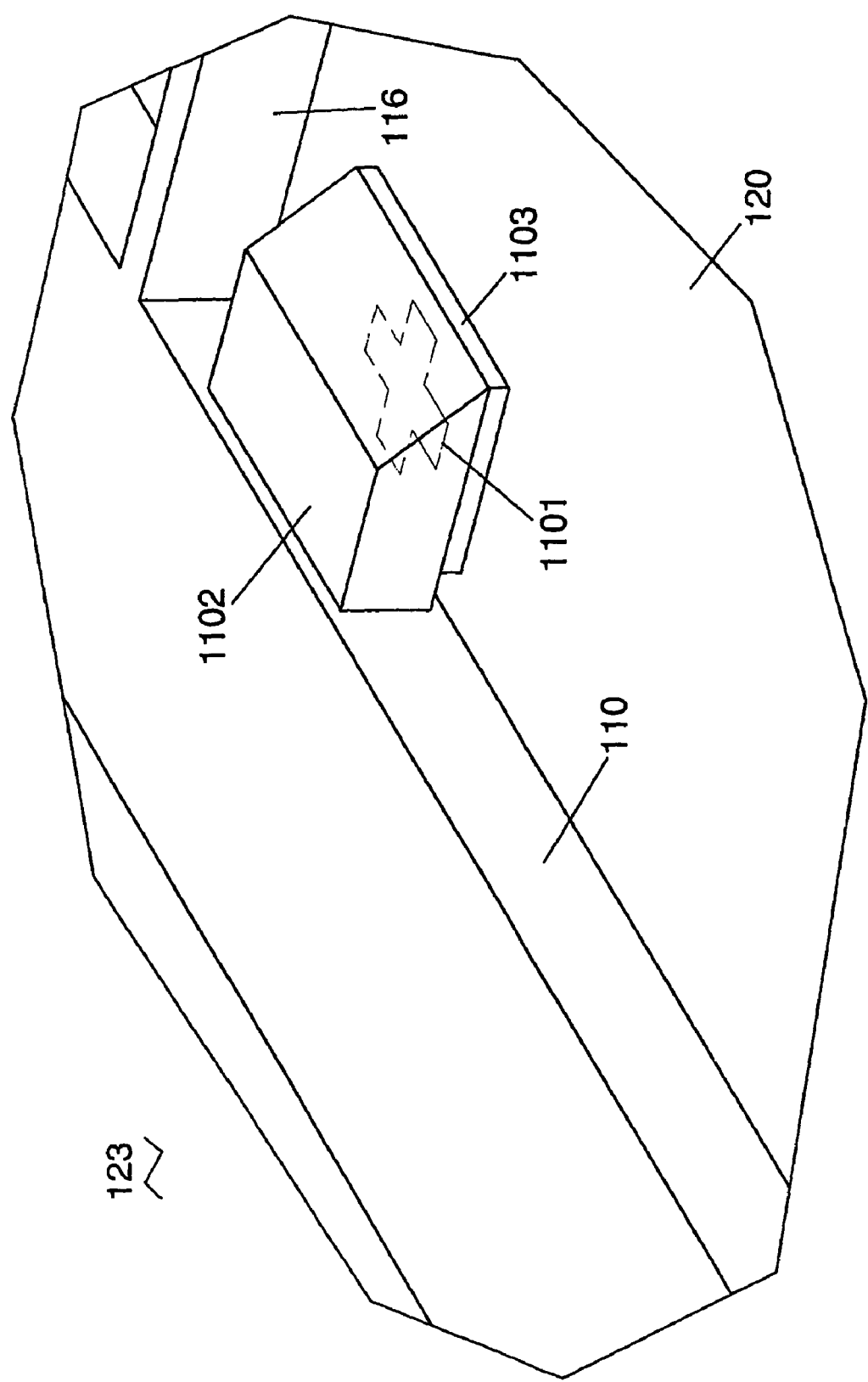
FIG. 38 is schematic detail view 123 of an optical sensor detecting the location of passivated alignment mark 1001 on FPDS 120 in FIG. 3.

FIG. 38 shows detail view 123 (see FIG. 3) of an alternative type of alignment mark detector using light optical illumination and imaging to find alignment mark 1001. Note that each FPDS 120 has a number of identical alignment marks 1001, distributed over the full area of FPDS 120—the two alternative means for locating alignment marks shown in FIGS. 34-37 and in FIG. 38 are locating the same types of alignment marks 1001. FIG. 3 shows both means within one pallet only for illustrative purposes—normally, a single pallet would have only one type of alignment mark detection means. Although alignment mark 1001 is underneath an insulating passivation layer, the passivation is nearly transparent so it is possible to detect the location of alignment mark 1001 optically. Because what is important is the alignment between contactors 425 (which are part of pallet top 110) and test pads 426 (which are part of FPDS 120—see FIG. 17), it is necessary to mount the optical sensor on pallet top 110 so that the alignment mechanism shown in FIGS. 39A-39B moves contactors 425 and the optical sensor together. The optical sensor comprises imaging lens 1103, optical transmission means 1102 (which may be a fiber optic or a prism combined with a light pipe), and an imaging sensor such as a CCD camera (not shown)—the design of optical sensors is familiar to those skilled in the art. An image of alignment mark 1101 is focused by lens 1103 through optical transmission means 1102 onto the imaging sensor, which generates an image of alignment mark 1101—this image data is relayed to internal drive electronics 410 within pallet top 110. Image processing functions within internal drive electronics 410 then analyze the image data to determine the location of alignment mark 1001 and the required displacement vector for pallet top 110 relative to FPDS 120 needed to correct any misalignment.

To fully characterize the misalignment between pallet top 110 and FPDS 120, it is necessary to locate at least two alignment marks 1001 on FPDS 120, preferably well separated to minimize errors. Given two or more required displacement vectors determined by imaging two or more alignment marks 1001 with either capacitive sensors 1002 (FIGS. 34-37) or optical sensors (FIG. 38), the alignment mechanism illustrated in FIGS. 39A-39B can then used to correct the overall X-Y-Yaw misalignment between pallet top 110 and FPDS 120. Recalling that pallet bottom 112 is designed to prevent slippage between FPDS 120 and pallet bottom 112, any misalignment between pallet top 110 and FPDS 120 can be considered to require an X-Y-Yaw adjustment between pallet top 110 and pallet bottom 112 as shown by vectors 1151-1154 in FIG. 39A—an X-Y coordinate system is defined by X-axis 1171 and Y-axis 1172. Actuators 1151-1154 are controlled by internal drive electronics 410 in pallet top 110 (see FIGS. 13-16). Detail 1155 is shown in FIG. 39B.

FIG. 39B is detail view 1155 with partial cutaway 1165 of X-Y-Yaw actuators mounted between pallet top 110 and pallet bottom 112. Two actuators 1163 and 1164 are shown, with actuator 1163 acting generally parallel to X-axis 1171 and actuator 1164 acting generally parallel to Y-axis 1172. Actuator 1163 is attached at point 1160 to pallet top 110, and at point 1162 to pallet bottom 112. Actuator 1164 is connected to pallet bottom 112 at point 1162 and to pallet top 110 at point 1161—thus actuators 1163 and 1164, operating in tandem with two identical actuators at the diagonally opposite corner of pallet 100 (the corner with vectors 1151 and 1152), can generate all three required alignment motions: parallel to X-axis 1171, parallel to Y-axis 1172 and Yaw (rotation about an axis perpendicular to pallet 100.

The placement of FPDS 120 on pallet bottom 112 by either the three-blade robot (the first embodiment) or the two-blade robot (the second embodiment) is important in determining the possible magnitude of misalignment between pallet top 110 and FPDS 112. With a sufficiently precise robot motion mechanism, the range of possible misalignments can be kept $<\sim 1$-2 mm in X and Y. The difference between the diameters of pins 204 and 206 (FIGS. 18-21) and the diameters of holes 164 and 166 (FIG. 7), respectively, determines the maximum range of correction for misalignments between pallet top 110 and FPDS 120. Note that since pallet 100 is disassembled into pallet top 110 and pallet bottom 112 during the process for FPDS removal and replacement, actuators 1163 and 1164 must preferably be part of pallet top 110 (since pallet top 110 has all of the internal drive electronics 410—see FIGS. 13-16). Thus attachment point 1162 must be able to reliably disconnect from pallet bottom 112 during pallet disassembly (between FIGS. 28 and 29). During the reverse process (going between FIGS. 29 and 28, with arrow 214 reversed), attachment point 1162 must reconnect to pallet bottom 112. It is not important that attachment point 1162 accurately reconnect within any tight tolerances since actuators 1163 and 1164 (as well as the corresponding actuators at the diagonally-opposite corner) can adjust for any positional nonreproducibilities). Once proper alignment between pallet top 110 and FPDS 120 has been achieved, it is necessary for pallet top 110 to be locked in position with respect to pallet bottom 112 (and thus be locked relative to FPDS 120)—this locking mechanism (see FIG. 40) is under control of internal drive electronics 410. The design of X-Y-Yaw actuators for use as described herein will be understood by those skilled in the art upon reading the present disclosure.

Figure 40:
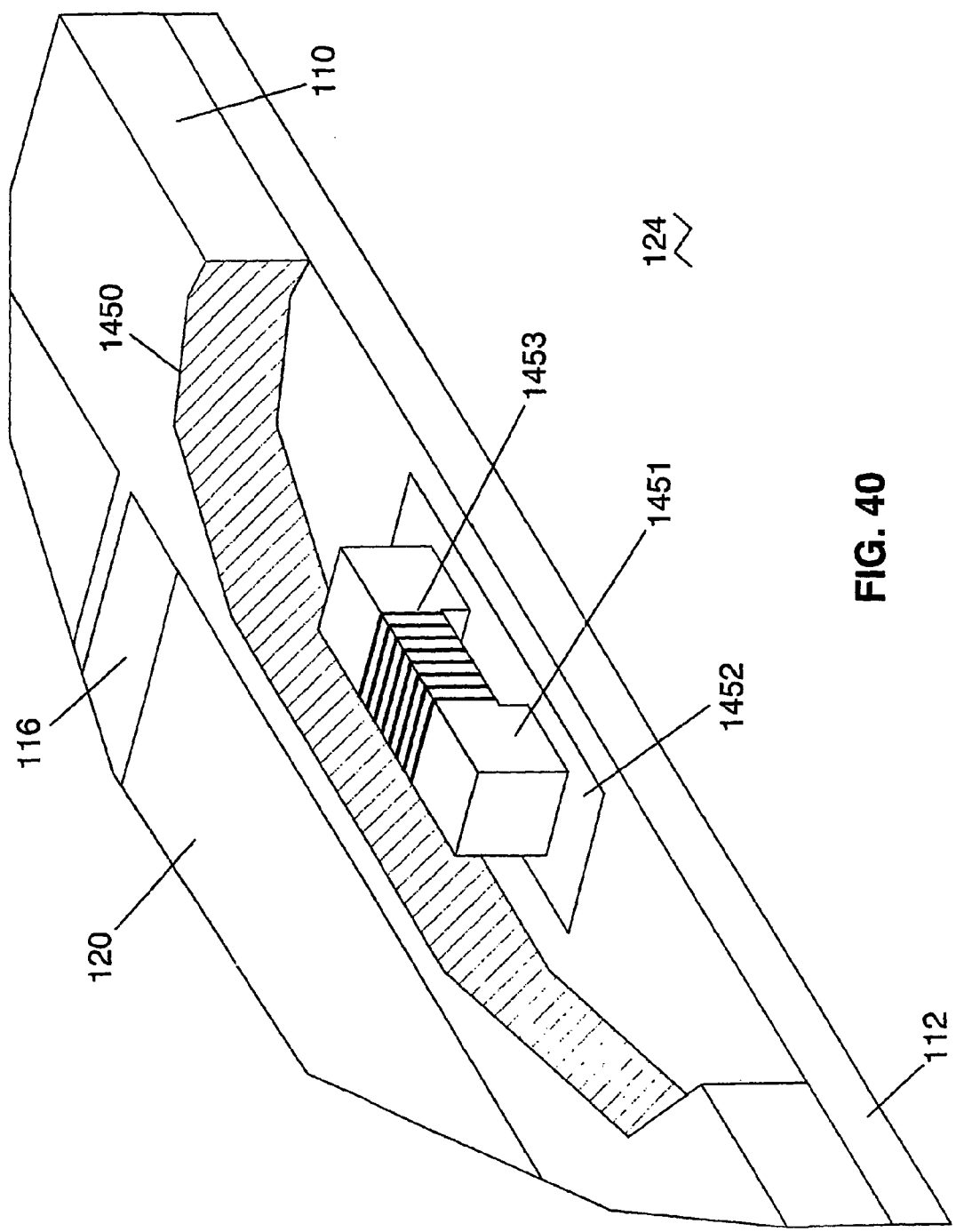
FIG. 40 is a schematic detail view 124 of a locking mechanism between pallet top 110 and pallet bottom 112 in pallet 100 in FIG. 3.

FIG. 40 is a schematic detail view 124 with cutaway 1450 of a locking mechanism between pallet top 110 and pallet bottom 112 in pallet 100 in FIG. 3. Magnetic plate 1452 is attached to pallet bottom 112. Magnetic pole-piece 1451, with activating magnet coil 1453 is mounted within pallet top 110 (mounting not shown), roughly above magnetic plate 1452. When current from internal drive circuits 410 (not shown—see FIG. 13) flows through coil 1453, an attractive magnetic field draws magnetic plate 1452 tightly against pole piece 1451, thereby locking pallet top 110 to pallet bottom 112. Magnetic plate 1452 is made somewhat larger than the opposing surfaces of pole piece 1451 to enable a certain amount of X-Y-Yaw adjustment of pallet top 110 relative to pallet bottom 112 without impairing the magnetic circuit formed by magnetic plate 1252 and pole piece 1451—this enables the alignment procedure in FIGS. 34-39B to operate without interfering with the locking mechanism between pallet top 110 and pallet bottom 112. At least two locking mechanisms like that shown in view 124 would be necessary to securely lock pallet top 110 to pallet bottom 112 during pallet transfer and FPDS testing in the process chamber. It is important that the magnetic circuit design minimizes magnetic flux leakage to eliminate the possibility of interference with the electron beams used for testing. The design of locking mechanisms for use as described herein will be understood by those skilled in the art upon reading the present disclosure. The present invention also includes other methods of clamping the top and bottom together that will be apparent to those skilled in the art.

First Embodiment Of An FPDS Testing System

The first embodiment of the present invention is an FPDS testing system comprising three main subsystems:

1) A pallet elevator 629, which serves as the interface between the FPD fab and the FPDS testing system. The functions of pallet elevator 629 are the following:
   a. Enables a robot to transport FPDSs from the FPD fab into the FPDS testing system.
   b. Assembles pallets containing FPDSs (one per pallet) clamped between the pallet top and pallet bottom.
   c. Performs alignment between contactors in the pallet top and test pads on the FPDS.
   d. Assists in the transport of assembled and aligned pallets containing FPDSs ready for testing into the dual loadlock.
   e. Assists in the transport of pallets with tested FPDSs back from the dual loadlock.
   f. Disassembles pallets with tested FPDSs.
   g. Enables the robot to transport tested FPDSs from the FPDS testing system to the FPD fab.

2) A dual loadlock 575, comprising two loadlocks, each of which has the following functions:
   a. Assists in the transport of pallets containing FPDSs for testing from the pallet elevator.
   b. Pumps down to a vacuum level equal to that in the process chamber.
   c. Assists in the transport of one pallet at a time into the process chamber for e-beam testing.
   d. Assists in the removal of one pallet at a time from the process chamber after e-beam testing.
   e. Vents to atmospheric pressure.
   f. Assists in the transport of pallets containing tested FPDSs back to the pallet elevator.

3) A process chamber 522, which has the following functions:
   a. Assists in the transport of one pallet at a time from the dual loadlock.
   b. Tests for defective pixels on the FPD in the pallet using one or more electron beams.
   c. Assists in the transport of one pallet at a time back into the dual loadlock after testing.

FIG. 41 is a top view of a first embodiment of an FPDS testing system embodying the present invention, including pallet elevator 629, dual loadlock 575, and process chamber 522. Pallet elevator 629 serves as the interface between the FPD fab and the multiple e-beam FPDS testing system, and is always at atmospheric pressure. Dual loadlock 575 has two separate loadlocks which cycle between atmospheric pressure and the vacuum level in process chamber 522, typically $\sim 10^{-6}$ torr. Process chamber 522 remains at $\sim 10^{-6}$ torr at all times during testing—it is vented to atmosphere only for maintenance. Valve 506 enables insertion/removal of pallets to/from upper loadlock 502 (see FIG. 43) in dual loadlock 575. Cross-section H-H is also illustrated in FIG. 41.

Figure 43:
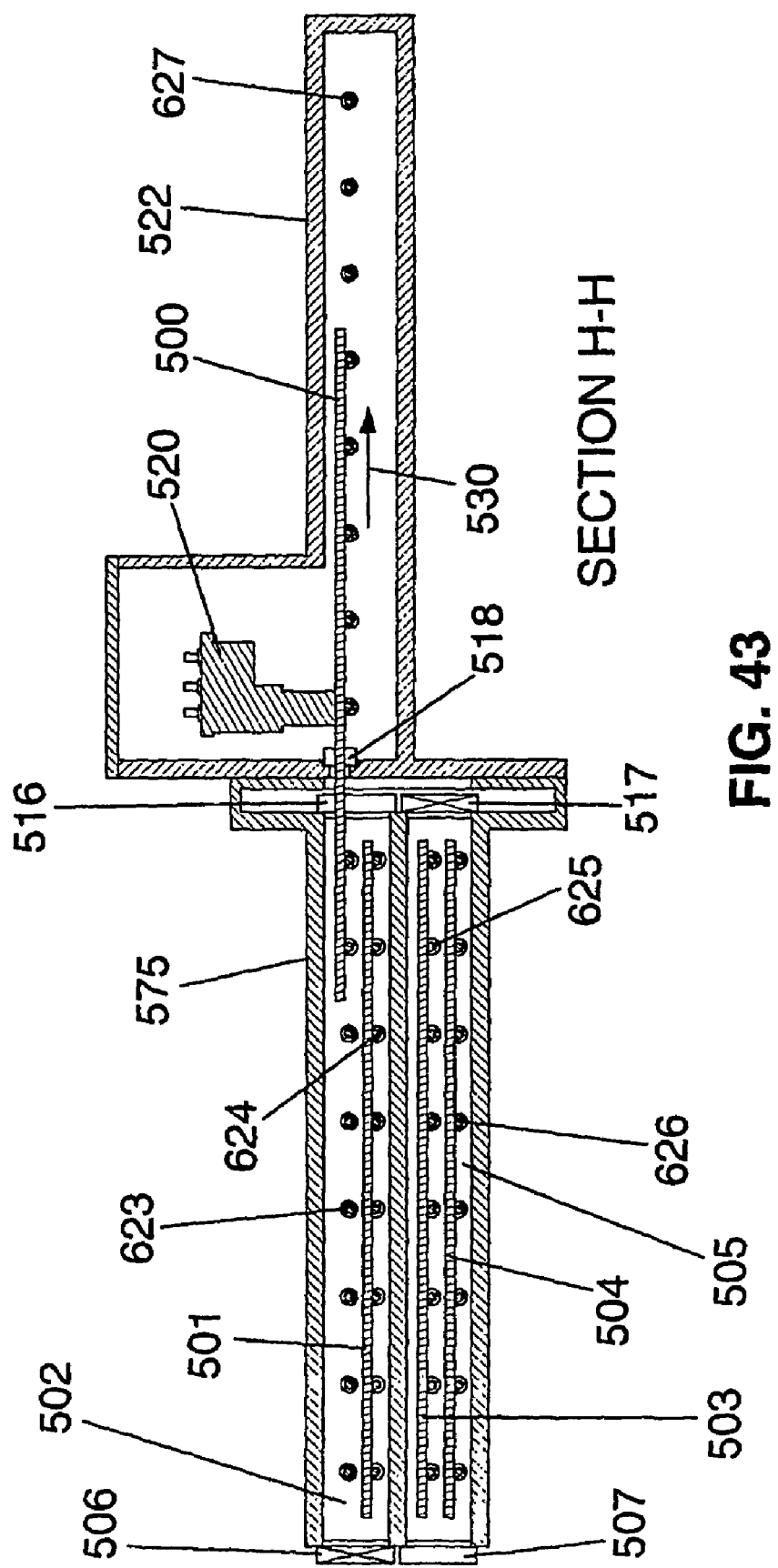
FIG. 43 is a schematic view through section H-H of the FPDS testing system (pallet elevator not shown) in FIG. 41.

FIG. 42 is a schematic side view of the FPDS testing system in FIG. 41. Valves 506 and 507 enable insertion/removal of pallets to/from upper 502 and lower 505 loadlocks, respectively (see FIG. 43), in dual loadlock 575. Dual loadlock 576 sits on supports 714 which provide vertical motion capability for dual loadlock 575 to enable the two-way transfer of pallets: 1) out of process chamber 522 going into any slot in dual loadlock 575, and 2) out of any slot in dual loadlock 575 going into process chamber 522 (see FIGS. 51-58). Pallet elevator 629 sits on supports 710 which provide vertical motion capability for pallet elevator 629 to enable the two-way transfer of pallets: 1) out of any slot in dual loadlock 575 going into any slot in pallet elevator 629, and 2) out of any slot in pallet elevator 629 going into any slot in dual loadlock 575 (see FIGS. 51-58). Note that supports 710 must also move pallet elevator 629 vertically to track the motion of dual loadlock 575. Process chamber 522 sits on fixed supports 718. Supports 710, 714, and 718 preferably should provide vibration isolation to pallet elevator 629, dual loadlock 575 and process chamber 522, respectively, to ensure that there is minimal vibration of pallet 500 relative to optics assembly 520 (FIG. 43). A description of the operation of the dual loadlock 575 and process chamber 522 is provided in U.S. patent application Ser. No. 11/054,932 filed Feb. 9, 2005 incorporated by reference herein. Cross-section G-G is also illustrated in FIG. 19.

FIG. 43 is a schematic view of section H-H of FIG. 41 of the FPDS testing system (pallet elevator 629 is not shown). Dual loadlock 575 is comprised of upper loadlock 502 and lower loadlock 505. A closed valve (such as valves 506 and 517) is indicated by an "X", while an open valve (such as valves 507, 516, and 518) has no "X". Two sets of bi-directional motor-driven rollers 623 and 624 define two storage slots in upper loadlock 502, and another two sets of bi-directional motor-driven rollers 625 and 626 define two storage slots in lower loadlock 505. Rollers 623-626 have three functions:

1) Supporting pallets within dual loadlock 575—each set of rollers 623-626 defines a separate pallet storage slot within dual loadlock 575.
2) Assisting in transferring pallets to/from dual loadlock 575 from/to pallet elevator 629 (working in conjunction with one of the three sets of bi-directional motor-driven rollers 620-622 in pallet elevator 629—see FIGS. 51-58).
3) Assisting in transferring pallets to/from dual loadlock 575 from/to process chamber 522 (working in conjunction with bi-directional motor-driven rollers 627 in process chamber 522).

A pallet 600 is shown being transported (arrow 530) under optics assembly 520 by two sets of bi-directional motor-driven rollers: rollers 623 in upper loadlock 502, and rollers 627 in process chamber 522. Upper loadlock 502 has two slit valves: valve 506 allowing insertion/removal of pallets into/from dual loadlock 575 from/into pallet elevator 629, and valve 516 allowing insertion/removal of pallets into/from process chamber 522. Valve 518 (which normally remains open) enables process chamber 522 to be sealed off from dual loadlock 575 for maintenance on either dual loadlock 575 or process chamber 522. Optics assembly 520 includes both the linear array of electron columns 1211 and the linear array of corresponding detectors 1240 (see FIG. 2). An electron beam testing procedure for FPDSs is discussed in detail in U.S. patent application Ser. No. 11/225,376 filed Sep. 12, 2005 and is incorporated by reference herein.

During the time required to test the FPDSs in pallets 500 and 501, the present invention provides for removal of two pallets containing already-tested FPDSs (not shown) through valve 507 from lower loadlock 505. Two pallets 503 and 504 with FPDSs ready for testing can then be inserted into lower loadlock 505. In FIG. 43, valve 507 is ready to be closed (valve 517 is already closed) and lower loadlock chamber 505 will then be pumped down to the same pressure as in process chamber 522 (typically $\sim 10^{-6}$ torr).

After testing of the FPDSs in pallets 500 and 501, valve 516 is closed while dual loadlock 575 indexes up to enable pallets from lower loadlock 505 to be inserted into process chamber 522 through open valves 517 and 518. The same testing procedure described above for pallets 500 and 501 is then followed for pallets 503 and 504. During e-beam testing, pallet 503 is supported and transported by bi-directional motor-driven rollers 625 and 627, and pallet 504 is supported and transported by bi-directional motor-driven rollers 626 and 627. During the time required to test the FPDSs in pallets 603 and 504, upper loadlock 502 is vented to atmosphere and pallets 500 and 501 are removed and replaced with two pallets containing FPDSs ready for testing (not shown), followed by a pump-down of upper loadlock 502 to the same pressure as in process chamber 522 (typically ~$10^{-6}$ torr).

This procedure of toggling between testing FPDSs from the upper and lower loadlocks enables high system throughput since there is always one loadlock (either upper loadlock 502 or lower loadlock 505), pumped down and ready to insert pallets into process chamber 522 for testing by optics assembly 520. All other operations, such as loadlock pumpdown and venting, pallet assembly/disassembly, pallet top-to-FPDS alignment, and pallet insertion/removal into/from the dual loadlock are performed in parallel with e-beam testing and thus have no effect on system throughput.

Figure 44:
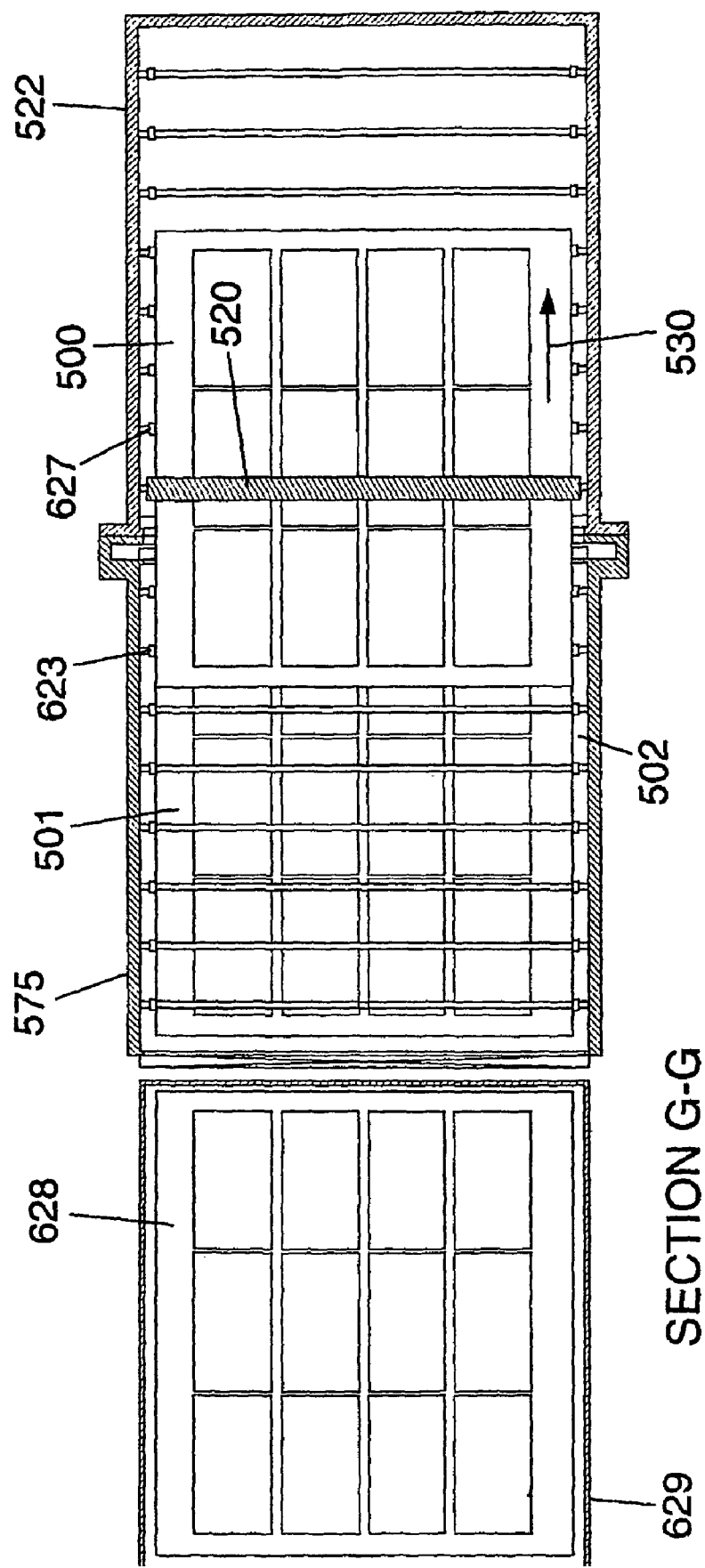
FIG. 44 is a schematic view through section G-G of the FPDS testing system in FIG. 42.

FIG. 44 is a schematic view through section G-G of the FPDS testing system in FIG. 42. Pallet elevator 629 is shown ready to supply pallet 628, loaded with an untested FPDS, for insertion into double loadlock 575. FIGS. 51-58 show schematic views of the pallet insertion/removal process between pallet elevator 629 and dual loadlock 575. Optics assembly 520 extends across the full width of pallet 500 to enable testing of all pixels on the FPDS in pallet 500 without the need for sideways (vertical in FIG. 44) motion of pallet 500.

Pallet X-Y-Yaw Positional Measurement System

Figure 45:
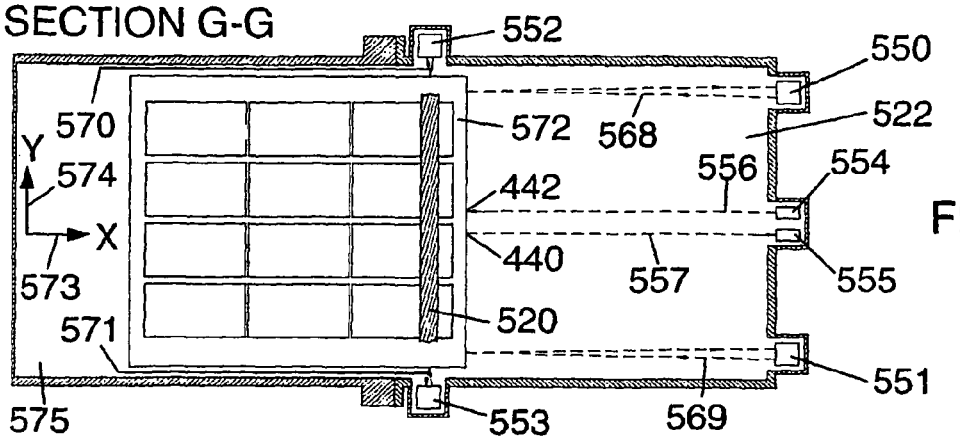
FIG. 45 is a schematic view through section G-G of the FPDS testing system (pallet elevator and transfer rollers not shown) in FIG. 42 showing a method for measurement of the X-Y-Yaw position of pallet 572 within process chamber 522—pallet 572 is shown mostly within dual loadlock 575.
Figure 46:
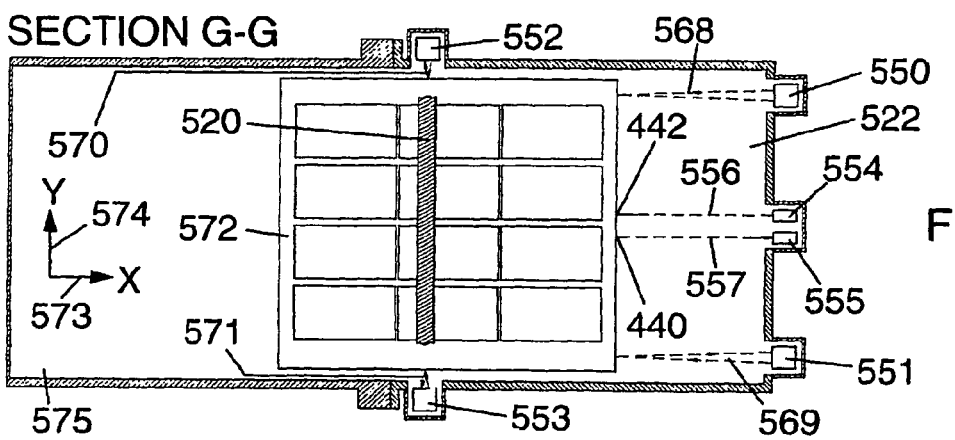
FIG. 46 is a schematic view through section G-G of the FPDS testing system (pallet elevator and transfer rollers not shown) in FIG. 42 showing pallet 572 half way into process chamber 522.
Figure 47:
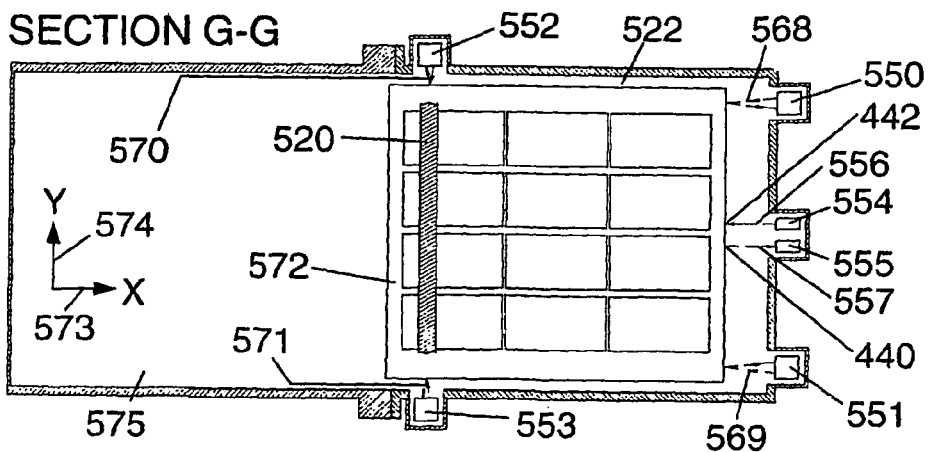
FIG. 47 is a schematic view through section G-G of the FPDS testing system (pallet elevator and transfer rollers not shown) in FIG. 42 showing pallet 572 mostly within process chamber 522.
Figure 48:
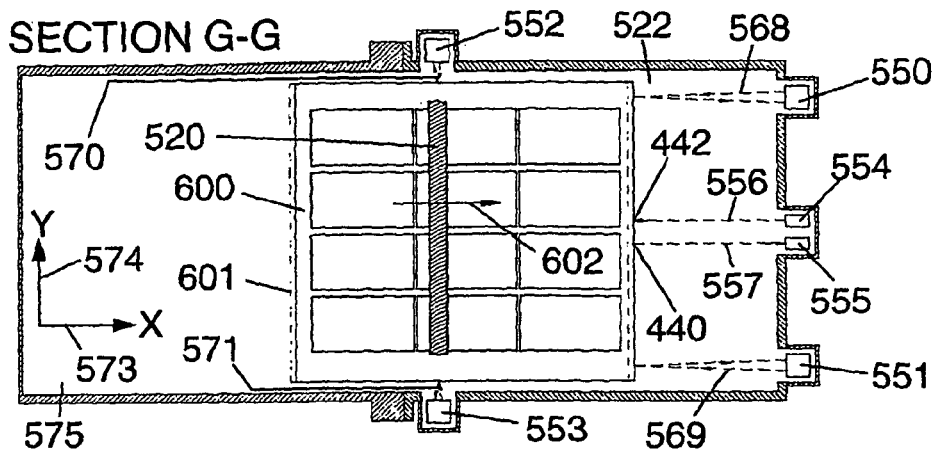
FIG. 48 is a schematic view through section G-G of the FPDS testing system (pallet elevator and transfer rollers not shown) in FIG. 42 showing pallet 600 with an offset from its desired position 601 along the X-axis 573.
Figure 49:
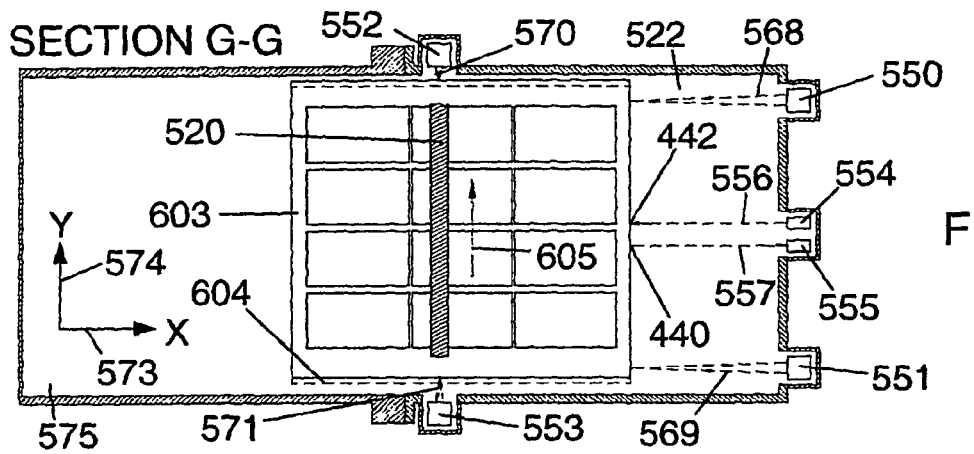
FIG. 49 is a schematic view through section G-G of the FPDS testing system (pallet elevator and transfer rollers not shown) in FIG. 42 showing pallet 603 with an offset from its desired position 604 along the Y-axis 574.
Figure 50:
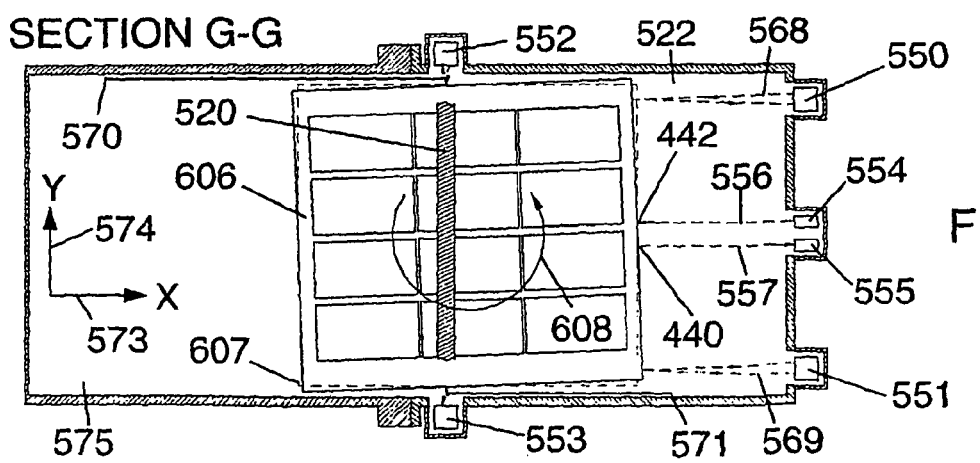
FIG. 50 is a schematic view through section G-G of the FPDS testing system (pallet elevator and transfer rollers not shown) in FIG. 42 showing pallet 606 with Yaw (rotation about a vertical axis) 608 from its desired orientation 607.

FIGS. 45-47 show three schematic views through section G-G of the FPDS testing system (pallet elevator 629 and bi-directional motor-driven rollers 623-627 not shown for clarity) of FIG. 42 showing a method for measurement of the X-Y-Yaw position of pallet 572 within process chamber 522. Optics assembly 520 is cut away at both ends to show laser beams 570 and 571. The coordinate system consists of X-axis 573 and Y-axis 574. The position of pallet 572 along X-axis 573 is measured using sensors 550 and 551, which can be laser interferometers, laser triangulators, or some other non-contact means of distance measurement sufficiently accurate to meet the positioning requirements dictated by the testing process performed by optics assembly 520. For e-beam FPDS testing, the positional measurement accuracy requirement is ~2-10 μm, substantially smaller than the dimensions of test pads 426 (see FIG. 17). FIGS. 45-47 illustrate the use of laser positional measurement of pallet 572, where laser beam 568 is emitted by a laser within sensor 550 towards a reflecting surface on the side of pallet 572. Beam 568 then reflects off the side of pallet 572 back to a detector within sensor 550. Either through optical interference or by triangulation, sensor 550 can then determine the distance between sensor 550 and the reflecting side of pallet 572. The same positional measurement process occurs for sensor 551 emitting beam 569, sensor 552 emitting beam 570, and sensor 553 emitting beam 571. Sensors 550 and 551 detect both X-axis and Yaw motion as illustrated in FIGS. 48 and 50. Sensors 552 and 553 measure the position of pallet 572 along Y-axis 574 as shown in FIG. 49.

As discussed in FIGS. 10-12, control of internal drive electronics 410 is effected through a first data link comprising data transmitter 554, signal beam 556, and data receiver 442. Feedback from internal drive electronics 410 within pallet 572 is effected by a second data link comprising data transmitter 440, signal beam 557, and data receiver 555. It is necessary that pallet 572 not undergo yaw motions 608 (see FIG. 50) large enough to misalign signal beam 556 with receiver 442, or signal beam 557 with receiver 555—in general this requirement should not be difficult to meet, since positional errors of pallet 572 can be kept <1-2 mm through careful design of bi-directional motor-driven rollers 623-627 as is familiar to those skilled in the art. Since the overall dimensions 130 and 132 (FIG. 4) of pallet 572 are typically ~2-3 m, positional errors of ~1-2 mm will induce Yaw angles <1 mrad.

Sensors 550-553 must have the capability to track the position of pallet 572 sufficiently quickly to keep up with the pallet velocities required by the testing process performed by optics assembly 520. From the timelines in FIGS. 64 and 70, 40 s is typically allotted for alignment and testing—thus, with a 3 m pallet, the pallet velocity during testing would be: (3000 mm)/(40 s)=75 mm/s. Only 10 s is allotted for pallet removal in FIGS. 64 and 70, so the pallet removal velocity would be 4× higher: (3000 mm)/(10 s)=300 mm/s. Commercially-available laser position sensors are capable of positional measurement at these velocities as is familiar to those skilled in the art.

In FIG. 45, e-beam testing has just begun, thus pallet 572 is just entering process chamber 522. In FIG. 46, e-beam testing is about half completed, thus pallet 572 is now half way into process chamber 522. In FIG. 47, e-beam testing is nearly complete, thus pallet 572 has moved almost entirely into process chamber 522. Comparison of FIGS. 45-47 shows that beams 568 and 569 strike nearly the same areas on the end of pallet 572, regardless of the X-position of pallet 572. Thus, only two small reflective areas (at the impact points of beams 568 and 569) are needed on the end of pallet 572. Beams 570 and 571 strike various positions along the entire length of pallet 572 as seen in FIGS. 45-47—this requires that both sides of pallet 572 be reflective over their entire lengths for proper operation of sensors 552 and 553. One benefit of having two Y-axis sensors 552 and 553 is redundancy—if either of sensors 552 or 553 fails to provide a distance measurement due to imperfections in the reflectivity of the pallet side, the other sensor will maintain measurement continuity.

FIGS. 48-50 show three schematic views through section G-G of the FPDS testing system of FIG. 42 (pallet elevator 629 and bi-directional motor-driven rollers 623-627 not shown for clarity) showing positional errors along the X-axis (FIG. 48), Y-axis (FIG. 49), and Yaw (FIG. 50).

In FIG. 48, pallet 600 is shown with an offset in the direction 602 from its desired position 601 along the X-axis 573 (parallel to the pallet direction of travel). X-axis positional errors are detected when sensors 550 and 551 show errors with both the same magnitude and the same sign.

In FIG. 49, pallet 603 is shown with an offset in the direction 605 from its desired position 604 along the Y-axis 574 (perpendicular to the pallet direction of travel). Y-axis positional errors are detected when sensors 552 and 553 show positional errors with the same magnitude and opposite signs.

In FIG. 50, pallet 606 is shown with a Yaw 608 (rotation about a vertical axis) offset from its desired orientation 607. Yaw positional errors are detected when sensors 550 and 551 show errors with the same magnitude but with opposite signs.

As shown in FIG. 2, the four position sensors 550-553 are connected to X-Y-Yaw readout 1202, which, given the four position measurements from sensors 550-553, calculates X-Y-Yaw positional errors, which are sent to system control 1203 over control link 1219. System control 1203 then transmits the X-Y-Yaw positional error data to two subsystems:

1) Over control link 1220 to optics control 1201, which then deflects beams 1230 to correct for positional errors. This enables the FPDS testing system to move pallet 100 at an approximately constant speed under the linear array of columns 1211, without the requirement for extremely accurate control of the speeds of bi-directional motor-driven rollers 627. Further details of column 1211 are provided in FIG. 71.

2) Over data line 498 to data transmitter 554, to be sent (using beam 556) to data receiver 442 on pallet 100 to enable internal drive electronics 410 (see FIG. 13) to determine which voltages should be sent to various contactors 425. This is necessary because the location of pallet 100 relative to electron columns 1211 (the X-Y-Yaw positional data) determines which pixels are located under electron beams 1230, and thus can be tested at any particular time.

Pallet Transfer Between Pallet Elevator, Dual Loadlock and Process Chamber

FIGS. 51-57 are schematic views through section H-H of the FPDS testing system of FIG. 41 showing three simultaneous processes at various points in time:
1) Electron-beam testing by optics assembly 520 of an FPDS in pallet 600 from upper loadlock 502 which is at the same pressure (~$10^{-6}$ torr) as processing chamber 522.
2) Removal of pallets 602 and 603 with already-tested FPDSs from lower loadlock 505 which is at atmospheric pressure.
3) Insertion of pallets 604 and 605 with FPDSs ready for testing into lower loadlock 505 which is at atmospheric pressure.

FIG. 58 is the same view, shown at 120 s after FIG. 51. Pallet elevator 629 is simplified for clarity by omission of pin plates 705-707 (see FIGS. 59-63).

FIG. 51 is a schematic view through section H-H of the FPDS testing system of FIG. 41 showing an FPDS in pallet 600 being tested by optics assembly 520 as pallet 600 moves into process chamber 522 (arrow 610) from upper loadlock 502 through open valves 516 and 518. During testing, pallet 600 is supported and moved into/out of process chamber 522 by bi-directional motor-driven rollers 623 and 627. Simultaneously, processed pallet 602 is being removed (arrow 611) from lower loadlock 505 through open valve 507 into pallet elevator 629. Pallet 602 is being supported and moved out of lower loadlock 505 by bi-directional motor-driven rollers 622 and 625. Pallets 604 and 605 are ready for insertion into lower loadlock 505. Pallet elevator 629 contains three storage slots defined by bi-directional motor-driven rollers 620-622. Since upper loadlock 502 is at ~$10^{-6}$ torr (the same pressure as process chamber 522), valve 506 must be closed. Since lower loadlock 505 is at atmosphere for pallet transfer, valve 517 must be closed to preserve vacuum in process chamber 522 and upper loadlock 502. Two sets of bi-directional motor-driven rollers 623 and 624 define pallet storage slots in upper loadlock 502, while two more sets of bi-directional motor-driven rollers 625 and 626 define two storage slots in lower loadlock 505. The exchange of pallet 603 (containing an already-tested FPDS) will be illustrated in FIG. 55. The FPDS in pallet 601 will be tested after testing of the FPDS in pallet 600 is complete.

FIG. 52 is a schematic view through section H-H of the FPDS testing system of FIG. 41 showing an FPDS in pallet 600 being tested by optics assembly 520 as pallet 600 moves into process chamber 522 (arrow 610) from upper loadlock 502 through open valves 516 and 518. Simultaneously, pallet elevator 629 is indexing down (arrow 612) to enable the insertion of unprocessed pallet 604 from pallet elevator 629 into the upper slot (defined by bi-directional motor-driven rollers 625) of lower loadlock 505.

FIG. 53 is a schematic view through section H-H of the FPDS testing system of FIG. 41 showing an FPDS in pallet 600 being tested by optics assembly 520 as pallet 600 moves into process chamber 522 (arrow 610) from upper loadlock 502 through open valves 516 and 518. Simultaneously, unprocessed pallet 604 is being inserted (arrow 613) from pallet elevator 629 into lower loadlock 505 by bi-directional motor-driven rollers 621 and 625.

FIG. 54 is a schematic view through section H-H of the FPDS testing system of FIG. 41 showing an FPDS in pallet 600 being tested by optics assembly 520 as pallet 600 moves into process chamber 522 (arrow 610) from upper loadlock 502 through open valves 516 and 618. Simultaneously, pallet elevator 629 is indexing down (arrow 614) to enable removal of processed pallet 603 from lower loadlock 505.

FIG. 55 is a schematic view through section H-H of the FPDS testing system of FIG. 41 showing an FPDS in pallet 600 being tested by optics assembly 520 as pallet 600 moves into process chamber 522 (arrow 610) from upper loadlock 502 through open valves 516 and 518. Simultaneously, processed pallet 603 is being removed (arrow 615) from lower loadlock 505 into pallet elevator 629. Pallet 603 is supported and moved out of lower loadlock 505 by bi-directional motor-driven rollers 621 and 626.

FIG. 56 is a schematic view through section H-H of the FPDS testing system of FIG. 41 showing an FPDS in pallet 600 being tested by optics assembly 520 as pallet 600 moves into process chamber 522 (arrow 610) from upper loadlock 502 through open valves 516 and 518. Simultaneously, pallet elevator 629 is indexing down (arrow 616) to enable the insertion of unprocessed pallet 605 from pallet elevator 629 into the lower slot (defined by bi-directional motor-driven rollers 626) of lower loadlock 505

FIG. 57 is a schematic view through section H-H of the FPDS testing system in FIG. 41 showing an FPDS in pallet 600 being tested by optics assembly 520 as pallet 600 moves into process chamber 522 (arrow 610) from upper loadlock 502 through open valves 516 and 518. Simultaneously, unprocessed pallet 605 is being inserted (arrow 617) from pallet elevator 629 into lower loadlock 505 by bi-directional motor-driven rollers 620 and 626.

FIG. 58 is a schematic view through section H-H in FIG. 41 of the FPDS testing system 120 s after FIG. 51 (see timing diagram in FIG. 64) showing an FPDS in pallet 604 being tested by optics assembly 520 as pallet 604 moves into process chamber 522 (arrow 648) from lower loadlock 505 through open valves 517 and 518. During testing, pallet 604 is supported and moved into/out of process chamber 522 by bi-directional motor-driven rollers 625 and 627. Simultaneously, processed pallet 600 is being removed (arrow 618) from upper loadlock 502 through open valve 506 into pallet elevator 629. Pallet 600 is being supported and moved out of upper loadlock 502 by bi-directional motor-driven rollers 622 and 623. Since lower loadlock 505 is at ~$10^{-6}$ torr (the same pressure as process chamber 522), valve 507 must be closed. Since upper loadlock 502 is at atmosphere for pallet transfer, valve 516 must be closed to preserve vacuum in process chamber 522 and lower loadlock 505.

Pallet Disassembly and FPDS Removal from Pallet Elevator

FIGS. 59-63 are a sequence of schematic side views of the FPDS testing system in FIG. 42, showing various aspects of the process of disassembling pallets in pallet elevator 629, followed by transfer of FPDSs into/out of pallet elevator 629, resting on supports 710. In FIGS. 59-63, more details of the internal mechanisms in pallet elevator 629 are shown which were omitted for clarity in FIGS. 51-58—specifically, three pin plates 705-707, which are mounted as shown and are supported and moved together vertically by an actuator (not shown). Dual loadlock 575 and process chamber 522 rest on supports 714 and 718, respectively, and are not affected by any of the operations of pallet elevator 629 interacting with the FPD fab environment. The timeline in FIG. 64 shows that the pallet disassembly operations illustrated in FIGS. 59-60 (given in more detail in FIGS. 27-30) occur in the intervals 50-65 s and 170-185 s, while the FPDS transfer operations illustrated in FIGS. 61-63 occur in the intervals 65-95 s and 185-215 s.

Figure 59:
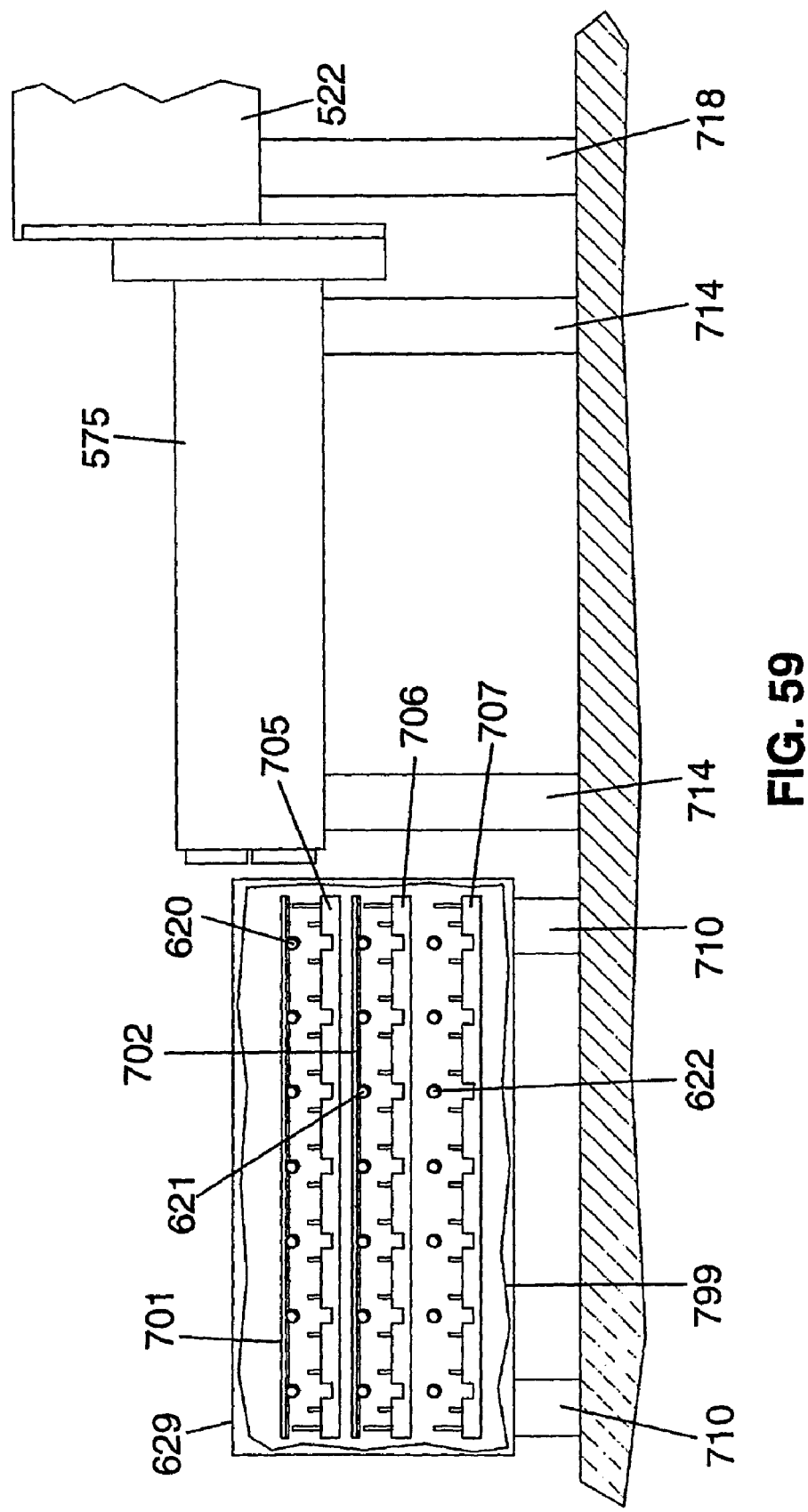
FIG. 59 is a schematic side view of the FPDS testing system in FIG. 42 with a cutaway showing two assembled pallets 701 and 702 in pallet elevator 629.

FIG. 59 is a schematic side view of the FPDS testing system of FIG. 42 with cutaway 799 showing two assembled pallets 701 and 702 in pallet elevator 629 (refer to FIG. 27). Pallets 701 and 702 are supported by two sets of bi-directional motor-driven rollers 620 and 621, respectively, which define the upper two storage slots in pallet elevator 629. The third slot in pallet elevator 629, defined by a third set of bi-directional motor-driven rollers 622, is empty in this view.

Figure 60:
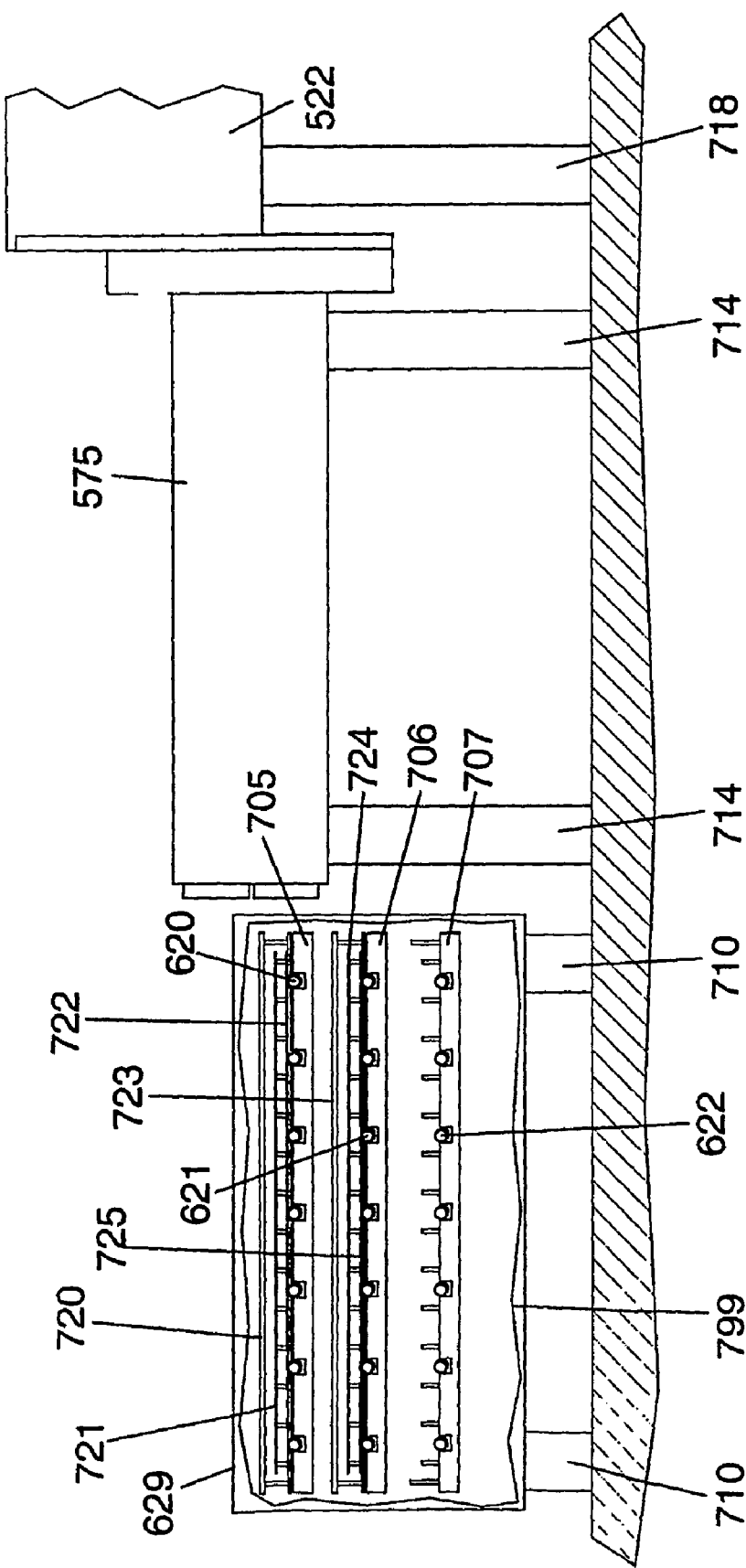
FIG. 60 is a schematic side view of the FPDS testing system in FIG. 42 with a cutaway showing two disassembled pallets in pallet elevator 629.

FIG. 60 is a schematic side view of the FPDS testing system of FIG. 42 with cutaway 799 showing the two pallets 701 and 702 of FIG. 59 now disassembled in pallet elevator 629 (refer to FIG. 30). Pallet top 720, FPDS 721, and pallet bottom 722 are now separated by pin plate 705, which has been moved vertically upwards. Pallet top 723, FPDS 724, and pallet bottom 725 are now separated by pin plate 706, which has been moved vertically upwards. Pin plate 707 has also moved vertically upwards (even though there is no pallet in the lower slot defined by bi-directional motor-driven rollers 622) because all three pin plates 705-707 are connected to the same vertical actuator (not shown).

Figure 61:
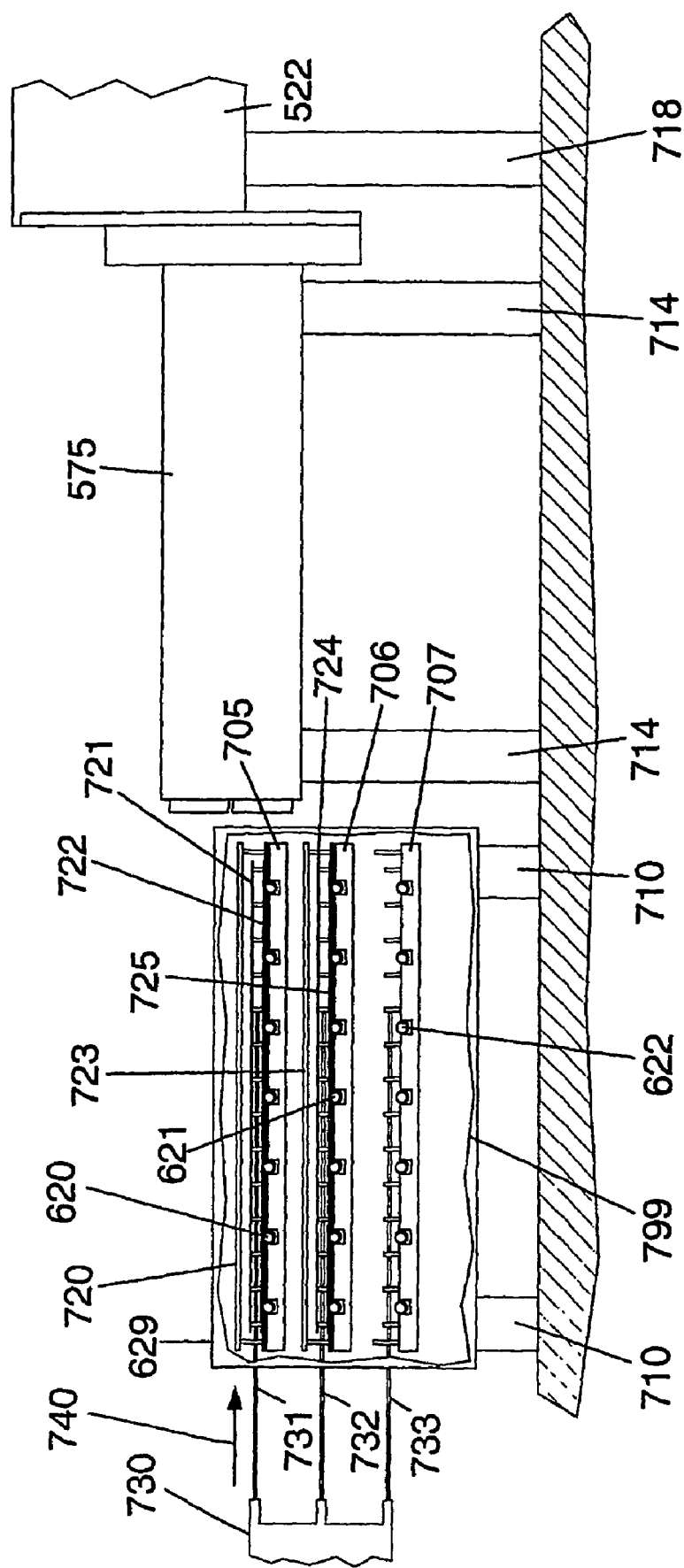
FIG. 61 is a schematic side view of the FPDS testing system in FIG. 42 with a cutaway showing a three-blade robot entering pallet elevator 629.

FIG. 61 is a schematic side view of the FPDS testing system of FIG. 42 with cutaway 799 showing a three-blade robot entering (arrow 740) pallet elevator 629 (refer to FIG. 31). The three-blade robot comprises three end effectors (also called "blades") 731-733 and end effector mount 730. End effector 731 passes between FPDS 721 and pallet bottom 722; end effector 732 passes between FPDS 724 and pallet bottom 725; and end effector 733 enters an empty slot without a pallet. Pallet tops 720 and 723 are supported on pin plates 705 and 706, respectively. Pin plates 705-707 may be designed with trenches which fit around bi-directional motor-driven rollers 620-622, respectively, to enable pin plates 705-707 to move far enough up to disassemble pallets without interference from rollers 620-622.

Figure 62:
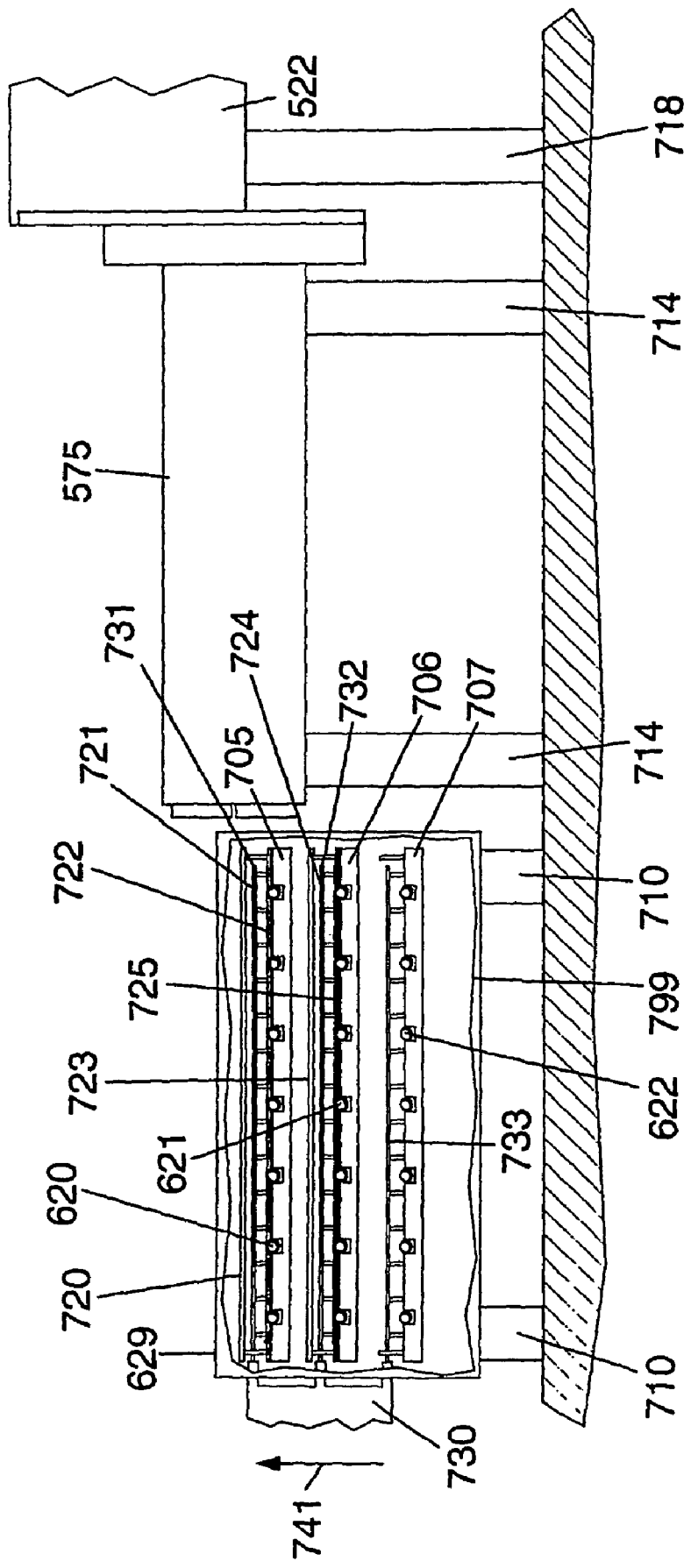
FIG. 62 is a schematic side view of the FPDS testing system in FIG. 42 with a cutaway showing the three-blade robot lifting two tested FPDSs 721 and 724 off two pin plates 705 and 706, respectively.

FIG. 62 is a schematic side view of the FPDS testing system of FIG. 42 with cutaway 799 showing the three-blade robot lifting (arrow 741) tested FPDSs 721 and 724 off pin plates 705 and 706, respectively (refer to FIG. 32).

Figure 63:
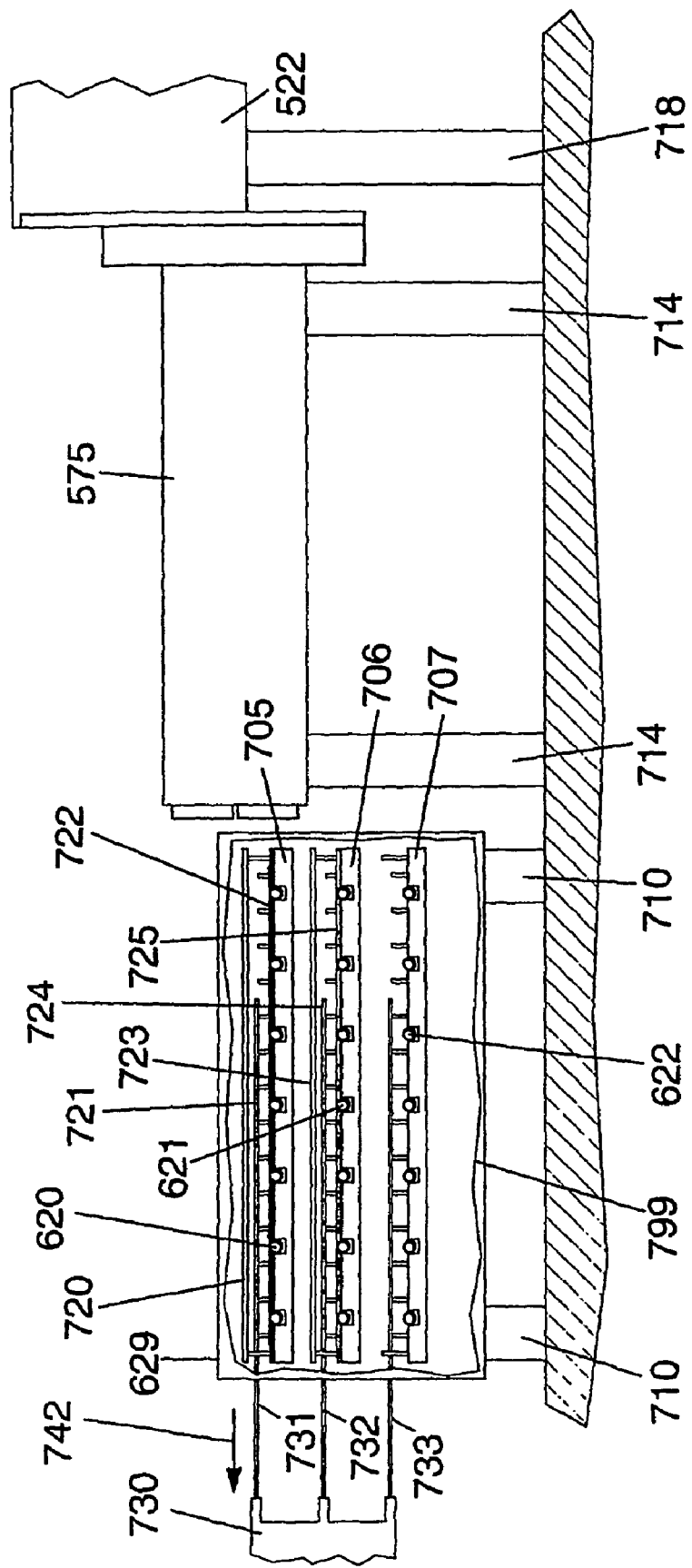
FIG. 63 is a schematic side view of the FPDS testing system in FIG. 42 with a cutaway showing the three-blade robot removing two tested FPDSs 721 and 724 from pallet elevator 629.
Figure 64:
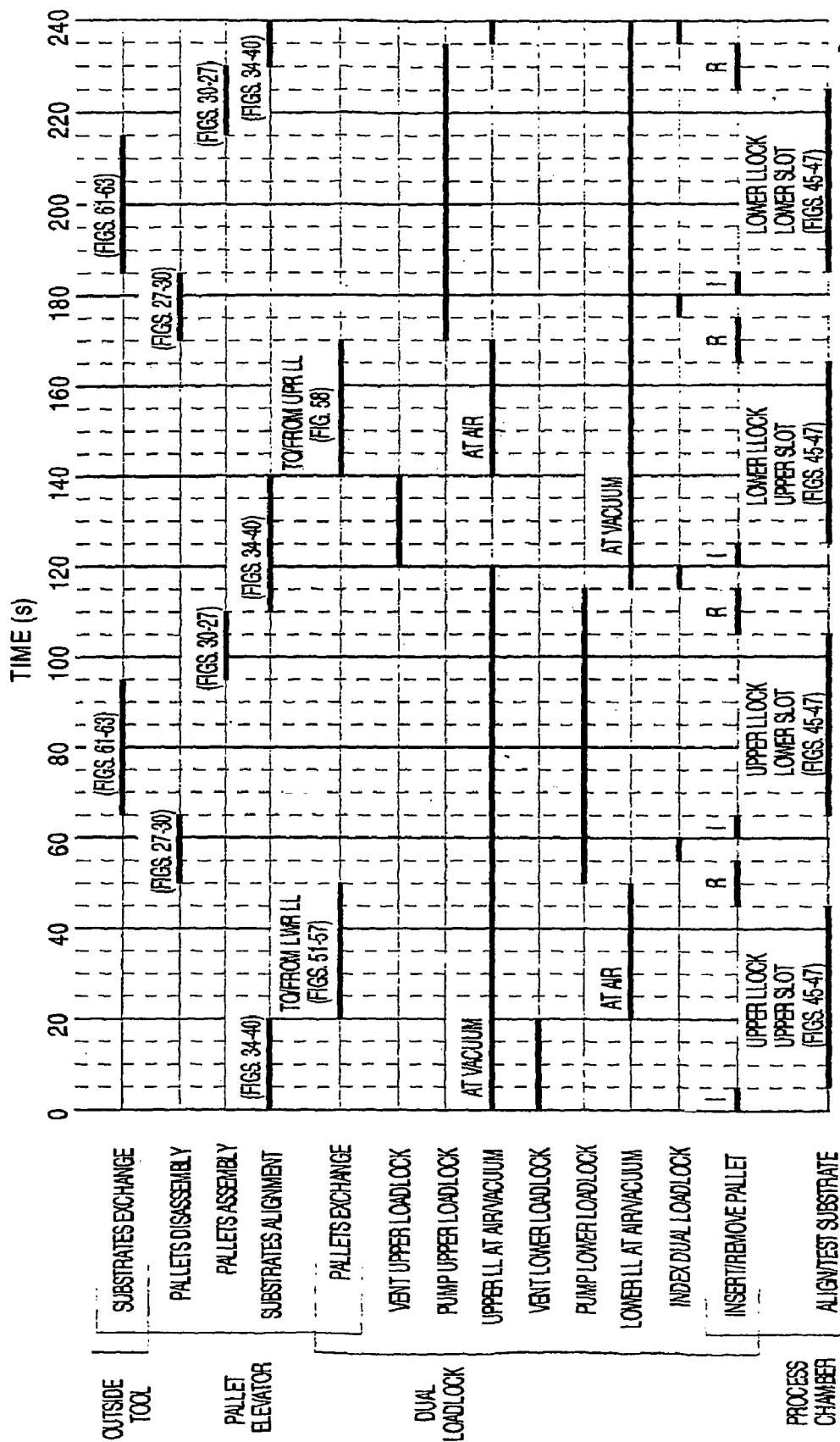
FIG. 64 is an operational cycle timing diagram for the FPDS testing system in FIGS. 41 and 42.

FIG. 63 is a schematic side view of the FPDS testing system of FIG. 42 with cutaway 799 showing the three-blade robot removing (arrow 742) tested FPDSs 721 and 724 from pallet elevator 629 into the FPD fab (refer to FIG. 33).

The reverse process from that shown in FIGS. 59-63 is used to insert FPDSs 721 and 724 (which now should be assumed to be ready for testing, not already tested) into pallet elevator 629:

1) FIG. 63: the three-blade robot transports (arrow 742 reversed) FPDSs 721 and 724 into pallet elevator 629.
2) FIG. 62: the three-blade robot lowers (arrow 741 reversed) FPDSs 721 and 724 onto pin plates 705 and 706, respectively.
3) FIG. 61: the three-blade robot withdraws (arrow 740 reversed) from pallet elevator 629.
4) FIG. 60: pin plates 705 and 706 are now ready to assemble pallets 701 and 702 (see FIG. 59).
5) FIG. 59: pin plates 705 and 706 have been lowered by the pin plate actuator (not shown) to assemble pallets 701 and 702, respectively.

The procedure between FIGS. 63-59 (in reverse) is shown in detail in FIGS. 33-27 (also in reverse).

The pallet disassembly/assembly and FPDS removal/insertion operations shown schematically in FIGS. 59-63 are performed in pallet elevator 629 at atmospheric pressure (preferably in a clean dry nitrogen atmosphere), in parallel with FPDS testing and loadlock venting/pumpdown as shown in the timing diagram in FIG. 64.

Timing Diagram for the First Embodiment of an FPDS Testing System

FIG. 64 is an operational cycle timing diagram for a first embodiment of an FPDS testing system as described in reference to FIGS. 41 and 42—the total period shown is 0 to 240 s, during which time four FPDSs are fully tested by optics assembly 520 in process chamber 522 (see FIG. 43). In operation, the FPDS test system would then start back at time=0 s (which is equivalent to 240 s), with another four pallets, going from 0-240 s (equivalent to 240-480 s) again. The three main subsystems are shown along the left side: pallet elevator 629, dual loadlock 575 and process chamber 522. Each horizontal line represents a particular process within the FPDS testing system—the brackets along the left side show which of the three subsystems performs the process (where more than one subsystem performs a process, the brackets overlap):

Substrates Exchange—the process of transporting FPDSs between pallet elevator 629 and the FPD fab using a three-blade robot. Details of the FPDSs exchange process, which occurs from 65-95 s and 185-215 s, are given in FIGS. 61-63. While FPDSs are being exchanged, the pallets must be in the disassembled state.

Pallets Disassembly—the process of separating a pallet into a pallet top and a pallet bottom, to enable one FPDS to be removed and another FPDS to be inserted (Substrates Exchange line, above). Details of the pallet disassembly process, which takes place from 50-65 s and 170-185 s, are given in FIGS. 27-30. Pallet disassembly occurs within pallet elevator 629.

Pallets Assembly—the process of assembling a pallet from a pallet top and a pallet bottom with an FPDS is the inverse of pallet disassembly—refer to FIGS. 30-27 (reverse arrows 210, 212, 214, and 216) and takes place from 95-110 s and 215-230 s. Pallet assembly occurs within pallet elevator 629.

Substrates Alignment—after a pallet is assembled, it is necessary to align the pallet top with the FPDS within the pallet, as described schematically in FIGS. 34-39B. Substrates alignment, which takes place from 110-140 s and 230-20 s (equivalent to 230-260 s), ensures that all the contactors 425 in pallet top 110 align with test pads 426 on FPDS 120 (see FIG. 17). Substrate alignment occurs within pallet elevator 629.

Pallets Exchange—after the pallets with untested FPDSs in pallet elevator 629 are assembled and aligned, two other pallets containing tested FPDSs are removed from dual loadlock 575 into pallet elevator 629. The two pallets with untested FPDSs are then inserted into dual loadlock 575 from pallet elevator 629, as described in FIGS. 51-57. Over the time interval from 20-50 s, pallet exchange is to/from lower loadlock 505, while over 140-170 s, pallet exchange is to/from upper loadlock 502. Pallet exchange can occur between pallet elevator 629 and dual loadlock 575 only when one of the loadlocks 502 or 505 in dual loadlock 575 has been vented to atmospheric pressure and either valve 506 (upper loadlock 505) or valve 507 (lower loadlock 505) is open (see FIGS. 51-58).

Vent Upper Loadlock—upper loadlock 502 is vented to atmospheric pressure from 120-140 s to enable pallet exchange between pallet elevator 629 and upper loadlock 502. Venting is preferably done with clean (i.e., particle-free) dry nitrogen and should induce minimal turbulence within upper loadlock 502 to reduce the risk of contaminating or breaking the FPDSs within upper loadlock 502.

Pump Upper Loadlock—after pallet exchange between upper loadlock 502 and pallet elevator 629 is complete, upper loadlock 502 is pumped down over the period 170-235 s. A number of different pumps (not shown) may be used in combination to minimize the pumpdown time as is familiar to those skilled in the art of vacuum system design:

- a. Air Ejectors—this type of pump uses pressurized gas to remove large quantities of gas from a chamber near atmospheric pressure. A typical air ejector would be the PIAB model #MLL1200 with 255 L/s pumping speed at 760 torr, dropping to 12.4 L/s at 160 torr. Below 160 torr, the air ejector(s) would be valved off from upper loadlock 502.
- b. Mechanical Pumps—this type of pump uses a piston to physically remove gas from the chamber over a pressure range from atmosphere down to 0.002 torr. A typical mechanical pump would be the Edwards model #iQDP80/iQMB1200 F with 12 L/s pumping speed at 760 torr, rising to 260 L/s at 0.1 torr, then falling back to 66 L/s at 0.002 torr. When upper loadlock 502 is below 0.002 torr, the mechanical pump(s) would be valved off from upper loadlock 502.
- c. Turbomolecular Pumps—this type of pump gives high pumping speeds for chambers at pressures of –0.2 torr and below. A typical turbomolecular pump would be the Osaka model #TG1810 with 140 L/s pumping speed at –0.2 torr, rising to 1800 L/s over $10^{-3}$-$10^{-6}$ torr. Above 0.15 torr, the turbopump(s) would be valved off from upper loadlock 502.

A typical loadlock volume would be ~1000 L, with four air ejectors, two mechanical pumps and a turbopump needed to achieve pumpdown times of ~65 s from atmosphere to ~$10^{-6}$ torr.

Note that the lower loadlock 505 pumpdown occurs from 50-115 s (see below), so there is no overlap in time between the lower loadlock 505 pumpdown and the upper loadlock 502 pumpdown—this means that the same set of pumps can be used for pumping down both the upper 502 and lower 505 loadlocks. If it is possible to maintain ~$10^{-6}$ torr in upper loadlock 502 and lower loadlock 505 using only the process chamber 522 pumping system (not shown), then no dedicated pumps for either the upper 502 or lower 505 loadlocks will be necessary. Otherwise, two small sustaining turbopumps (one for each of the upper 502 and lower 505 loadlocks) could be used to maintain ~$10^{-6}$ torr after the main set of pumpdown pumps (described above) is diverted over to the other loadlock.

Upper Loadlock at Air or Vacuum—after pumping upper loadlock 502 down to ~$10^{-6}$ torr, one or more turbopumps (not shown) may remain connected to upper loadlock 502, maintaining upper loadlock 502 at ~$10^{-6}$ torr (the same vacuum level as in process chamber 522) over the period 235-120 s. Note that 120 s is equivalent to 360 s (=120 s+240 s cycle time); since the FPD testing system cycles through the full timeline in FIG. 64 repeatedly, testing four FPDSs every 240 s. It may be possible to maintain ~$10^{-6}$ torr in upper loadlock 502 using only the process chamber 522 pumping system (not shown).

Vent Lower Loadlock—lower loadlock 505 is vented to atmospheric pressure from 0-20 s to enable pallet exchange between pallet elevator 629 and lower loadlock 505. Venting is preferably done with clean (i.e., particle-free) dry nitrogen and should induce minimal turbulence within lower loadlock 505 to minimize the risk of contaminating or breaking the FPDSs within lower loadlock 505.

Pump Lower Loadlock—after pallet exchange between lower loadlock 505 and pallet elevator 629 is complete, lower loadlock 505 is pumped down over the period 50-115 s. The same pumping considerations apply to lower loadlock 505 as apply to upper loadlock 502.

Lower Loadlock at Air or Vacuum—after pumping lower loadlock 505 down to ~$10^{-6}$ torr, one or more turbopumps (not shown) may remain connected to lower loadlock 505, maintaining lower loadlock 505 at ~$10^{-6}$ torr (the same vacuum level as in process chamber 522) over the period 115-240 s. It may be possible to maintain ~$10^{-6}$ torr in lower loadlock 505 using only the process chamber 522 pumping system (not shown).

Index Dual Loadlock—the dual loadlock 575 has four slots for supporting pallets. These slots are defined by the four sets of bi-directional motor-driven rollers 623-626. (see FIG. 43). For insertion/removal of pallets into/from process chamber 522, is necessary to move dual loadlock 575 vertically to align each of the four slots with rollers 527 in process chamber 522—this vertical motion and alignment is called "indexing". Precise indexing (to precisions <1 mm) is preferable for the pallet to align properly with optics assembly 520 since during almost the full period of e-beam testing, a pallet is supported both by rollers in dual loadlock 575 (i.e., one of the four sets of rollers 623-626) as well as by rollers 627 in process chamber 522 (see FIG. 43—note that pallet 500 is being tested by optics assembly 520 while still being partially supported by bi-directional motor-driven rollers 623 in upper loadlock 502). During indexing, which occurs four times during the 240 s cycle (55-60 s, 115-120 s, 175-180 s, and 235-240 s), dual loadlock 575 moves with respect to process chamber 522, necessitating a movable vacuum seal between dual loadlock 575 and process chamber 522, as discussed in U.S. patent application Ser. No. 11/054,932 filed Feb. 9, 2005 incorporated by reference herein.

Insert or Remove Pallet—this line in the timing diagram covers both the insertion of pallets from dual loadlock 575 into process chamber 522 (times 0-5 s, 60-65 s, 120-125 s, and 180-185 s—marked "I"), as well as the removal of pallets from process chamber 522 into dual loadlock 575 (times 45-55 s, 105-115 s, 165-175 s, and 225-235 s—marked "R"). The removal times are longer than the insertion times because alignment and testing of an FPDS begins after the pallet has traveled only a short distance into process chamber 522 (see FIG. 43), while pallet removal involves travelling back (reverse arrow 530 in FIG. 43) the full length of process chamber 522.

Align and Test Substrate—this line represents the times required for alignment and testing of FPDSs (in pallets) using optics assembly 520 in process chamber 522. "Alignment" refers to the process of locating alignment marks (not shown—these are different marks from alignment marks 1001 in FIGS. 34-38) using each of the multiple e-beams from optics assembly 520. When the alignment marks have been located with the e-beams from optics assembly 520, it is then possible to locate the various pixel electrodes (not shown) on FPDS 120 to perform e-beam testing of individual pixels for defects as discussed in U.S. patent application Ser. No. 11/225,376 filed Sep. 12, 2005 and in U.S. patent application Ser. No. 11/093,000 filed Mar. 28, 2005, both incorporated by reference herein. The "align and test substrates" operation occurs four times during the 240 s cycle: 5-45 s, 65-105 s, 125-165 s, and 185-225 s.

Second Embodiment Of An FPDS Testing System

The first embodiment of the present invention discussed above requires a separate pallet elevator 629 to feed pallets into dual loadlock 575. After loading into pallet elevator 629, pallets are transported to either the upper 502 or lower 505 loadlocks in dual loadlock 575, pumped down, and then inserted into process chamber 522 for e-beam testing. One disadvantage of this arrangement is the need for FPD fab floor space to accommodate pallet elevator 629. Another disadvantage is the extra cost required for a separate pallet elevator 629, in addition to the dual loadlock 575 and process chamber 522.

A second embodiment of the present invention will now be described in reference to FIGS. 65-70 that eliminates these disadvantages by integrating the pallet assembly/disassembly functions of the pallet elevator into the dual loadlock. A summary of this embodiment includes:

1) Dual loadlock 899, which serves as the interface between the FPD fab and the FPDS testing system. The functions of dual loadlock 899 are the following:
   a. Enables a robot to transport FPDSs from the FPD fab into the FPDS testing system.
   b. Assembles pallets containing the FPDSs for testing.
   c. Performs alignment between the contactors in the pallets and the test pads on the FPDSs.
   d. Pumps down to a vacuum level equal to that in process chamber 804.
   e. Assists in the transport of the pallets (one at a time) into process chamber 804 for e-beam testing.
   f. Assists in the removal of the pallet (one at a time) from process chamber 804 after e-beam testing.
   g. Vents to atmospheric pressure.
   h. Disassembles the pallets with the tested FPDSs.
   i. Enables the robot to transport the tested FPDSs out of the FPDS testing system to the FPD fab.
2) A process chamber 804 which has the following functions:
   a. Assists in the transport of one pallet at a time from the dual loadlock.
   b. Tests for defective pixels on the FPD in the pallet using one or more electron beams.
   c. Assists in the transport of one pallet at a time back into the dual loadlock after testing.

One disadvantage of the second embodiment relative to the first embodiment is the increased complexity of mechanisms within dual loadlock 899. Another disadvantage is the need for higher pumping capacity to enable pumpdown times consistent with the timeline in FIG. 70 due to the larger volume of dual loadlock 899 compared with dual loadlock 575.

FIG. 65 is a schematic top view of a second embodiment of an FPDS testing system embodying the present invention, including dual loadlock 899 and process chamber 804. Dual loadlock 899 comprises two loadlocks 800 and 801 (see FIGS. 67-69) which cycle between atmospheric pressure and the vacuum level in the process chamber 804, typically $\sim 10^{-6}$ torr. Interface plate 805 is part of the sliding vacuum seal between dual loadlock 899 and process chamber 804. Aspects of moving vacuum seals are discussed in U.S. patent application Ser. No. 11/054,932 filed Feb. 9, 2005 incorporated by reference herein. Process chamber 804 remains at $\sim 10^{-6}$ torr except during maintenance. Cross-section K-K is also illustrated in FIG. 65.

FIG. 66 is a schematic side view of the FPDS testing system in FIG. 65. Valves 802 and 803 enable insertion/removal of pallets into/from dual loadlock 899. Dual loadlock 899 sits on supports 810 which provide vertical motion capability for dual loadlock 899 to enable the two-way transfer of pallets: 1) out of process chamber 804 going into any slot in dual loadlock 899, and 2) out of any slot in dual loadlock 899 going into process chamber 804 (see FIG. 67 for the definitions of loadlock slots). Process chamber 804 sits on fixed supports 814. All of supports 810 and 814 should provide vibration isolation to dual loadlock 899 and process chamber 804, respectively, to ensure that there is no vibration of pallets 807 and 907 relative to optics assembly 806 (see FIGS. 67 and 69). A two-blade robot comprising end effectors 831-832 and end effector mount 830 can be seen entering dual loadlock 899 from the left. Interface plate 805 extends high enough to accommodate the range of motion of dual loadlock 899 relative to process chamber 804 required for indexing all four slots in dual loadlock 899 with process chamber 804 (compare FIG. 67 with FIG. 69).

FIG. 67 is a schematic view through section K-K of the FPDS testing system in FIG. 65. Dual loadlock 899 includes upper loadlock 800 and lower loadlock 801. In FIG. 67, a closed valve (such as valves 802 and 861) is indicated by an "X", while an open valve (such as valves 803, 860, and 862) has no "X". Two sets of bi-directional motor-driven rollers 820 and 821 define two pallet storage slots in upper loadlock 800, and another two sets of bi-directional motor-driven rollers 852 and 855 define two pallet storage slots in lower loadlock 801. Rollers 820, 821, 852, and 855 have two functions:

1) Supporting pallets within dual loadlock 899—each set of rollers 820, 821, 852, and 855 defines a separate pallet storage slot within dual loadlock 899.
2) Assisting in transferring pallets between dual loadlock 899 and process chamber 804 (working in conjunction with bi-directional motor-driven rollers 856 in process chamber 804).

Bi-directional motor-driven rollers 856 support and transport pallets within process chamber 804. Pallet 807 is shown being transported (arrow 823) under optics assembly 806 by two sets of bi-directional motor-driven rollers: rollers 820 in upper loadlock 800, and rollers 856 in process chamber 804. Upper loadlock chamber 800 has two valves: valve 802 allowing insertion/removal of pallets into/from dual loadlock 899 from/to the FPD fab, and valve 860 allowing insertion/removal of pallets into/from process chamber 804. For pallet transfer to/from process chamber 804, upper loadlock 800 must be at the same pressure as process chamber 804 ($\sim 10^{-6}$ torr)—this requires valve 802 to be closed, and valves 860 and 862 to be open. Valve 862 (which normally remains open) enables process chamber 804 to be sealed off from dual loadlock 899 for maintenance on either dual loadlock 899 or process chamber 804. Lower loadlock 801 is shown with valve 803 open to enable the removal/insertion of FPDSs. Since FPDS removal requires lower loadlock 801 to be at atmospheric pressure, valve 861 must be closed to preserve the $\sim 10^{-6}$ torr pressure in upper loadlock 800 and process chamber 804. Optics assembly 806 comprises the linear array of electron columns 1211 and the linear array of corresponding detectors 1240 (see FIG. 2). An electron beam testing procedure for FPDSs is discussed in detail in U.S. patent application Ser. No. 11/225,376 filed Sep. 12, 2005 incorporated by reference herein.

During the time required to test the FPDSs in pallets 807 and 808 (see timeline in FIG. 70), two pallets with already-tested FPDSs are disassembled (see FIGS. 27-30) within lower loadlock 801 so that the already-tested FPDSs (not shown) can be removed by a two-blade robot through valve 803. Two FPDSs 840 and 841 ready for testing are then inserted into lower loadlock 801 by the two-blade robot consisting of end effectors (or "blades") 831 and 832 and end effector mount 830—the two-blade robot is shown leaving (arrow 824) lower loadlock 801 after loading the two FPDSs 840 and 841 onto pin plates 857 and 858, respectively (see FIGS. 33-31 with arrows 250, 246, and 244 reversed). Valve 803 would then be closed and lower loadlock 801 pumped down to the same pressure as in process chamber 804 (typically ~$10^{-6}$ torr). While lower loadlock 801 is pumping down, the two pallets in lower loadlock 801 are reassembled by pin plates 857 and 858 (see FIGS. 30-27 with arrows 214, 212, and 210 reversed). The next step is alignment of pallet tops 850 and 853 to FPDSs 840 and 841, respectively, (see timeline in FIG. 70). After assembly, the pallet in the upper slot (defined by rollers 852) in lower loadlock 801 will consist of pallet top 850 and pallet bottom 851 with FPDS 840 contained therein; the pallet in the lower slot (defined by rollers 855) in lower loadlock 801 will consist of pallet top 853 and pallet bottom 854 with FPDS 841 contained therein.

A vertical actuator (not shown) moves pin plates 822 and 823 vertically to enable the pallet disassembly [assembly] procedure illustrated in FIGS. 27-30 [30-27] to be performed simultaneously on both pallets within upper loadlock 800. In FIG. 67, pin plates 822 and 823 are shown in the lower position, leaving pallets 807 and 808 assembled (see FIG. 27) and allowing pallets 807 and 808 to be transported by rollers 820 and 821, respectively. Pin plates 857 and 858 are in their upper position, disassembling the two pallets in lower loadlock 801 (see FIG. 30).

FIG. 68 is a schematic view through section L-L of the FPDS testing system in FIG. 66 at the same point on the timeline (FIG. 70) as in FIG. 67. Because pallet 807 has moved (arrow 823) mostly into process chamber 804, pin plate 822 in upper loadlock 800 can be clearly seen. In particular, the trenches 865 in pin plate 822 which allow clearance for bi-directional motor-driven rollers 820 are visible, along with both long pins 204 and short pins 206. The two-blade robot (comprised of end effectors 831, 832, and end effector mount 830), is leaving (arrow 824) lower loadlock 801 at the left.

FIG. 69 is a schematic view through section K-K of the FPDS testing system in FIG. 65 showing an FPDS in pallet 907 from lower loadlock 801 being tested while the two-blade robot is entering upper loadlock 800. The view in FIG. 69 is 120 s after FIG. 67—all the functions occurring in upper loadlock 800 in FIG. 67 are now occurring in lower loadlock 801, and all the functions occurring in lower loadlock 801 in FIG. 67 are now occurring in upper loadlock 800. 120 s after FIG. 69, the FPD testing system would again be in the status shown in FIG. 67 (see the timeline in FIG. 70).

After testing of the FPDSs in pallets 807 and 808 as described in reference to FIG. 67, valve 860 was closed and dual loadlock 899 indexed up to enable pallet 907 from lower loadlock 801 to be inserted into process chamber 804 through open valves 861 and 862. The same testing procedure described in FIG. 67 for pallets 807 and 808 is then followed for pallets 907 and 908 from lower loadlock 801. During e-beam testing, pallet 907 in the upper slot of lower loadlock 802 is supported and transported (arrow 890) by bi-directional motor-driven rollers 852 and 856, and pallet 908 in the lower slot of lower loadlock 801 is supported and transported by bi-directional motor-driven rollers 855 and 856. During the time required to test the FPDSs in pallets 907 and 908 from lower loadlock 801, upper loadlock 800 is vented to atmosphere, pallets 807 and 808 (see FIG. 67) are disassembled, and the two already-tested FPDSs removed by the two-blade robot. Pallet item numbers 807 and 808 are indicated in brackets and the operation of removal indicated by arrow 891. Next, two FPDSs 940 and 941 ready for testing are inserted, followed by pallet reassembly and alignment of pallet tops 950 and 953 to FPDSs 940 and 941, respectively. Insertion of FPDSs 940 and 941 would be indicated by a reverse direction of arrow 891. After assembly, the pallet in the upper slot (defined by rollers 820) of upper loadlock 800 will consist of pallet top 950 and pallet bottom 951 with FPDS 940 therein; the pallet in the lower slot (defined by rollers 821) of upper loadlock 800 will consist of pallet top 953 and pallet bottom 954 with FPDS 941 therein. The two-blade robot (comprised of end effectors 831, 832, and end effector mount 830), is leaving (arrow 891) upper loadlock 800 at the left through open valve 802.

For pallet transfer to/from process chamber 804, lower loadlock 801 must be at the same pressure as process chamber 804 (~$10^{-6}$ torr)—this requires valve 803 to be closed, and valves 861 and 862 to be open to allow pallet transfer. Upper loadlock 800 is shown with valve 802 open to enable the removal/insertion of FPDSs. Since FPDS removal requires upper loadlock 800 to be at atmospheric pressure, valve 860 must be closed to preserve the ~$10^{-6}$ torr pressure in lower loadlock 801 and process chamber 804.

This procedure of toggling between testing FPDSs from the upper 800 and lower 801 loadlocks enables high system throughput since there is always one loadlock (either upper loadlock 800 or lower loadlock 801), pumped down and ready to insert pallets into process chamber 804 for testing by optics assembly 806. All other operations, such as loadlock pump-down and venting, pallet assembly/disassembly, pallet top-to-FPDS alignment, and FPDS insertion/removal are performed in parallel with e-beam testing and thus have no effect on system throughput.

Process chamber 804 in the second embodiment of the present invention functions identically to process chamber 522 in the first embodiment, including all aspects of e-beam testing, X-Y-Yaw position measurement (FIGS. 2 and 45-50), and communications to/from the pallet (FIGS. 2 and 10-12). The pallet design (FIGS. 13-16) and pallet disassembly and assembly procedures (FIGS. 27-30 and 30-27, respectively) are also identical for the two embodiments.

Timing Diagram for the Second Embodiment of an FPDS Testing System

Figure 70:
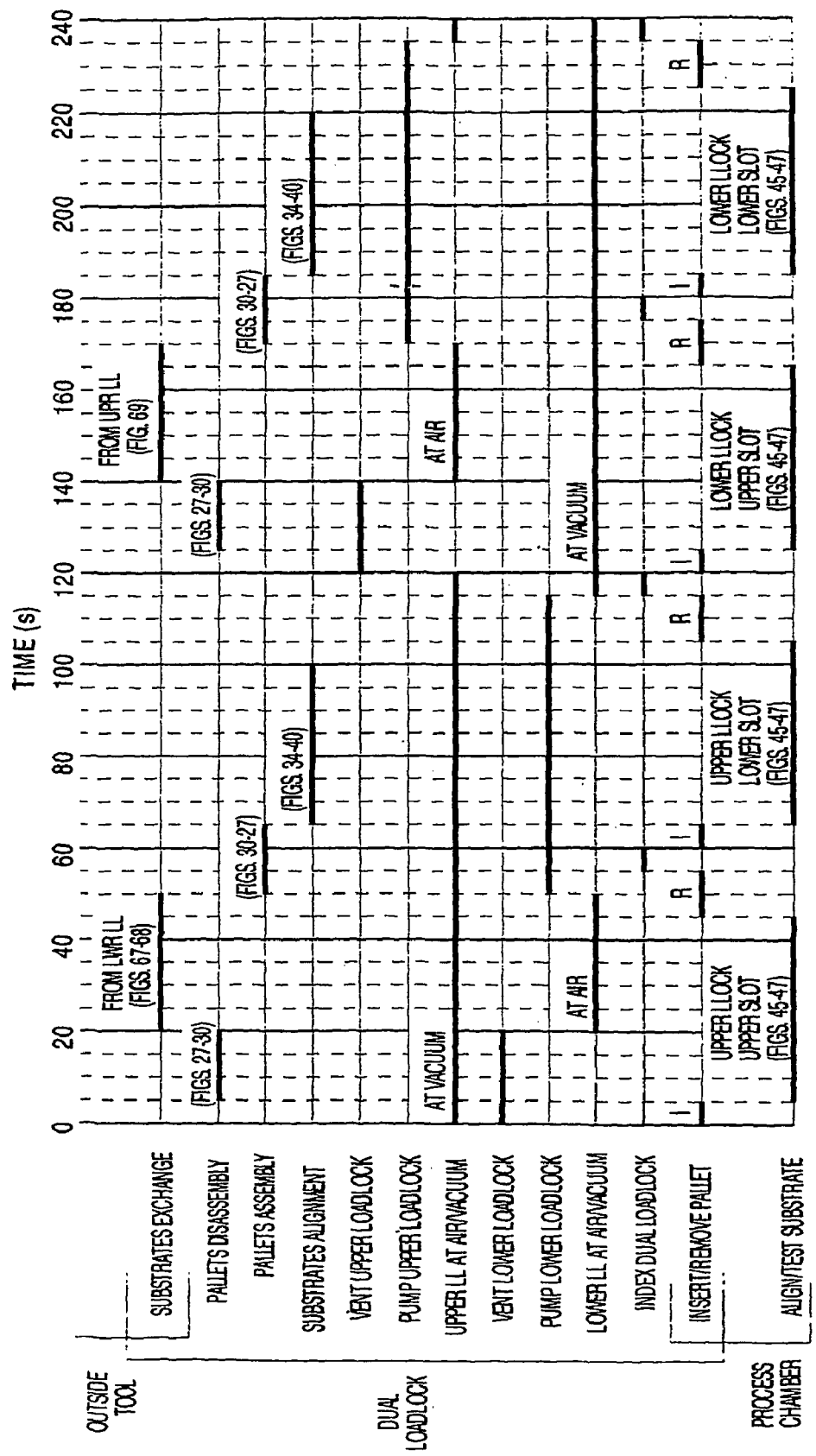
FIG. 70 is an operational cycle timing diagram for the FPDS testing system in FIGS. 65 and 66.

FIG. 70 is an operational cycle timing diagram for the second embodiment of an FPDS testing system in FIGS. 65 and 66—the total period shown is 0 to 240 s, during which time four FPDSs are fully tested by optics assembly 806 in process chamber 804 (see FIG. 67). In operation, the FPD testing system would then start back at time=0 s (which is equivalent to 240 s), with another four pallets, going from 0-240 s (equivalent to 240-480 s) again. The differences and similarities of the second embodiment shown in FIGS. 65 and 66 (with a timing diagram in FIG. 70) relative to the first embodiment in FIGS. 41 and 42 (with a timing diagram in FIG. 64) are:

1) No pallet elevator—the functions of pallet elevator 629 in the first embodiment are now performed within dual loadlock 899 in the second embodiment.
2) Dual loadlock 899 contains pin plates 822-823 (in upper loadlock 800) and pin plates 857-858 (in lower loadlock 801). In the second embodiment, instead of transferring pallets out to a pallet elevator, FPDSs are directly inserted and removed from dual loadlock 899. The pin plate actuators for the second embodiment must operate within a vacuum environment in dual loadlock 899, unlike the atmospheric pressure environment in pallet elevator 629—this may add some complexity to the system as well as the need for in-vacuum mechanical motions (i.e., pins 204 and 206 must slide through holes 164 and 166, respectively, under vacuum).
3) The upper 800 and lower 801 loadlocks are now larger to accommodate pin plates 822-823 and 857-858, respectively—this will require increased pumping capacity to achieve the necessary loadlock pumpdown times to maintain the desired system throughput (compare timelines in FIGS. 64 and 70). This also requires valves 802-803 and 860-861 in the second embodiment to be larger (wider in the vertical direction) than the corresponding valves 506-507 and 516-517, respectively, in the first embodiment (compare FIGS. 43 and 67).

4) Reduced system footprint—the FPDS testing system footprint is substantially reduced in the second embodiment by eliminating pallet elevator 629—this is a significant advantage since FPD fab floor space is typically at a premium.

5) Process chamber 804—essentially unchanged from process chamber 522 in the first embodiment—the only significant exception being supports 814, which must be taller than supports 718 to accommodate the increased travel of dual loadlock 899 during indexing relative to the travel of dual loadlock 575 (compare FIGS. 42 and 66).

The two main subsystems are shown along the left side of FIG. 70: dual loadlock 899 and process chamber 804. Each horizontal line represents a particular process within the FPDS testing system—the brackets along the left side show which of the two subsystems performs the process (where more than one subsystem performs a process, the brackets overlap):

Substrates Exchange—the process of transporting FPDSs between dual loadlock 899 and the FPD fab using a two-blade robot. The substrate exchange process occurs from 20-50 s (into/out of lower loadlock 801—see FIGS. 67-68) and 140-170 s (into/out of upper loadlock 800—see FIG. 69) in the 240 s cycle. While FPDSs are being exchanged, the pallets must be in the disassembled state and the respective loadlock must be at atmospheric pressure.

Pallets Disassembly—the process of separating a pallet into a pallet top and a pallet bottom for holding a FPDS, to enable the FPDS to be removed and another FPDS to be inserted (Substrates Exchange line, above). Details of the pallet disassembly process, which takes place from 5-20 s (in lower loadlock 801) and 125-140 s (in upper loadlock 800), are given in FIGS. 27-30. Simultaneously with pallet disassembly, the loadlock chamber containing the pallets being disassembled continues venting: either lower loadlock 800 (during 0-20 s) or upper loadlock 801 (during 120-140 s).

Pallets Assembly—the process of assembling a pallet from a pallet top and a pallet bottom with a FPDS is the inverse of pallet disassembly—refer to FIGS. 30-27 (reverse arrows 210, 212, 214, and 216). Pallet assembly takes place from 50-65 s (in lower loadlock 801) and 170-185 s (in upper loadlock 800). Simultaneously with pallet assembly, the loadlock chamber containing the pallets under assembly starts pumping down: either lower loadlock 800 (during 50-115 s) or upper loadlock 801 (during 170-235 s).

Substrates Alignment—after a pallet is assembled, it is necessary to align the pallet top with the FPDS within the pallet, as described schematically in FIGS. 34-39B. Substrates alignment, which takes place from 65-100 s (in lower loadlock 801) and 185-220 s (in upper loadlock 800), ensures that all the contactors 425 in pallet top 110 align with the test pads 426 on FPDS 120 (see FIG. 17). Simultaneously with substrates alignment, the loadlock chamber containing the pallets being aligned continues pumping down: either lower loadlock 800 (during 50-115 s) or upper loadlock 801 (during 170-235 s).

Vent Upper Loadlock—upper loadlock 800 is vented to atmospheric pressure from 120-140 s to enable FPDS exchange between upper loadlock 800 and the FPD fab (outside the system—not shown). Venting is preferably done with clean (i.e., particle-free) dry nitrogen and should induce minimal turbulence within upper loadlock 800 to reduce the risk of contaminating or breaking the FPDSs within upper loadlock 800.

Pump Upper Loadlock—after FPDS exchange between upper loadlock 800 and the FPD fab is complete, upper loadlock 800 is pumped down over the period 170-235 s. The same combination of different pumps (not shown—see FIG. 64) as were described in the first embodiment may be used to minimize the pumpdown time as is familiar to those skilled in the art of vacuum system design. A typical loadlock volume would be ~2000 L, with multiple air ejectors, mechanical pumps and turbopumps needed to achieve pumpdown times of ~65 s from atmosphere to ~$10^{-6}$ torr—due to the larger volume of upper loadlock 800 relative to upper loadlock 502, a larger number of pumps may be required to achieve the necessary ~65 s pumpdown time.

Note that the lower loadlock 801 pumpdown occurs from 50-115 s (see below), so there is no overlap in time between the lower loadlock 801 pumpdown and the upper loadlock 800 pumpdown—this means that the same set of pumps can be used for pumping down both the upper and lower loadlocks. With apparatus sufficient to maintain ~$10^{-6}$ torr in upper loadlock 800 and lower loadlock 801 using only the process chamber 804 pumping system (not shown), then no dedicated pumps for either the upper 800 or lower 801 loadlocks will be necessary. Otherwise, two small sustaining turbopumps (one for each of the upper 800 and lower 801 loadlocks) could be used to sustain ~$10^{-6}$ torr after the main set of pumpdown pumps (described above) is diverted over to the other loadlock.

Upper Loadlock at Air or Vacuum—after pumping upper loadlock 800 down to ~$10^{-6}$ torr, one or more turbopumps (not shown) may remain connected to upper loadlock 800, maintaining upper loadlock 800 at ~$10^{-6}$ torr (the same vacuum level as in process chamber 804) over the period 235-120 s. Note that 120 s is equivalent to 360 s (=120 s+240 s cycle time), since the FPD testing system cycles through the full 240 s timeline in FIG. 70 repeatedly, testing four FPDSs every 240 s. Alternatively, ~$10^{-6}$ torr in upper loadlock 800 can be maintained with a compatible process chamber 804 pumping system (not shown).

Vent Lower Loadlock—lower loadlock 801 is vented to atmospheric pressure from 0-20 s to enable FPDS exchange between lower loadlock 801 and the FPD fab (outside the tool—not shown). Venting is preferably done with clean (i.e., particle-free) dry nitrogen and should induce minimal turbulence within lower loadlock 801 to reduce the risk of contaminating or breaking the FPDSs within lower loadlock 801.

Pump Lower Loadlock—after FPDS exchange between lower loadlock 801 and the FPD fab is complete, lower loadlock 801 is pumped down over the period 50-115 s. The same pumping considerations apply to lower loadlock 801 as applied to upper loadlock 800.

Lower Loadlock at Air or Vacuum—after pumping lower loadlock 801 down to ~$10^{-6}$ torr, one or more turbopumps (not shown) may remain connected to lower loadlock 801, maintaining lower loadlock 801 at ~$10^{-6}$ torr (the same vacuum level as in process chamber 804) over the period 115-240 s. Alternatively, ~$10^{-6}$ torr in lower loadlock 801 can be maintained with a compatible process chamber 804 pumping system (not shown).

Index Dual Loadlock—the dual loadlock 899 has four slots for supporting pallets. These slots are defined by the four sets of bi-directional motor-driven rollers 820, 821, 852, and 855. (see FIG. 67). For insertion/removal of pallets into/from process chamber 804, it is necessary to move dual loadlock 899 vertically to align each of the four slots with rollers 856 in process chamber 804—this vertical motion and alignment is called "indexing". Precise indexing (to precisions <1 mm) is preferable for the pallet to align properly with optics assembly 806 since during almost the full period of e-beam testing, a pallet is supported by both the rollers in dual loadlock 899 (i.e., one of the four sets of rollers 820, 821, 852, or 855) and rollers 856 in process chamber 804 (see FIG. 67—note that pallet 807 is being tested by optics assembly 806 while still being partially supported by bi-directional motor-driven rollers 820 in upper loadlock 800). During indexing, which occurs four times during the 240 s cycle (55-60 s, 115-120 s, 175-180 s, and 235-240 s), dual loadlock 899 moves with respect to process chamber 804, necessitating a movable vacuum seal between dual loadlock 899 and process chamber 804, as discussed in U.S. patent application Ser. No. 11/054,932 filed Feb. 9, 2005 incorporated by reference herein. Sealing plate 805 works in conjunction with the opposing surface on dual loadlock 899 as part of the sliding seal, which optionally may have a bellows seal.

Insert or Remove. Pallet—this line in the timing diagram covers both the insertion of pallets from dual loadlock 899 into process chamber 804 (times 0-5 s, 60-65 s, 120-125 s, and 180-185 s—marked "I"), as well as the removal of pallets from process chamber 804 into dual loadlock 899 (times 45-55 s, 105-115 s, 165-175 s, and 225-235 s—marked "R"). The removal times are longer than the insertion times because alignment and testing of an FPDS begins after the pallet has traveled only a short distance into process chamber 804 (see FIG. 67), while pallet removal involves travelling back (reverse arrow 823 in FIG. 67) the full length of process chamber 804.

Align and Test Substrate—this line represents the times required for alignment and testing of FPDSs (in pallets) using optics assembly 806 in process chamber 804. "Alignment" refers to the process of locating alignment marks (not shown—these are different marks from alignment marks 1001 in FIGS. 34-38) using each of the multiple e-beams from optics assembly 806. When the alignment marks have been located with the e-beams from optics assembly 806, it is then possible to locate the various pixel electrodes (not shown) on FPDS 120 to perform e-beam testing of individual pixels for defects as discussed in U.S. patent application Ser. No. 11/225,376 filed Sep. 12, 2005 and in U.S. patent application Ser. No. 11/093,000 filed Mar. 28, 2005, both incorporated by reference herein. The align and test substrates operation occurs four times during the 240 s cycle: 5-45 s, 65-105 s, 125-165 s, and 185-225 s.

Schematic View of the Electron Optical Column and Detector Optics

FIG. 71 is a schematic cross-section of an electron optical column 1211 and the corresponding detector 1240 shown in FIG. 2 in a plane containing the optical axis of one column and parallel to the main scan axis. Electrons 1503 are emitted by source tip 1501 under the influence of a high electric field generated by a voltage difference between source tip 1501 and extraction electrode 1504, typically 2700-3400 V. Suppressor electrode 1502 is typically biased negative relative to source tip 1501 to suppress electron emission from the shank (upper cylindrical portion) of source tip 1501, since this emission cannot be used to form the electron beam. The source lens includes extraction electrode 1504, source lens electrode 1505, and beam-limiting aperture (BLA) 1520. Electrons passing through BLA 1520 enter the double-deflection beam blanker comprised of electrodes 1507 and 1508. In FIG. 71, the blanker is inactivated, so beam 1506 is not deflected off the optical axis, and passes through the blanking and pumping aperture (BPA) 1510 and into the main lens. The purpose of the double-deflection blanker is to turn the beam on and off at the surface of FPDS 120.

The main lens includes electrodes 1511, 1512, and 1513, forming a focused spot 1521 on the surface of FPDS 120. The stigmator/deflector 1515 deflects the beam 1230 and corrects beam shape distortions caused by the beam deflection. Detector 1240 collects signal electrons 1244 emitted from the upper surface of the FPDS 120 at location 1521 due to the interaction of the primary beam 1230 with the material in the substrate 120. A 4000 V bias relative to the substrate surface 120 may be applied to detector 1240, causing signal electrons 1244 to be attracted to detector 1240. The detector optics designs in U.S. Pat. No. 6,777,675 B2 and U.S. application Ser. No. 10/833,949, incorporated by reference herein, illustrate a similar detector optics design (this design is for a generally cylindrically symmetric detector optics). Electrical connections 1212 to column 1211 include cables 1540-1550, connecting to optical elements 1501, 1502, 1504, 1505, 1507, 1508, 1510, 1511, 1512, 1513, and 1515, respectively.

The X-Y-Yaw data received by system control 1203 from X-Y-Yaw readout 1202 is relayed to optics control 1201 through control link 1220 (see FIG. 2). Optics control 1201 uses the X-Y-Yaw data to control the deflection signals sent to each of the stigmator/deflectors 1515 through cables 1212 connecting to columns 1211. By inducing X-Y deflections to beams 1230, the optics control 1201 can place each beam 1230 in the proper location on the surface of FPDS 120, counteracting any X, Y, or Yaw errors due to imperfections in the motion of pallet 100 within the process chamber (not shown).

It will be understood by those skilled in the art that the foregoing descriptions are for illustrative purposes only. A number of modifications are possible within the scope of the present invention, such as:

1) The pallet elevator in the first embodiment may serve only as a storage location for assembled pallets, prior to insertion into the dual loadlock, with the pallet disassembly/assembly operations conducted outside the FPDS testing system. The robot would then transfer assembled pallets into/out of the pallet elevator, instead of FPDSs. In this example, there would be no need for pin plates within the pallet elevator, thereby simplifying the system.

2) The dual loadlock in the second embodiment may serve only as a storage location for assembled pallets, prior to insertion into the process chamber, with the pallet disassembly/assembly operations conducted outside the FPDS testing system. The robot would then transfer assembled pallets into/out of the dual loadlock, instead of FPDSs. In this example, there would be no need for pin plates within the dual loadlock, thereby simplifying the system.

3) Instead of applying the present invention to the testing of FPDSs, other large substrate applications are also possible using the present invention:

a. A system for electron beam direct-write (EBDW) lithography using the present invention is possible. In this example, a simplified pallet design could be used, not requiring internal drive electronics. The use of a pallet, in conjunction with a linear array of electron beam columns spanning the full width of the substrate, would eliminate the need for costly and complex X-Y stages for moving the FPDS under the electron beam for patterning the thin film transistors and pixel areas.

b. Other processes used for the fabrication of FPDSs are also possible, such as CVD, PVD, etc. In these cases, the pallet would also be simpler than for e-beam testing of FPDSs, since no electrical contacts to the test pads are necessary. Advantages could include control of the FPDS temperature distribution through the use of heaters within the pallet. Instead of an array of electron beam columns, a linear processing head would be substituted—the processing head could be a linear PVD source, or a linear array of CVD gas jets.

4) The present invention can be applied to electron beam FPD testing and/or direct-write lithography systems with arrangements of the electron columns differing from the linear arrangement shown in FIG. 2. These alternative arrangements include multiple linear arrays of columns, columns in arrangements other than an X-Y grid, or multiple arrays of columns wherein some columns are specifically designed for e-beam direct-writing of small features (such as TFT source, gate and drain lines) while other columns are specifically designed for writing of larger features such as pixel electrodes.

5) The present invention may also be applied to ion beams, instead of electron beams, for various processes to be applied to large substrates, such as:
   a. Microanalysis of large substrates for process feedback during fabrication.
   b. Ion beam milling or micromachining of large substrates.
   c. Ion beam direct-write (IBDW) lithography of large substrates, including, but not limited to FPDSs.

Although the present invention has been described above in terms of specific embodiments, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A process chamber for processing large substrates, comprising:
   a pallet for supporting and protecting one large substrate during processing in said process chamber, said pallet comprising:
   one large substrate;
   a pallet top, wherein said pallet top comprises (i) a multiplicity of contactors for making electrical contact with a multiplicity of test pads on the surface of said one large substrate, wherein there is a predetermined one-to-one mapping between said contactors and said test pads; (ii) means for detecting the locations of at least two alignment marks on the surface of said one large substrate; (iii) means for determining a required displacement vector for said pallet top with respect to said one large substrate, said required displacement vector being defined as that displacement of said pallet top with respect to said one large substrate that would approximately center said contactors with respect to said test pads, consistent with said predetermined one-to-one mapping between said contactors and said test pads; and (iv) means for precisely displacing said pallet top with respect to said pallet bottom, according to said required displacement vector;
   a pallet bottom;
   wherein said one large substrate is clamped between said pallet top and said pallet bottom, and said pallet bottom comprises means for preventing relative motion between said one large substrate and said pallet bottom whenever said pallet is assembled; and
   a port configured to accommodate passage of said pallet into and out of said processing chamber.

2. A process chamber for processing large substrates, comprising:
   a pallet for supporting and protecting one large substrate during processing in said process chamber, said pallet comprising:
   one large substrate;
   a pallet top; and
   a pallet bottom;
   wherein said one large substrate is clamped between said pallet top and said pallet bottom;
   a port configured to accommodate passage of said pallet into and out of said processing chamber;
   at least one pallet X-axis position sensor, said X-axis being parallel to said motion of said pallet under said charged particle optical assembly;
   at least one pallet Y-axis position sensor, said Y-axis being perpendicular to said motion of said pallet under said charged particle optical assembly; and
   at least one pallet Yaw sensor, said Yaw being defined as the rotation angle about an axis perpendicular to the plane of said one large substrate in said pallet.

3. A system for processing of large substrates, comprising:
   a system control;
   a multiplicity of pallets, each of said pallets comprising one large substrate;
   a process chamber including a first port configured to accommodate passage of one of said pallets;
   a loadlock assembly comprising a multitude of loadlocks, said loadlock assembly being coupled to said process chamber and to said pallet elevator, said loadlock assembly being configured to accommodate a first plurality of pallets of said multiplicity of pallets; and
   a pallet elevator including a second port configured to accommodate passage of one or more of said pallets, said pallet elevator being configured to accommodate a second plurality of pallets of said multiplicity of pallets;
   wherein:
   said loadlock assembly is configured to move relative to said process chamber to allow positioning of any one pallet of said first plurality of pallets for passage through said first port in said process chamber; and
   said pallet elevator is configured to move relative to said loadlock assembly to allow positioning of any one pallet of said second plurality of pallets for passage through said second port in said pallet elevator.

4. A system as in claim 3 wherein each of said pallets further comprises:
   a pallet top; and
   a pallet bottom;
   wherein said one large substrate is clamped between said pallet top and said pallet bottom.

5. A system as in claim 3 wherein:
   said process chamber further comprises a charged particle optical assembly, said charged particle optical assembly comprising a plurality of charged particle optical columns, wherein each of said charged particle optical columns comprises:
   a charged particle source for generating a charged particle beam;
   a plurality of lenses for focusing said charged particle beam onto the surface of said large substrate; and
   a beam deflector for deflecting said charged particle beam on the surface of said large substrate; and said system for processing of large substrates further comprises an optics control, electrically connected to:
said charged particle optical assembly; and
said system control.

6. A system as in claim 5 wherein said process chamber further comprises a plurality of bi-directional motor-driven rollers configured to support and to assist in moving one pallet of said first plurality of pallets under said charged particle optical assembly for charged particle beam testing of said large substrate in said pallet.

7. A system as in claim 3 wherein each of said loadlocks comprises one or more sets of bi-directional motor-driven rollers, each of said sets of bi-directional motor-driven rollers being configured to support one of said pallets of said first plurality of pallets in said loadlock, and to assist in moving one of said pallets of said first plurality of pallets into and out of said loadlock through said first port in said process chamber and through said second port in said pallet elevator.

8. A system as in claim 3 wherein said pallet elevator comprises one or more sets of bi-directional motor-driven rollers, each of said sets of bi-directional motor-driven rollers being configured to support one of said pallets of said second plurality of pallets in said pallet elevator, and to assist in moving one of said pallets of said second plurality of pallets into and out of said pallet elevator through said second port in said pallet elevator.

9. A system as in claim 4 wherein said pallet elevator further comprises:
a plurality of pin plates, wherein one pin plate of said plurality of pin plates is positioned beneath each set of bi-directional motor-driven rollers; and
a pin plate actuator configured to move said plurality of pin plates along a vertical motion axis.

10. A system as in claim 9 wherein each pin plate of said plurality of pin plates comprises:
a multiplicity of long pins; and
a multiplicity of short pins;
wherein said vertical motion axis is configured to enable said multiplicity of long pins and said multiplicity of short pins to pass through a multiplicity of holes in said pallet bottom, said motion of said pin plate thereby enabling:
said multiplicity of long pins to lift said pallet top off of said large substrate and to lift said pallet top off of said pallet bottom; and
said multiplicity of short pins to lift said one large substrate off said pallet bottom.

11. A system as in claim 4 wherein said pallet top comprises a multiplicity of contactors for making electrical contact with a multiplicity of test pads on the surface of said one large substrate, wherein there is a predetermined one-to-one mapping between said contactors and said test pads.

12. A system as in claim 11 wherein each pallet of said multiplicity of pallets further comprises:
internal drive electronics for controlling a multiplicity of signals directed to said multiplicity of contactors, wherein there is a predetermined one-to-one mapping between said signals and said contactors;
an internal power distribution system to supply power to said internal drive electronics; and
means for storing energy for said internal power distribution system.

13. A system as in claim 12 wherein:
each pallet of said multiplicity of pallets further comprises:
a first data receiver connected to said internal drive electronics; and a first data transmitter connected to said internal drive electronics; and
said process chamber further comprises:
a second data transmitter for transmitting data to said first data receiver in said pallet, said second data transmitter being electrically connected to said system control; and
a second data receiver for receiving data from said first data transmitter in said pallet, said second data receiver being electrically connected to said system control.

14. A system as in claim 11 wherein:
said pallet bottom comprises means for preventing relative motion between said large substrate and said pallet bottom whenever said pallet is assembled; and
said pallet top further comprises:
means for detecting the locations of at least two alignment marks on the surface of said large substrate;
means for determining a required displacement vector for said pallet top with respect to said large substrate, said required displacement vector being defined as that displacement of said pallet top with respect to said large substrate that would approximately center said contactors with respect to said test pads, consistent with said predetermined one-to-one mapping between said contactors and said test pads; and
means for precisely displacing said pallet top with respect to said pallet bottom, according to said required displacement vector.

15. A system as in claim 13 wherein:
said system for processing of large substrates further comprises an X-Y-Yaw readout, electrically connected to said system control; and
said process chamber further comprises:
at least one pallet X-axis position sensor, said X-axis being parallel to said motion of said pallets under said charged particle optical assembly, said at least one X-axis position sensor being electrically connected to said X-Y-Yaw readout;
at least one pallet Y-axis position sensor, said Y-axis being perpendicular to said motion of said pallets under said charged particle optical assembly, said at least one Y-axis position sensor being electrically connected to said X-Y-Yaw readout; and
at least one pallet Yaw sensor, said Yaw being defined as the rotation angle about an axis perpendicular to the plane of said large substrate in said pallet, said at least one Yaw sensor being electrically connected to said X-Y-Yaw readout.

16. A system as in claim 15 wherein said system control sends said pallet X-axis position data, said pallet Y-axis position data, and said pallet Yaw data to:
said optics control for controlling said beam deflector; and
said second data transmitter for transmission to said first receiver on said pallet, for use by said internal drive electronics for controlling said multiplicity of signals directed to said multiplicity of contactors.

17. A system for processing of large substrates, comprising:
a system control;
a multiplicity of pallets, each of said pallets comprising one large substrate;
a process chamber including a port configured to accommodate passage of one of said pallets, said process chamber including a charged particle optical assembly, said charged particle optical assembly comprising a plurality of charged particle optical columns, wherein each of said charged particle optical columns comprises (i) a charged particle source for generating a charged particle beam; (ii) a plurality of lenses for focusing said charged particle beam onto the surface of said large substrate; and (iii) a beam deflector for deflecting said charged particle beam on the surface of said large substrate;
an optics control, electrically connected to said charged particle optical assembly and said system control; and
a loadlock assembly comprising a multitude of loadlocks, said loadlock assembly being coupled to said process chamber, said loadlock assembly being configured to accommodate a plurality of pallets of said multiplicity of pallets, wherein said loadlock assembly is configured to move relative to said process chamber to allow positioning of any one pallet of said plurality of pallets for passage through said port in said process chamber.

18. A system as in claim 17 wherein said process chamber further comprises a plurality of bi-directional motor-driven rollers configured to support and to assist in moving one pallet of said plurality of pallets under said charged particle optical assembly for charged particle beam testing of said large substrate in said pallet.

19. A system for processing of large substrates, comprising:
a system control;
a multiplicity of pallets, each of said pallets comprising one large substrate, wherein each of said pallets further comprises a pallet top and a pallet bottom, wherein said one large substrate is clamped between said pallet top and said pallet bottom;
a process chamber including a port configured to accommodate passage of one of said pallets; and
a loadlock assembly comprising a multitude of loadlocks, said loadlock assembly being coupled to said process chamber, said loadlock assembly being configured to accommodate a plurality of pallets of said multiplicity of pallets, wherein each of said loadlocks comprises (i) a plurality of pin plates, wherein one pin plate of said plurality of pin plates is positioned beneath each set of bi-directional motor-driven rollers, and (ii) a pin plate actuator configured to move said plurality of pin plates along a vertical motion axis;
wherein said loadlock assembly is configured to move relative to said process chamber to allow positioning of any one pallet of said plurality of pallets for passage through said port in said process chamber, and wherein each pin plate of said plurality of pin plates comprises (i) a multiplicity of long pins and (ii) a multiplicity of short pin, wherein said vertical motion axis is configured to enable said multiplicity of long pins and said multiplicity of short pins to pass through a multiplicity of holes in said pallet bottom, said motion of said pin plate thereby enabling said multiplicity of long pins to lift said pallet top off of said large substrate and to lift said pallet top off of said pallet bottom, and said multiplicity of short pins to lift said large substrate off said pallet bottom.

20. A system for processing of large substrates, comprising:
a system control;
a multiplicity of pallets, each of said pallets comprising one large substrate, wherein each of said pallets further comprises a pallet top and a pallet bottom, wherein said one large substrate is clamped between said pallet top and said pallet bottom, wherein said pallet top comprises a multiplicity of contactors for making electrical contact with a multiplicity of test pads on the surface of said large substrate, wherein there is a predetermined one-to-one mapping between said contactors and said test pads, and wherein each pallet of said multiplicity of pallets further comprises (i) internal drive electronics for controlling a multiplicity of signals directed to said multiplicity of contactors, wherein there is a predetermined one-to-one mapping between said signals and said contactors; (ii) an internal power distribution system to supply power to said internal drive electronics; and (iii) means for storing energy for said internal power distribution system;
a process chamber including a port configured to accommodate passage of one of said pallets; and
a loadlock assembly comprising a multitude of loadlocks, said loadlock assembly being coupled to said process chamber, said loadlock assembly being configured to accommodate a plurality of pallets of said multiplicity of pallets,
wherein said loadlock assembly is configured to move relative to said process chamber to allow positioning of any one pallet of said plurality of pallets for passage through said port in said process chamber.

21. A system as in claim 20 wherein:
each of said pallets of said multiplicity of pallets further comprises:
a first data receiver connected to said internal drive electronics; and
a first data transmitter connected to said internal drive electronics; and
said process chamber further comprises:
a second data transmitter for transmitting data to said first data receiver in said pallet, said second data transmitter being electrically connected to said system control; and
a second data receiver for receiving data from said first data transmitter in said pallet, said second data receiver being electrically connected to said system control.

22. A system for processing of large substrates, comprising:
a system control;
a multiplicity of pallets, each of said pallets comprising one large substrate, wherein each of said pallets further comprises a pallet top and a pallet bottom, wherein said one large substrate is clamped between said pallet top and said pallet bottom, wherein said pallet top comprises a multiplicity of contactors for making electrical contact with a multiplicity of test pads on the surface of said large substrate, wherein there is a predetermined one-to-one mapping between said contactors and said test pads;
a process chamber including a port configured to accommodate passage of one of said pallets; and
a loadlock assembly comprising a multitude of loadlocks, said loadlock assembly being coupled to said process chamber, said loadlock assembly being configured to accommodate a plurality of pallets of said multiplicity of pallets,
wherein said loadlock assembly is configured to move relative to said process chamber to allow positioning of any one pallet of said plurality of pallets for passage through said port in said process chamber; said pallet bottom comprises means for preventing relative motion between said large substrate and said pallet bottom whenever said pallet is assembled; and said pallet top further comprises: (i) means for detecting the locations of at least two alignment marks on the surface of said large substrate; (ii) means for determining a required displacement vector for said pallet top with respect to said large substrate, said required displacement vector being defined as that displacement of said pallet top with respect to said large substrate that would approximately center said contactors with respect to said test pads, consistent with said predetermined one-to-one mapping between said contactors and said test pads; and (iii) means for precisely displacing said pallet top with respect to said pallet bottom, according to said required displacement vector.

23. A system as in claim 21 wherein:

said system for processing of large substrates further comprises an X-Y-Yaw readout, electrically connected to said system control; and said process chamber further comprises:

- at least one pallet X-axis position sensor, said X-axis being parallel to said motion of said pallets under said charged particle optical assembly, said at least one X-axis position sensor being electrically connected to said X-Y-Yaw readout;
- at least one pallet Y-axis position sensor, said Y-axis being perpendicular to said motion of said pallets under said charged particle optical assembly, said at least one Y-axis position sensor being electrically connected to said X-Y-Yaw readout; and
- at least one pallet Yaw sensor, said Yaw being defined as the rotation angle about an axis perpendicular to the plane of said large substrate in said pallet, said at least one Yaw sensor being electrically connected to said X-Y-Yaw Readout.

24. A system as in claim 23 wherein said system control sends said pallet X-axis position data, said pallet Y-axis position data, and said pallet Yaw data to:

said optics control for controlling said beam deflector; and said second data transmitter for transmission to said first receiver on said pallet, for use by said internal drive electronics to control said multiplicity of signals directed to said multiplicity of contactors.

25. A method for processing large substrates that protects and supports said large substrates from damage during processing, comprising the steps of:

a) inserting said large substrate between a pallet top and a pallet bottom, said pallet top and said pallet bottom being separated a sufficient distance to permit said insertion of said large substrate;

b) moving said pallet top, said large substrate, and said pallet bottom, together and mechanically locking said pallet top to said pallet bottom, thereby clamping said large substrate between;

c) inserting said pallet into a process chamber;

d) processing said large substrate clamped in said pallet in said process chamber;

e) after said processing is complete, removing said pallet from said process chamber;

f) unlocking said pallet top from said pallet bottom;

g) separating said pallet top, said large substrate, and said pallet bottom, said pallet top and said pallet bottom being separated a sufficient distance to permit said removal of said large substrate;

h) removing said large substrate from between said pallet top and said pallet bottom;

i) returning to step a), above and repeating said process for each said large substrate to be processed.

26. The method of claim 25 wherein said large substrate is a flat panel display substrate comprising a large number of pixels.

27. The method of claim 26 wherein said processing is electron-beam testing of said pixels on said flat panel display substrate.

* * * * *